(12) United States Patent
Inoue et al.

(10) Patent No.: US 7,982,215 B2
(45) Date of Patent: Jul. 19, 2011

(54) TFT SUBSTRATE AND METHOD FOR MANUFACTURING TFT SUBSTRATE

(75) Inventors: Kazuyoshi Inoue, Sodegaura (JP); Koki Yano, Sodegaura (JP); Nobuo Tanaka, Sodegaura (JP); Tokie Tanaka, legal representative, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 441 days.

(21) Appl. No.: 12/089,260

(22) PCT Filed: Oct. 2, 2006

(86) PCT No.: PCT/JP2006/319673
§ 371 (c)(1),
(2), (4) Date: Apr. 4, 2008

(87) PCT Pub. No.: WO2007/040194
PCT Pub. Date: Apr. 12, 2007

(65) Prior Publication Data
US 2010/0127253 A1    May 27, 2010

(30) Foreign Application Priority Data

| Oct. 5, 2005 | (JP) | 2005-292823 |
| Dec. 2, 2005 | (JP) | 2005-349826 |
| Dec. 9, 2005 | (JP) | 2005-356563 |
| Dec. 9, 2005 | (JP) | 2005-357034 |
| Dec. 16, 2005 | (JP) | 2005-363150 |
| Jan. 31, 2006 | (JP) | 2006-022849 |

(51) Int. Cl.
*H01L 21/44* (2006.01)
(52) U.S. Cl. ......... 257/43; 257/223; 257/291; 257/443; 257/59; 257/E29.296; 257/E21.19; 257/E33.019; 257/E21.476; 438/104

(58) Field of Classification Search .................. 257/223, 257/291, 443, 43, 59, E29.296, E21.19, E33.019, 257/E21.476; 438/104
See application file for complete search history.

(56) References Cited

U.S. PATENT DOCUMENTS
2002/0159010 A1 * 10/2002 Maeda et al. .................. 349/113
(Continued)

FOREIGN PATENT DOCUMENTS
EP    2006319673 R    11/2009
(Continued)

OTHER PUBLICATIONS

Translation of International Search Report completed Dec. 22, 2006 in International Application No. PCT/JP2006/319673 filed Oct. 2, 2006.
(Continued)

*Primary Examiner* — Wai-Sing Louie
*Assistant Examiner* — Marc Armand
(74) *Attorney, Agent, or Firm* — Millen, White, Zelano & Branigan, P.C.

(57) ABSTRACT

An object of the invention is to provide a TFT substrate and a method for producing a TFT substrate which is capable of drastically reducing the production cost by decreasing the number of steps in the production process and improving production yield. A TFT substrate includes: a substrate; a gate electrode and a gate wire formed above the substrate; a gate insulating film formed above the gate electrode and the gate wire; a first oxide layer formed above the gate insulating film which is formed at least above the gate electrode; and a second oxide layer formed above the first oxide layer; wherein at least a pixel electrode is formed from the second oxide layer.

38 Claims, 69 Drawing Sheets

U.S. PATENT DOCUMENTS

| | | |
|---|---|---|
| 2004/0197964 A1 | 10/2004 | Lee et al. |
| 2005/0173734 A1 | 8/2005 | Yoshioka et al. |
| 2005/0270450 A1* | 12/2005 | Ahn et al. .................. 349/114 |

FOREIGN PATENT DOCUMENTS

| | | |
|---|---|---|
| JP | 2004 317685 | 11/1992 |
| JP | 2004319655 | 11/1992 |
| JP | 2005017669 | 1/1993 |
| JP | 2005019664 | 1/1993 |
| JP | 2005049667 | 3/1993 |
| JP | 2005106881 | 4/1993 |
| JP | 2005108912 | 4/1993 |
| JP | 8-234218 A | 9/1996 |
| JP | 2004-163933 A | 6/2004 |
| JP | 2004317685 A | 11/2004 |
| JP | 2004317685 W | 11/2004 |
| JP | 2004319655 A | 11/2004 |
| JP | 2004319655 W | 11/2004 |
| JP | 2005017669 A | 1/2005 |
| JP | 2005017669 W | 1/2005 |
| JP | 2005019664 A | 1/2005 |
| JP | 2005019664 W | 1/2005 |
| JP | 2005049667 A | 2/2005 |
| JP | 2005049667 W | 2/2005 |
| JP | 2005106881 A | 4/2005 |
| JP | 2005106881 W | 4/2005 |
| JP | 2005108912 A | 4/2005 |
| JP | 2005108912 W | 4/2005 |

OTHER PUBLICATIONS

Wager, J. F. et al. "Transparent electronics and prospects for transparent displays." (Proceedings of SPIE), 2003, 330-339, 5080:1.

Nomura, K. et al. "Room-temperature fabrication of transparent thin-film transistors using amorphous oxide semiconductors." (NATURE), Nov. 25, 2004, 488-492, 432.

Office Action for European Patent Application No. 06 811 021 dated Feb. 11, 2011.

Zhang, S. B. et al., "Intrinsic n-type versus p-type doping asymmetry and the defect physics of ZnO," Physical Review B. Condensed Matter, American Institute of Physics, Feb. 7, 2001, vol. 63, No. 7, pp. 75205-01.

* cited by examiner

TFT SUBSTRATE AND METHOD FOR
MANUFACTURING TFT SUBSTRATE

TECHNICAL FIELD

The invention relates to a TFT substrate used in a liquid crystal display apparatus, an organic EL apparatus and other such apparatuses, as well as to a method for producing the same.

BACKGROUND

LCD (liquid crystal display) apparatuses or organic EL display apparatuses are widely used due to their display performance, energy saving properties, and other such reasons. These display apparatuses constitute nearly all of the mainstream of display apparatuses, in particular, display apparatuses in cellular phones, PDAs (personal digital assistants), PCs, laptop PCs, and TVs. Generally, TFT substrates are used in these display apparatuses.

For instance, in liquid crystal display apparatuses, display materials such as a liquid crystal are filled between a TFT substrate and an opposing substrate. In these display materials, a voltage is selectively applied to each pixel. Here, a "TFT substrate" means a substrate on which a TFT (Thin Film Transistor) having a semiconductor thin film (also called "semiconductor film") is arranged. Generally, a TFT substrate is referred to as a "TFT array substrate" since TFTs are arranged in an array.

On a TFT substrate which is used in a liquid crystal display apparatus and so on, "sets" (a set includes a TFT and one pixel of the screen of a liquid crystal display apparatus, called "one unit") are arranged vertically and laterally on a glass substrate. In a TFT substrate, for example, gate wires are arranged at an equal interval in the vertical direction on a glass substrate, and either source wires or drain wires are arranged at an equal interval in the lateral direction. The other of the source wire and the drain wire, a gate electrode, a source electrode and a drain electrode are provided respectively in the above-mentioned unit constituting each pixel.

<Conventional Method for Producing TFT Substrate>

As the method for producing a TFT substrate, a 5-mask process using five masks, a 4-mask process using four masks by half-tone exposure technology, and other processes are known.

In such a method for producing a TFT substrate, the production process needs many steps since five or four masks are used. For example, the 4-mask process requires 35 steps and the 5-mask process requires steps exceeding 40. So many production steps may decrease the production yield. In addition, many steps may make the production process complicated and also increase the production cost.

(Method for Production Using Five Masks)

FIG. 69 is schematic cross-sectional views for explaining the conventional method for producing a TFT substrate, in which (a) is a cross-sectional view after formation of a gate electrode.

(b) is a cross-sectional view after formation of an etch stopper.

(c) is a cross-sectional view after formation of a source electrode and a drain electrode.

(d) is a cross-sectional view after formation of an interlayer insulating film.

(e) is a cross-sectional view after formation of a pixel electrode.

In FIG. 69(a), a gate electrode 9212 is formed on a glass substrate 9210 by using a first mask (not shown). That is, first, a metal (such as aluminum (Al)) is deposited on the glass substrate 9210 by sputtering. Then, a resist is formed by photolithography by using the first mask. Subsequently, the gate electrode 9212 is formed into a predetermined shape by etching, and the resist is removed through an ashing process.

Next, as shown in FIG. 69(b), on the glass substrate 9210 and the gate electrode 9212, a gate insulating film 9213 formed of an SiN film (silicon nitride film) and an α-Si:H(i) film 9214 are stacked in this order. Subsequently, an SiN film (silicon nitride film) as a channel protective layer is deposited. Then, a resist is formed by photolithography using a second mask (not shown). Then, the SiN film is patterned into a predetermined shape by a dry etching method using a CHF gas, an etch stopper 9215 is formed, and the resist is removed through an ashing process.

Next, as shown in FIG. 69(c), an α-Si:H(n) film 9216 is deposited on the α-Si:H (i) film 9214 and the etch stopper 9215. Then, a Cr (chromium)/Al double-layer film is deposited thereon by vacuum deposition or sputtering. Subsequently, a resist is formed by photolithography using a third mask (not shown). Then, the Cr/Al double-layer film is patterned by an etching method, whereby a source electrode 9217a and a drain electrode 9217b are formed in a predetermined shape. In this case, Al is patterned by a photo-etching method using $H_3PO_4$—$CH_3COOH$—$HNO_3$ and Cr is patterned by a photo-etching method using an aqueous solution of diammonium cerium nitrate. Subsequently, the α-Si:H films (9216 and 9214) are patterned by a dry etching method using a CHF gas and a wet etching method using an aqueous hydrazine solution ($NH_2NH_2.H_2O$), whereby the α-Si:H (n) film 9216 and the α-Si:H (i) film 9214 are formed in predetermined shapes, and the resist is removed through an ashing process.

Next, as shown in FIG. 69(d), before forming a transparent electrode 9219, an interlayer insulating film 9218 is deposited on the gate insulating electrode 9213, the etch stopper 9215, the source electrode 9217a and the drain electrode 9217b. Subsequently, a resist is formed by photolithography using a fourth mask (not shown). Then, the interlayer insulating film 9218 is patterned by an etching method, a through hole 9218a for electrically connecting the transparent electrode 9219 with the source electrode 9217a is formed, and the resist is removed through an ashing process.

Next, as shown in FIG. 69(e), on the interlayer insulating film 9218 in a region where patterns of the source electrode 9217a and the drain electrode 9217b are formed, an amorphous transparent conductive film formed mainly of indium oxide and zinc oxide is deposited by sputtering. Subsequently, a resist is formed by photolithography using a fifth mask (not shown). Then, the amorphous transparent conductive film is patterned by a photo-etching method using an approximately 4 wt % aqueous solution of oxalic acid as an etchant. Then, the amorphous transparent conductive film is formed in such a shape that the film electrically contacts the source electrode 9217a and the resist is removed through an ashing process. Whereby the transparent electrode 9219 is formed.

As mentioned above, five masks are required in the conventional method for producing a TFT substrate.

(Method for Production Using Three Masks)

To improve the above-mentioned conventional technology, various technologies to produce a TFT substrate by a method in which production steps are further reduced by decreasing the number of masks (from five to three, for example) have been proposed. For example, the following patent documents 1 to 7 describe a method of producing a TFT substrate using three masks.

Patent Document 1: JP-A-2004-317685
Patent Document 2: JP-A-2004-319655
Patent Document 3: JP-A-2005-017669
Patent Document 4: JP-A-2005-019664
Patent Document 5: JP-A-2005-049667
Patent Document 6: JP-A-2005-106881
Patent Document 7: JP-A-2005-108912

DISCLOSURE OF THE INVENTION

Problem to be solved by the Invention

However, since the methods for producing a TFT substrate using three masks described in patent documents 1 to 7 require an anodic oxidation step or the like of a gate insulating film, consequently they have a very complicated process. Therefore, there is a problem that the above methods for producing a TFT substrate are difficult to put into practical use.

Furthermore, in the actual production line, a more practical technique capable of improving productivity and quality has been desired.

The invention has been made in view of the above problem, and an object thereof is to provide a TFT substrate and a method for producing a TFT substrate which is capable of drastically reducing the production cost by decreasing the number of steps in the production process.

Means for Solving the Problem

In order to achieve the aforementioned object, a TFT substrate of the invention comprises a substrate; a gate electrode and a gate wire formed above the substrate; a gate insulating film formed at least above the gate electrode and the gate wire; a first oxide layer formed above the gate insulating film which is formed at least above the gate electrode; and a second oxide layer formed above the first oxide layer; wherein at least a pixel electrode is formed from the second oxide layer.

In the meantime, as for the terms "above" and "on", the term "above" implies "apart from the surface", and the term "on" implies "in contact with the surface". In the following embodiments, both are used appropriately.

The pixel electrode, the source electrode and the drain electrode, and the source wire and the drain wire may preferably be formed from the second oxide layer.

The pixel electrode may preferably be formed of the first oxide layer and the second oxide layer.

Preferably, the first oxide layer may be an n-type oxide semiconductor layer and the second oxide layer may be an oxide conductor layer.

A method for producing a TFT substrate of the invention comprises the steps of: forming a gate electrode and a gate wire above a substrate using a first mask; stacking a gate insulating film, a first oxide layer, a second oxide layer and a resist in this order above the substrate, the gate electrode and the gate wire; forming the resist in a predetermined shape by half-tone exposure using a second mask; selectively etching the first oxide layer and the second oxide layer to form a source wire, a drain wire and a pixel electrode; reforming the resist in a predetermined shape; selectively etching the second oxide layer to form a source electrode, a drain electrode and a channel part; and selectively etching the gate insulating film to form a gate insulating pad.

A method for producing a TFT substrate of the invention comprises the steps of: forming a gate electrode and a gate wire above a substrate using a first mask; stacking a gate insulating film, a first oxide layer, a second oxide layer and a resist in this order above the substrate, the gate electrode and the gate wire; forming the resist in a predetermined shape by half-tone exposure using a second mask; etching the first oxide layer and the second oxide layer and the gate insulating film to form a source wire, a drain wire, a pixel electrode and a gate wire pad; reforming the resist in a predetermined shape; and selectively etching the second oxide layer to form a source electrode, a drain electrode and a channel part.

Preferably, the above method further comprises the step of forming an auxiliary wire or an auxiliary electrode above the source wire, the drain wire, the source electrode and the drain electrode using a third mask.

In order to achieve the above object, the TFT substrate of the invention may be provided with a protective insulating film above the gate electrode and the gate wire, as well as above the source wire, the drain wire, the source electrode and the drain electrode, in a state in which the pixel electrode, the source/drain wire pad and the gate wire pad are exposed, and the source wire, the drain wire, the source electrode, the drain electrode and the pixel electrode may be formed from the second oxide layer.

Due to such a configuration, since the upper part of the first oxide layer of the channel part is protected by the protective insulating film, the TFT substrate can be operated stably for a prolonged period of time. Furthermore, due to the decreased number of masks used in production as well as the reduction of production steps, improvement of production efficiency and reduction of production cost can be attained. In addition, since the productive insulating film is formed, an organic EL apparatus can be readily obtained by providing organic EL materials, electrodes, and protective films on the TFT substrate.

Here, the "source/drain wire pad" means a source wire pad or a drain wire pad.

Preferably, the first oxide layer may be an n-type oxide semiconductor layer and the second oxide layer may be an oxide conductor layer.

By using the oxide semiconductor layer as an active layer for a TFT, a TFT remains stable when electric current is flown this is advantageous for an organic EL apparatus which is operated under current control mode.

Furthermore, the channel part, the source electrode and the drain electrode can be readily formed.

Preferably, the pixel electrode may be formed of a stacked film of the first oxide layer and the second oxide layer.

Due to such a configuration, malfunction caused by light can be prevented since the stacked film can be rendered transparent.

Preferably, the first oxide layer may be formed at least on the substrate side of the second oxide layer.

Due to such a configuration, malfunction caused by light can be prevented since the second oxide layer and the first oxide layer can be rendered transparent.

Preferably, an auxiliary conductive layer may be formed on at least one of the source wire, the drain wire, the source electrode, the drain electrode and the pixel electrode.

Due to such a configuration, the electric resistance of each wire or each electrode can be decreased, whereby reliability can be improved and a decrease in energy efficiency can be suppressed.

Preferably, the energy gaps of the first oxide layer and the second oxide layer are 3.0 eV or more.

By rendering the energy gap 3.0 eV or more, malfunction caused by light can be prevented. Although an energy gap of 3.0 eV or more is generally sufficient, an energy gap may preferably be 3.2 eV or more, more preferably 3.4 eV or more.

By rendering the energy gap large, prevention of malfunction caused by light can be ensured.

A method for producing a TFT substrate of the invention comprises the steps of: forming a gate electrode and a gate wire on a substrate using a first mask; stacking a gate insulating film, a first oxide layer, a second oxide layer and a second resist in this order on the substrate, the gate electrode and the gate wire, and forming the second resist in a predetermined shape using a second mask; patterning the second oxide layer by an etching method using the second resist to form a source wire, a drain wire, a source electrode, a drain electrode and a pixel electrode; stacking a protective insulating film and a third resist in this order on the first oxide layer, the source wire, the drain wire, the source electrode, the drain electrode and the pixel electrode, and forming the third resist in a predetermined shape by half-tone exposure; patterning the protective insulating film and the first oxide layer on the gate wire pad by an etching method using the third resist; and after reforming the third resist, selectively patterning the protective insulating film on the pixel electrode and the source/drain wire pad, as well as the gate insulating film on the gate wire pad by an etching method using the third resist to expose the pixel electrode, the source/drain wire pad, and the gate wire pad.

The invention is advantageous also as a method for producing a TFT substrate. Since a TFT substrate having a protective insulating film can be produced by using three masks, the number of masks decreases and production steps are reduced. As a result, production efficiency can be improved and production cost can be decreased. Moreover, since the upper part of the first oxide layer of the channel part is protected by the protective insulating film, a TFT substrate can be operated stably for a prolonged period of time.

A method for producing a TFT substrate of the invention comprises the steps of: forming a gate electrode and a gate wire on a substrate using a first mask; stacking a gate insulating film, a first oxide layer, a second oxide layer, an auxiliary conductive layer and a second resist in this order on the substrate, the gate electrode and the gate wire, and forming the second resist in a predetermined shape by half-tone exposure; patterning the auxiliary conductive layer and the second oxide layer by an etching method using the second resist to form a source wire, a drain wire, a source electrode, a drain electrode and a pixel electrode, as well as an auxiliary wire and an auxiliary electrode formed of the auxiliary conductive layer; after reforming the second resist, selectively patterning the auxiliary conductive layer on the pixel electrode by an etching method using the second resist to expose the pixel electrode; stacking a protective insulating film and a third resist in this order on the first oxide layer and the pixel electrode, as well as on the auxiliary conductive layer formed on the source wire, the drain wire, the source electrode and the drain electrode, and forming the third resist in a predetermined shape by half-tone exposure; patterning the protective insulating film and the first oxide layer on the gate wire pad by an etching method using the third resist; and after reforming the third resist, selectively patterning the protective insulating film on the pixel electrode and the source/drain wire pad, as well as the gate insulating film on the gate wire pad by an etching method using the third resist to expose the pixel electrode, the source/drain wire pad and the gate wire pad.

By the above-mentioned method, since a TFT substrate having a protective insulating film can be produced by using three masks, the number of masks decreases and production steps are reduced. As a result, production efficiency can be improved and production cost can be decreased. In addition, since the electric resistance of each wire or each electrode can be decreased, reliability can be improved and a decrease in energy efficiency can be suppressed.

In order to achieve the above object, in the TFT substrate of the invention, at least the pixel electrode and a source/drain electrode which is connected with the pixel electrode may be formed from the second oxide layer.

Due to such a configuration, by the decreased number of masks used in production as well as the reduction of production steps, improvement of production efficiency and reduction of production cost can be attained.

Here, the source/drain electrode means a source electrode or a drain electrode.

Preferably, the upper part of the TFT substrate may be covered by the protective insulating film and the protective insulating film may have openings at positions corresponding to each of the pixel electrode, the source/drain wire pad and the gate wire pad.

Due to such a configuration, since the upper part of the first oxide layer of the channel part is protected by the protective insulating film, a TFT substrate can be operated stably for a prolonged period of time. Furthermore, due to the provision of the protective insulating film in a TFT substrate, a TFT substrate capable of producing readily a display means or an emitting means utilizing a liquid crystal, an organic EL material and so on can be provided.

Here, the source/drain wire pad means a source wire pad or a drain wire pad.

Preferably, the first oxide layer may be an n-type oxide semiconductor layer and the second oxide layer may be an oxide conductor layer.

By using the oxide semiconductor layer as an active layer for a TFT, electric current can be flown stably. Therefore the TFT substrate is advantageous for an organic EL apparatus which is operated under current control mode. Furthermore, the channel part, the source electrode and the drain electrode can be readily formed.

Preferably, the pixel electrode may be formed of a stacked film of the first oxide layer and the second oxide layer.

Due to such a configuration, malfunction caused by light can be prevented since the stacked film can be rendered transparent.

Preferably, the first oxide layer may be formed at least on the substrate side of the second oxide layer.

Due to such a configuration, malfunction caused by light can be prevented since the second oxide layer and the first oxide layer can be rendered transparent.

Preferably, an auxiliary conductive layer may be formed above at least one of the source wire, the drain wire, the source electrode, the drain electrode and the pixel electrode.

Due to such a configuration, since the electric resistance of each wire and electrode can be decreased, reliability can be improved and a decrease in energy efficiency can be suppressed.

Preferably, the first oxide layer may be formed at a predetermined position corresponding to the channel part, the source wire, the drain wire, the source electrode, the drain electrode, and the pixel electrode.

Due to such a configuration, since the first oxide layer is normally formed only at a predetermined position, concern for occurrence of interference between gate wires (crosstalk) can be eliminated.

Preferably, the energy gap of the first oxide layer and/or the second oxide layer may be 3.0 eV or more.

By rendering the energy gap 3.0 eV or more, malfunction caused by light can be prevented. Although an energy gap of 3.0 eV or more is generally sufficient, an energy gap may preferably be 3.2 eV or more, more preferably 3.4 eV or more.

By rendering the energy gap large, prevention of malfunction caused by light can be ensured.

Preferably, part of the pixel electrode may be covered by a reflective metal layer.

Due to such a configuration, it is possible to provide a semi-transmissive or semi-reflective TFT substrate which can be operated stably for a prolonged period of time without suffering crosstalk and can drastically reduce production cost.

Preferably, at least one of the source wire, the drain wire, the source electrode and the drain electrode may be formed from the reflective metal layer.

Due to such a configuration, a larger amount of light can be reflected, whereby the luminance by the reflected light can be improved.

Preferably, the reflective metal layer is formed of a thin film of aluminum, silver or gold, or of an alloy layer containing aluminum, silver or gold.

Due to such a configuration, a larger amount of light can be reflected, whereby the luminance by the reflected light can be improved.

Preferably, the TFT substrate may be provided with a metal layer and may have an oxide conductor layer for protecting the metal layer.

Due to such a configuration, not only the metal layer can be prevented from corrosion but also the durability thereof can be improved. For example, if a metal layer is used as the gate wire, the surface of such metal layer can be prevented from being exposed when an opening for the gate wire pad is formed, whereby connection reliability can be improved. Further, if the metal layer is a reflective metal layer, discoloration of the reflective metal layer or other problems can be prevented, and disadvantages such as a decrease in reflectance of the reflective metal layer can be prevented.

Preferably, the TFT substrate may be provided with at least one of the gate electrode, the gate wire, the source wire, the drain wire, the source electrode, the drain electrode and the pixel electrode, and at least one of the gate electrode, the gate wire, the source wire, the drain wire, the source electrode, and the drain electrode and the pixel electrode may be formed of an oxide transparent conductive layer.

Due to such a configuration, the amount of transmitted light increases, and as a result, a display apparatus improved in luminance can be provided.

A method for producing a TFT substrate of the invention comprises the steps of: forming a gate electrode and a gate wire above a substrate using a first mask; stacking a gate insulating film, a first oxide layer, a second oxide layer and a second resist above the substrate, the gate electrode and the gate wire, and forming the second resist in a predetermined shape by half-tone exposure; patterning the second oxide layer and the first oxide layer by an etching method using the second resist to form a source wire, a drain wire, and a pixel electrode; after reforming the second resist, selectively patterning the second oxide layer above the gate electrode by an etching method using the second resist to form a source electrode and a drain electrode; stacking a protective insulating film and a third resist above the exposed gate insulating film and the exposed first oxide layer, as well as above the source wire, the drain wire, the source electrode, the drain electrode and the pixel electrode, and forming the third resist in a predetermined shape using the third mask; and patterning the protective insulating film above the pixel electrode and the source/drain wire pad, as well as the protective insulating film and the gate insulating film above the gate wire pad by an etching method using the third resist to expose the pixel electrode, the source/drain wire pad and the gate wire pad.

The invention is advantageous also as a method for producing a TFT substrate. Since a TFT substrate having a protective insulating film can be produced by using three masks, the number of masks decreases and production steps are reduced. As a result, production efficiency can be improved and production cost can be decreased. Moreover, since the upper part of the first oxide layer of the channel part is protected by the protective insulating film, a TFT substrate can be operated stably for a prolonged period of time. Furthermore, since the first oxide layer is usually provided only at a predetermined position (a predetermined position corresponding to the channel part, the source wire, the drain wire, the source electrode, the drain electrode and the pixel electrode), concern for occurrence of interference between the gate wires (crosstalk) can be eliminated.

A method for producing a TFT substrate of the invention comprises the steps of: forming a gate electrode and a gate wire on a substrate using a first mask; stacking a gate insulating film, a first oxide layer, a second oxide layer, an auxiliary conductive layer and a second resist above the substrate, the gate electrode and the gate wire, and forming the second resist in a predetermined shape by half-tone exposure; patterning the auxiliary conductive layer, the second oxide layer and the first oxide layer by an etching method using the second resist to form a source wire, a drain wire, a source electrode and a pixel electrode, as well as an auxiliary wire formed of the auxiliary conductive layer; after reforming the second resist, selectively patterning the auxiliary conductive layer and the second oxide layer above the gate electrode by an etching method using the second resist to form a source electrode and a drain electrode, as well as an auxiliary electrode formed of the auxiliary conductive layer; stacking a protective insulating film and a third resist above the exposed gate insulating film and the exposed first oxide layer, as well as above the auxiliary conductive layer formed above the source wire, the drain wire, the source electrode, the drain electrode and the pixel electrode, and forming the third resist in a predetermined shape using a third mask; and patterning the protective insulating film above the pixel electrode and the source/drain wire pad, as well as the protective insulating film above the gate wire pad by an etching method using the third resist to expose the auxiliary conductive layer above the pixel electrode and the source/drain wire pad; patterning the exposed auxiliary conductive layer above the pixel electrode and the source/drain wire pad by an etching method using the third resist to expose the pixel electrode and the source/drain wire pad; and patterning the gate insulating film above the gate wire pad by an etching method using the third resist to expose the gate wire pad.

By the above-mentioned method, a TFT substrate having an auxiliary conductive layer and a protective insulating film can be produced by using three masks. In addition, the number of masks can be decreased and production steps can be reduced. As a result, the production efficiency can be improved and production cost can be decreased. Furthermore, since the electric resistance of each wire and electrode can be decreased, reliability can be improved and a decrease in energy efficiency can be suppressed.

A method for producing a TFT substrate of the invention comprises the steps of: forming a gate electrode and a gate wire above a substrate using a first mask; stacking a gate insulating film, a first oxide layer, a second oxide layer, a reflective metal layer and a second resist above the substrate, the gate electrode and the gate wire, and forming the second resist in a predetermined shape by half-tone exposure; patterning the reflective metal layer, the second oxide layer and the first oxide layer by an etching method using the second resist to form a source wire, a drain wire and a pixel electrode; after reforming the second resist, selectively patterning the reflective metal layer and the second oxide layer above the gate electrode by an etching method using the second resist to form a source electrode and a drain electrode; stacking a protective insulating film and a third resist above the exposed gate insulating film and the exposed first oxide layer, as well as above the reflective metal layer formed above the source wire, the drain wire, the source electrode, the drain electrode and the pixel electrode, and forming the third resist in a predetermined shape by half-tone exposure; exposing part of the pixel electrode using the third resist and forming a reflective metal part formed of the reflective metal layer; reforming the third resist in a predetermined shape; and patterning the protective insulating film above the reflective metal part and the source/drain wire pad, as well as the protective insulating film and the gate insulating film above the gate wire pad by an etching method to expose the reflective metal part and the source/drain wire pad and the gate wire pad.

By the above-mentioned method, it is possible to provide a semi-transmissive or semi-reflective TFT substrate which can be operated stably for a prolonged period of time without suffering crosstalk and can drastically reduce production cost.

Preferably, an oxide conductor layer for protecting the metal layer for protecting the reflective metal layer may be formed above the reflective metal layer.

Due to such a configuration, discoloration of the reflective metal layer or the like can be prevented, and disadvantages such as a decrease in reflectance of the reflective metal layer can be prevented.

BEST MODE FOR CARRYING OUT THE INVENTION

Method for Producing a TFT Substrate According to a First Embodiment

The method for producing a TFT substrate in this embodiment is a method in which two masks are used, and corresponds to claims 8, 9 and 13.

(a) Step Using a First Mask

Figure 1:
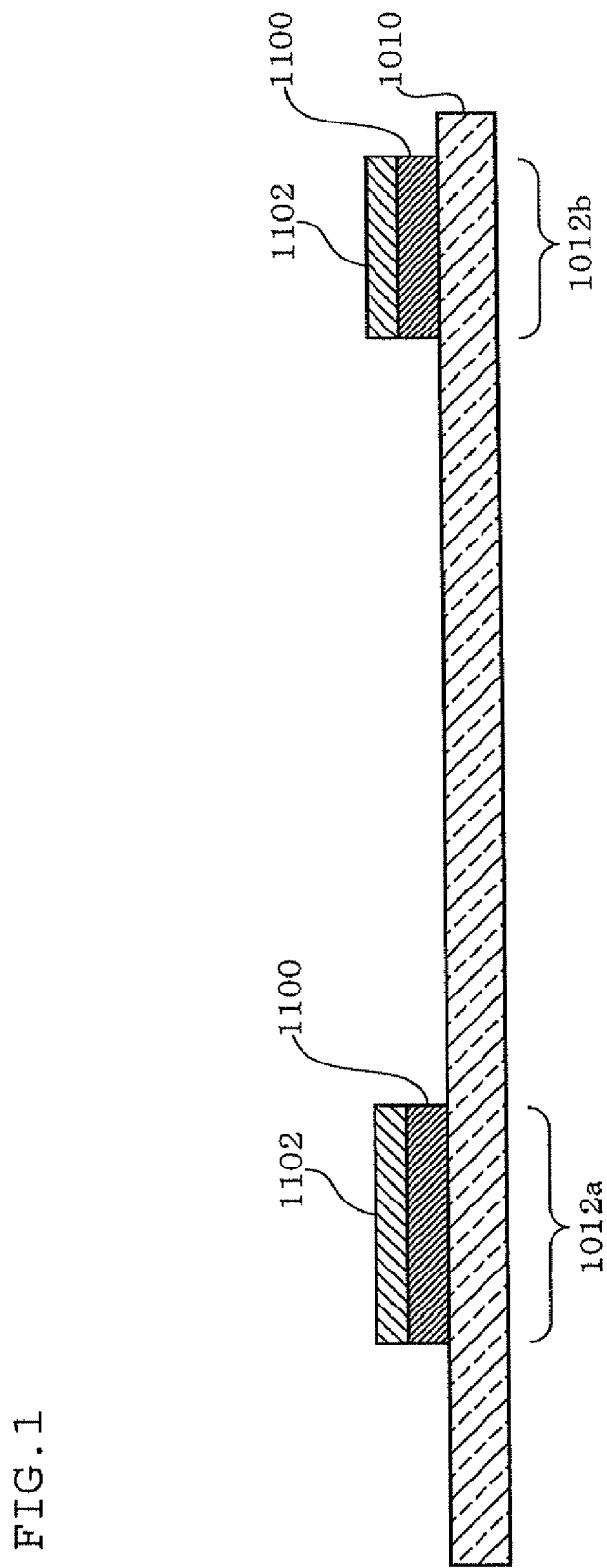
FIG. 1 is a schematic cross-sectional view for explaining the method of producing a TFT substrate according to a first embodiment of the invention, in which a gate electrode and a gate wire formed by using a first mask are shown.

FIG. 1 is a schematic cross-sectional view for explaining a step in which a first mask is used in the method for producing a TFT substrate according to a first embodiment of the invention.

Figure 2:
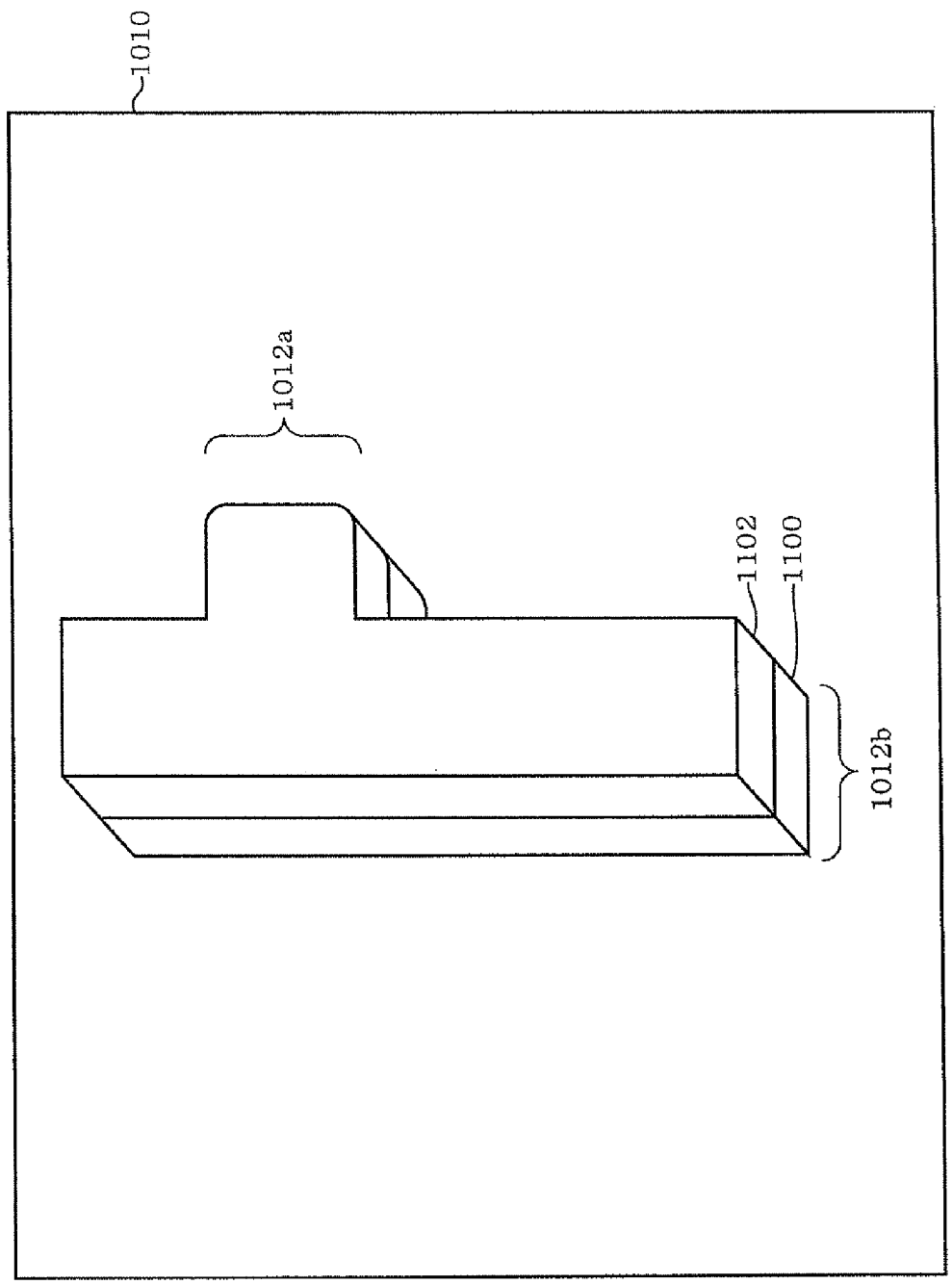
FIG. 2 is a schematic perspective view of FIG. 1.

FIG. 2 is a schematic perspective view of FIG. 1.

In FIGS. 1 and 2, a gate electrode 1012*a* and a gate wire 1012*b* formed using a first mask (not shown) are shown.

In the step using the first mask, on a light-transmissive glass substrate 1010, Al and Mo (molybdenum) are stacked in this order by using the high-frequency sputtering method, whereby a thin metal film 1100 with a thickness of about 300 nm is formed. Subsequently, a thin film 1102 with a thickness of about 100 nm is formed by using an indium oxide-zinc oxide (IZO:$In_2O_3$:ZnO=about 90:10 wt %) sputtering target. As a result, a gate electrode and a thin film for wiring formed of the thin metal film 1100 and the thin metal film 1102 are formed.

Subsequently, a resist (not shown) is formed by photolithography using the first mask, and the gate electrode and the thin film for wiring are patterned by an etching method with a mixture of phosphoric acid, acetic acid and nitric acid (hereinafter often abbreviated as an "acid mixture"). As a result, a gate electrode 1012a and a gate wire 1012b are formed in predetermined shapes.

In the etching as mentioned above, the metal thin film 1100 and the thin film 1102 are patterned simultaneously by an etching method since IZO is etched with an acid mixture. Since IZO is etched with an oxalic acid-based etching solution, at first, the thin film 1102 may be patterned by an etching method with an oxalic acid-based etching solution, and then, the thin metal film 1100 may be patterned by an etching method with an acid mixture.

(b) Step Using a Second Mask (b-a) First Etching Step a

Figure 3:
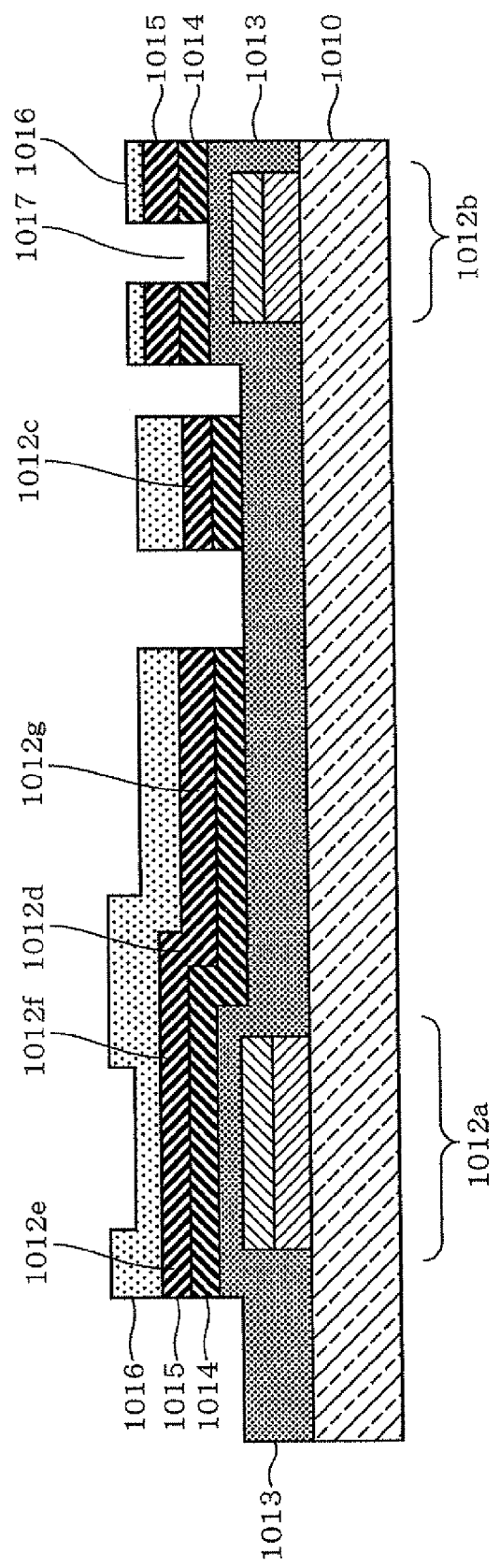
FIG. 3 is a schematic cross-sectional view for explaining the method for producing a TFT substrate according to the first embodiment of the invention, in which a source wire, a drain wire, and a pixel electrode formed by using a second mask are shown.

FIG. 3 is a schematic cross-sectional view for explaining the method for producing a TFT substrate according to the first embodiment of the invention, in which a source wire, a drain wire and a pixel electrode formed by using the second mask are shown.

Figure 4:
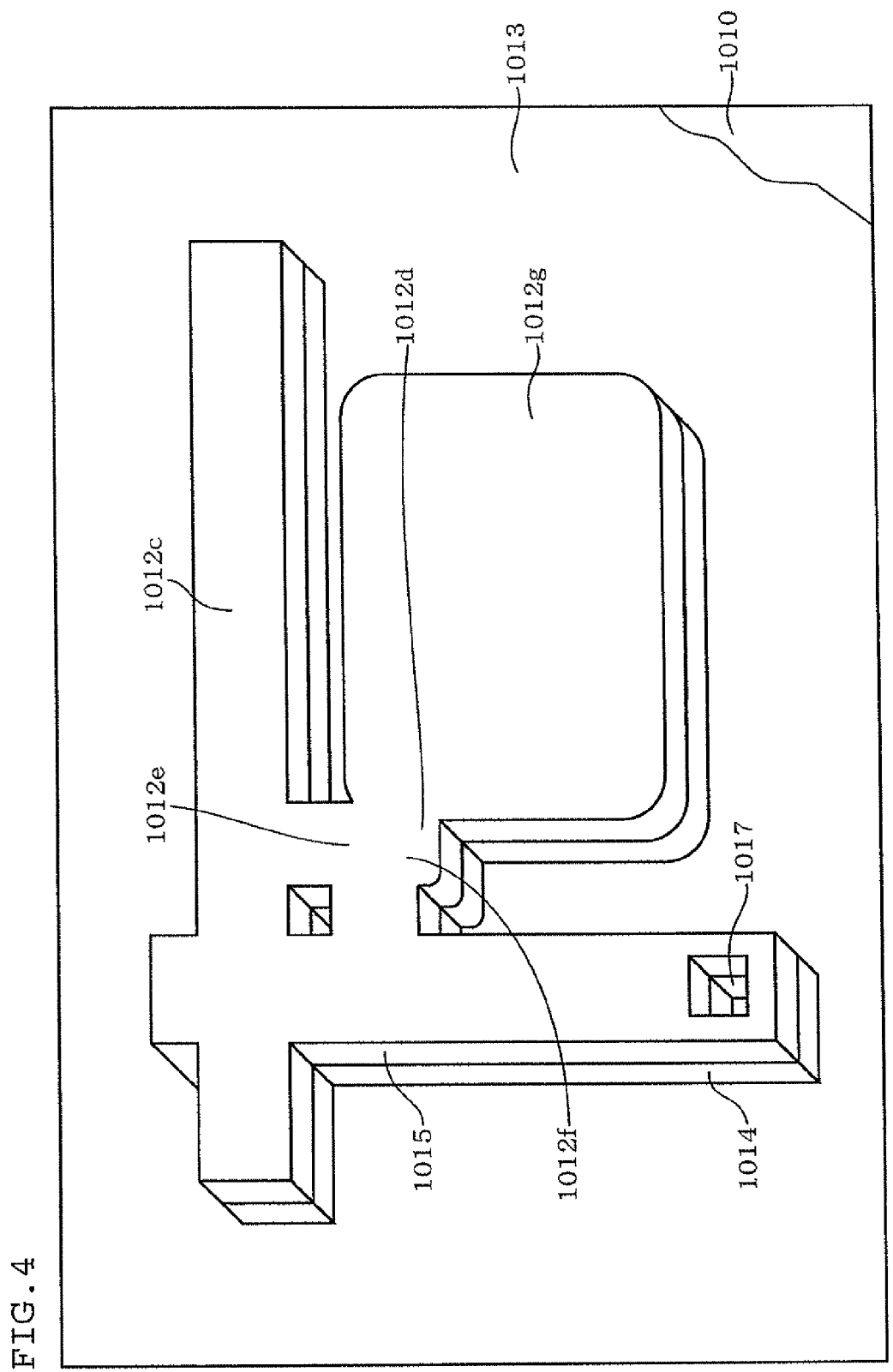
FIG. 4 is a schematic perspective view of FIG. 3.

FIG. 4 is a schematic perspective view of FIG. 3.

Subsequently, as shown in FIGS. 3 and 4, a gate insulating film 1013, which is a silicon nitride (SiNx) film, is deposited in a thickness of about 300 nm by the glow discharge CVD method. An $SiH_4$—$NH_3$—$N_2$-based mixed gas is used as a discharge gas.

Next, an n-type oxide semiconductor layer 1014 with a thickness of about 150 nm is formed by using an indium oxide-gallium oxide-zinc oxide ($InGaZnO_4$) target by the high-frequency sputtering method in an atmosphere of about 15% oxygen and about 85% argon.

Then, an oxide conductor layer 1015 with a thickness of about 150 nm is formed by the high-frequency sputtering method using an indium oxide-zinc oxide ($IZO:In_2O_3$: $ZnO$=about 90:10 wt %) target in an atmosphere of about 15% oxygen and about 85% argon.

Here, the n-type oxide semiconductor layer 1014 is a preferable example of the "first oxide layer" in the claims, and the oxide conductor layer 1015 is a preferable example of the "second oxide layer" in the claims.

After applying a resist 1016, the resist 1016 is formed in a predetermined shape by half-tone exposure.

Next, half-tone exposure technology which is generally employed will be explained below referring to the drawing.

Figure 5:
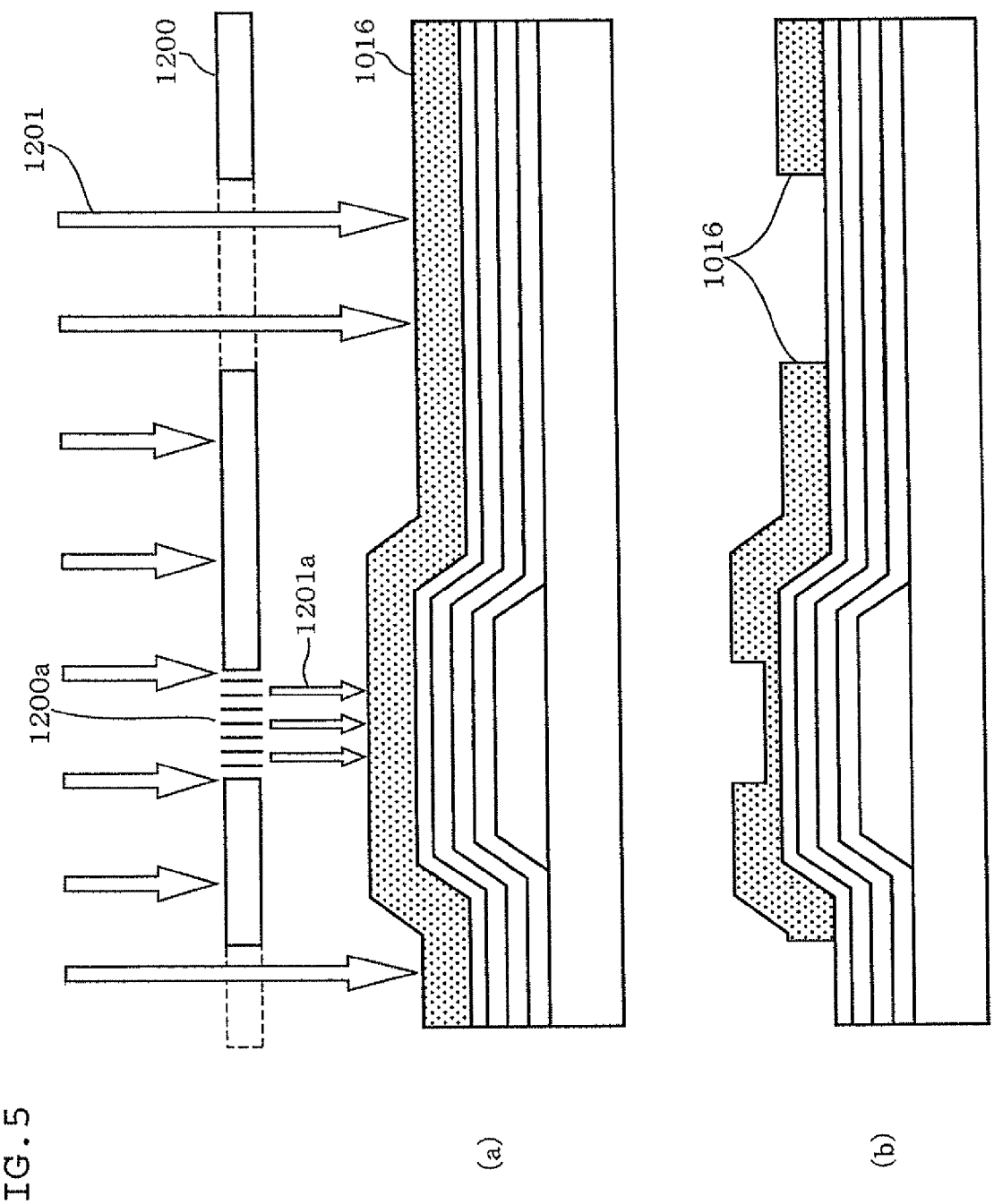
FIG. 5 is a view for explaining generally-used half-tone exposure technology, in which (a) is a schematic cross-sectional view during exposure, and (b) is a schematic cross-sectional view after development.

FIG. 5 is a view for explaining the half-tone exposure technology which is generally employed, in which (a) is a cross-sectional view during exposure, and (b) is a cross-sectional view after development.

In FIG. 5(a), exposure light 1201 transmits unmasked parts, whereby the resist 1016 is sensitized.

The resist 1016 masked by a mask 1200 is not sensitized since the exposure light 1201 does not transmit therethrough. On the other hand, as for the resist 1016 masked by a half-tone mask part 1200a, about half is sensitized by exposure light 1201a, since about half of the exposure light 1201a transmits therethrough.

After the above-mentioned exposure, the resist 1016 is developed.

FIG. 5(b) shows a state of the resist 1016 after the development. As shown in FIG. 5(b), the resist 1016 of the unmasked part is completely peeled off. The resist 1016 which is masked by the mask 1200 remains as it is. On the other hand, the resist 1016 masked by the half-tone masking part 1200a is peeled off, and therefore the thickness is reduced by half. As a result, the resist 1016 is formed in a shape shown in FIG. 5(b).

In this embodiment, the resist 1016 is formed in a desired shape by such a technique.

As shown in FIGS. 3 and 4, after formation of the resist 1016, the above-mentioned IZO which is the oxide conductor layer 1015 and the above-mentioned indium oxide-gallium oxide-zinc oxide which is the n-type oxide semiconductor layer 1014 are simultaneously patterned by an etching method with an oxalic acid-based etching solution. As a result, a source wire 1012c, a drain wire 1012d, part of a source electrode 1012e, part of a drain electrode 1012f and a pixel electrode 1012g are formed. Etching by using the above-mentioned oxalic acid-based etching solution is etching method A in which the etching rates of the oxide conductor layer 1015 and the n-type oxide semiconductor layer 1014 are faster than the etching rate of the gate insulating film 1013.

In this embodiment, the drain wire 1012d and the pixel electrode 1012g are connected, but the invention is not limited to this configuration.

As is apparent from the above, the characteristic feature of this embodiment is that the films of the two layers, i.e. the oxide conductor layer 1015 and the n-type oxide semiconductor layer 1014 have the functions of three parts (source/drain wires 1012c and 1012d, source/drain electrode 1012e and 1012f, and pixel electrode 1012g). Therefore, in this embodiment, it is not necessary to prepare three masks matching these three parts, and these three parts can be formed by using a single piece of the second mask.

As shown in FIG. 4, a double-layer structure of the n-type oxide semiconductor layer 1014 (indium oxide-gallium oxide-zinc oxide) and the oxide conductor layer 1015 (IZO) is formed on the gate insulating film 1013. This double-layer structure allows the pixel electrode 1012g to be formed of the n-type oxide semiconductor layer 1014 and the oxide conductor layer 1015. As shown in FIG. 4, the transparent substrate 1010 is covered by the gate insulating film 1013.

In FIG. 4, for the convenience of understanding, the resist 1016 on the oxide conductor layer 1015 is omitted. As shown in FIGS. 3 and 4, a gate wire withdrawal hole 1017 is formed.

(b-b) Second Etching Step b

Figure 6:
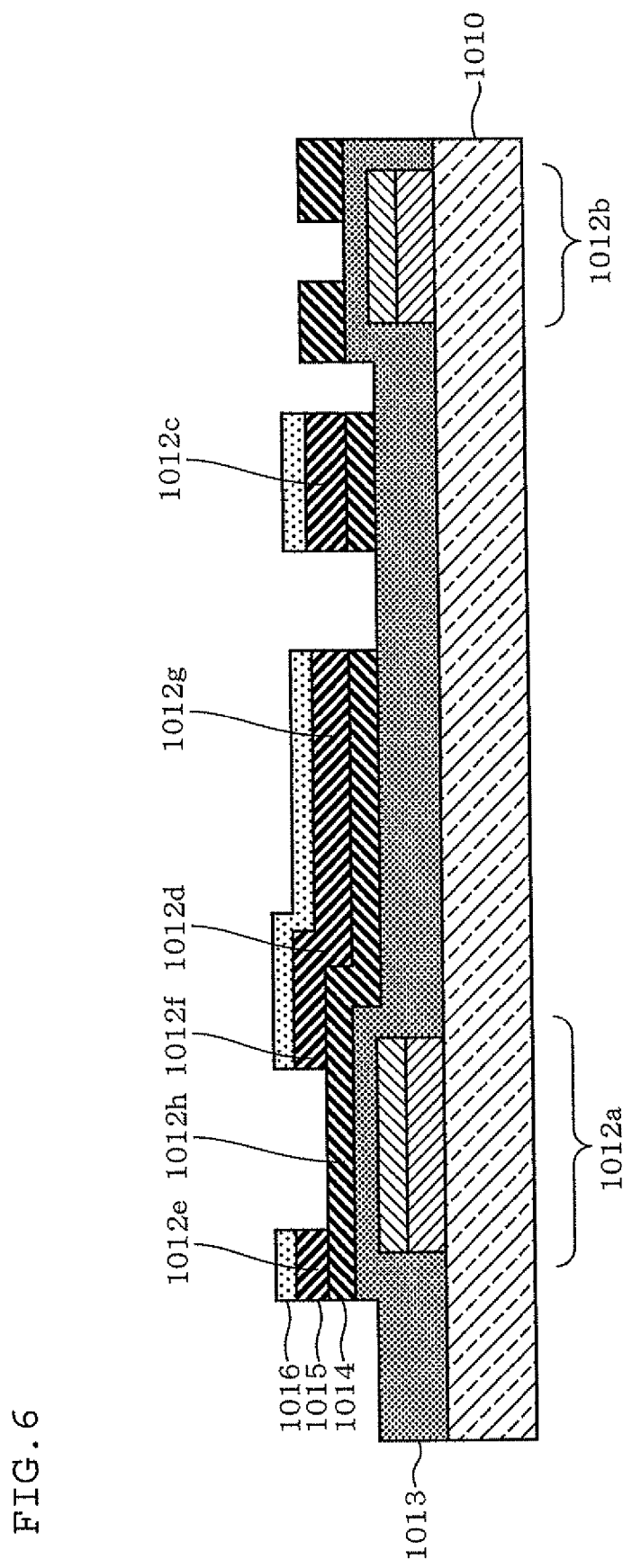
FIG. 6 is a schematic cross-sectional view for explaining the method of producing a TFT substrate according to the first embodiment of the invention, in which a source electrode and a drain electrode formed by using a second mask are shown.

FIG. 6 is a schematic cross-sectional view for explaining the method for producing a TFT substrate according to the first embodiment of the invention. In the figure, the source electrode and the drain electrode formed by using the second mask are shown.

Figure 7:
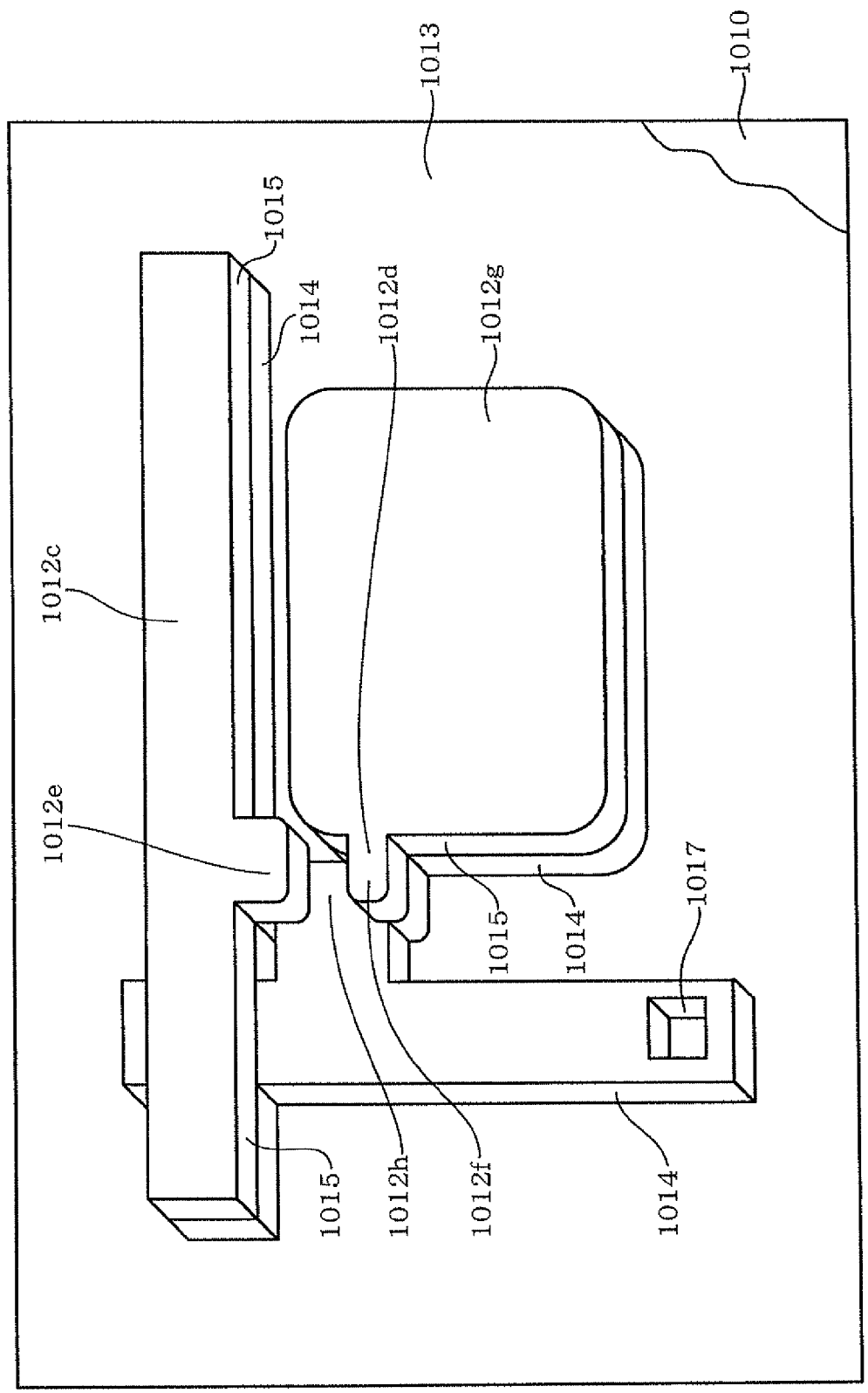
FIG. 7 is a schematic perspective view of FIG. 6.

FIG. 7 is a schematic perspective view of FIG. 6.

As shown in FIG. 6, the resist 1016 is ashed (the resist is peeled off and removed) and reformed in a predetermined shape.

Next, ashing technology will be explained below referring to the drawing.

Figure 8:
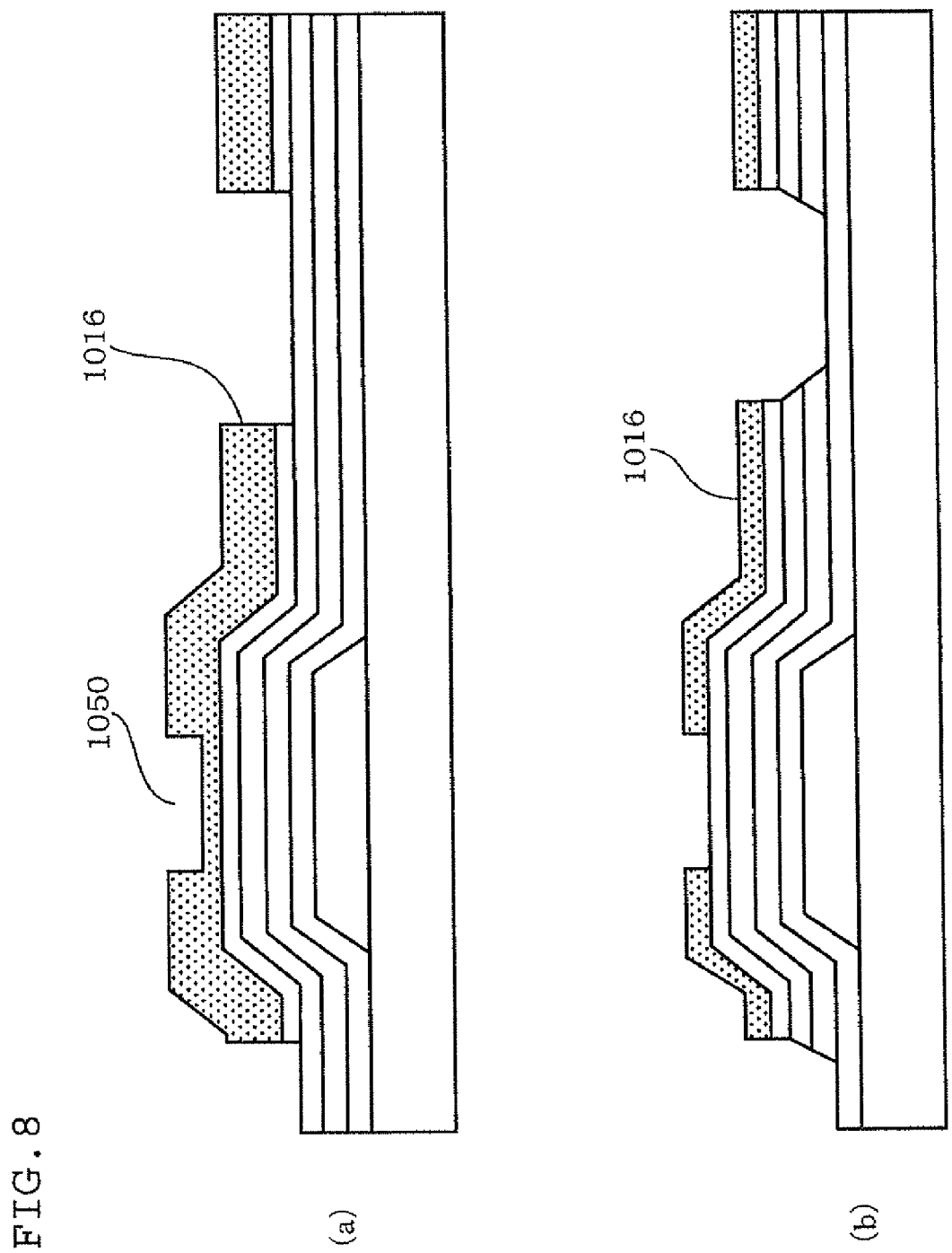
FIG. 8 is a view for explaining an ashing process to reform a resist, in which (a) is a schematic cross-sectional view of the resist before reformation, and (b) is a schematic cross-sectional view of the resist after reformation.

FIG. 8 is a view explaining ashing treatment for the reformation of the resist, in which (a) is a cross-sectional view of the resist before reformation, and (b) is a cross-sectional view of the reformed resist.

As shown in FIG. 8(a), the resist 1016 before reformation is provided with a concave 1050 which is formed by half-tone exposure.

Ashing is a treatment for peeling off and removing the resist 1016. As the method for ashing, wet washing with chemicals and so on has heretofore been employed.

After the resist is ashed for a predetermined period of time, the resist 1016 below the concave 1050 is completely removed as shown in FIG. 8(b). A thick portion of the resist 1016 in which the concave 1050 is not formed is partially removed from above, and the thickness thereof is reduced approximately by half.

In this embodiment, the resist 1016 is reformed by the above-mentioned ashing treatment.

Then, as shown in FIGS. 6 and 7, IZO which is the oxide conductor layer 1015 is patterned by an etching method with an acid mixture, whereby a channel part 1012h is formed. At this time, formation of a source electrode 1012e and a drain electrode 1012f is completed. The unnecessary oxide conductor layer 1015 above the gate wire 1012b is removed by this etching. Etching by using the above-mentioned acid mixture is etching method B in which the etching rate is faster than the etching rates of the n-type oxide semiconductor layer 1014 and the gate insulating film 1013.

In FIG. 6, for the convenience of understanding, the resist 1016 above the oxide conductor layer 1015 is omitted.

(c) Step of Forming a Gate Wire Pad

Figure 9:
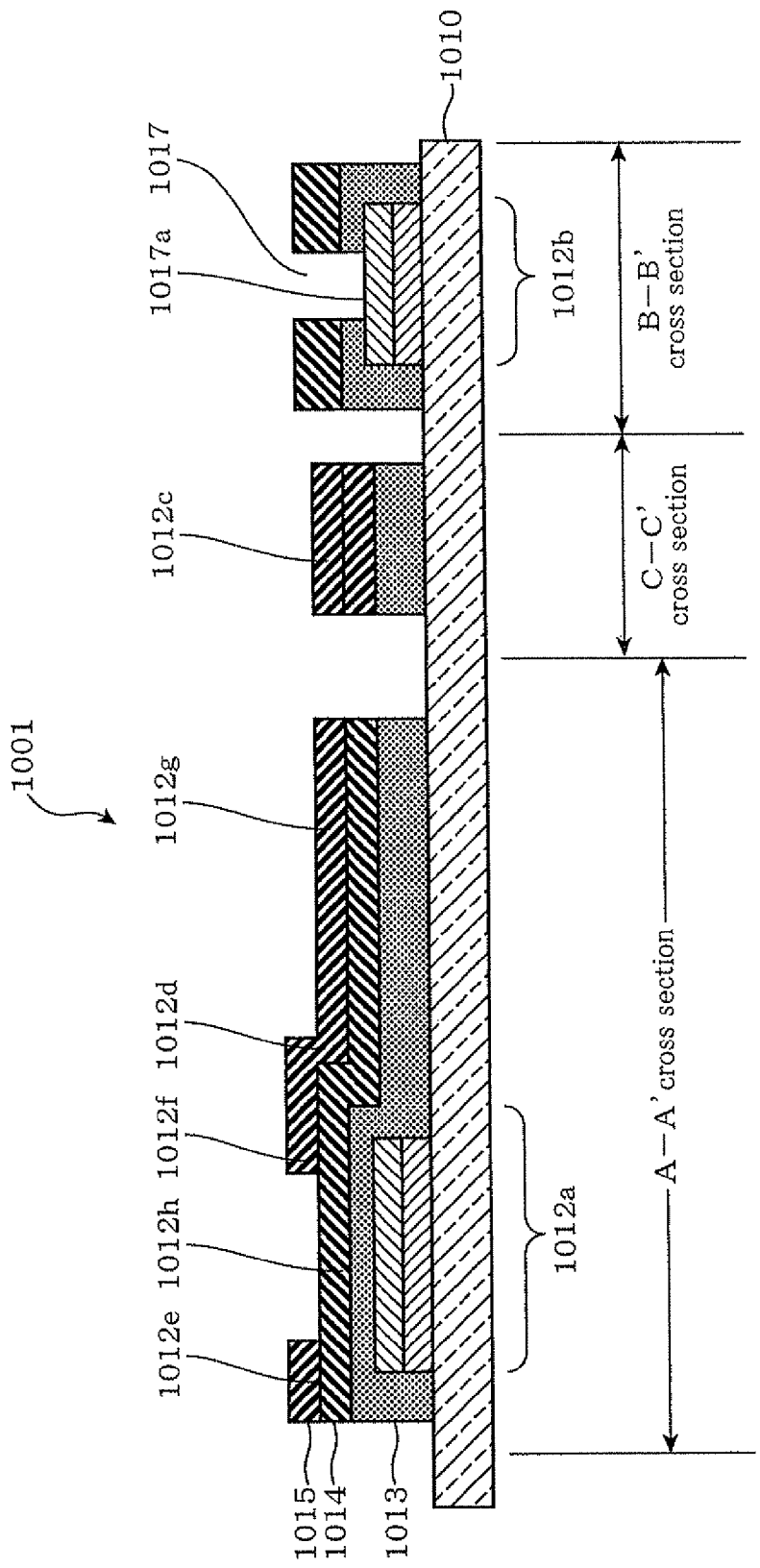
FIG. 9 is a schematic cross-sectional view for explaining the method of producing a TFT substrate according to the first embodiment of the invention, in which a gate wire pad are formed and the resist is removed.

FIG. 9 is a schematic cross-sectional view for explaining the method for producing a TFT substrate according to the first embodiment of the invention. In the figure, a gate wire pad is formed and the resist is removed.

Figure 10:
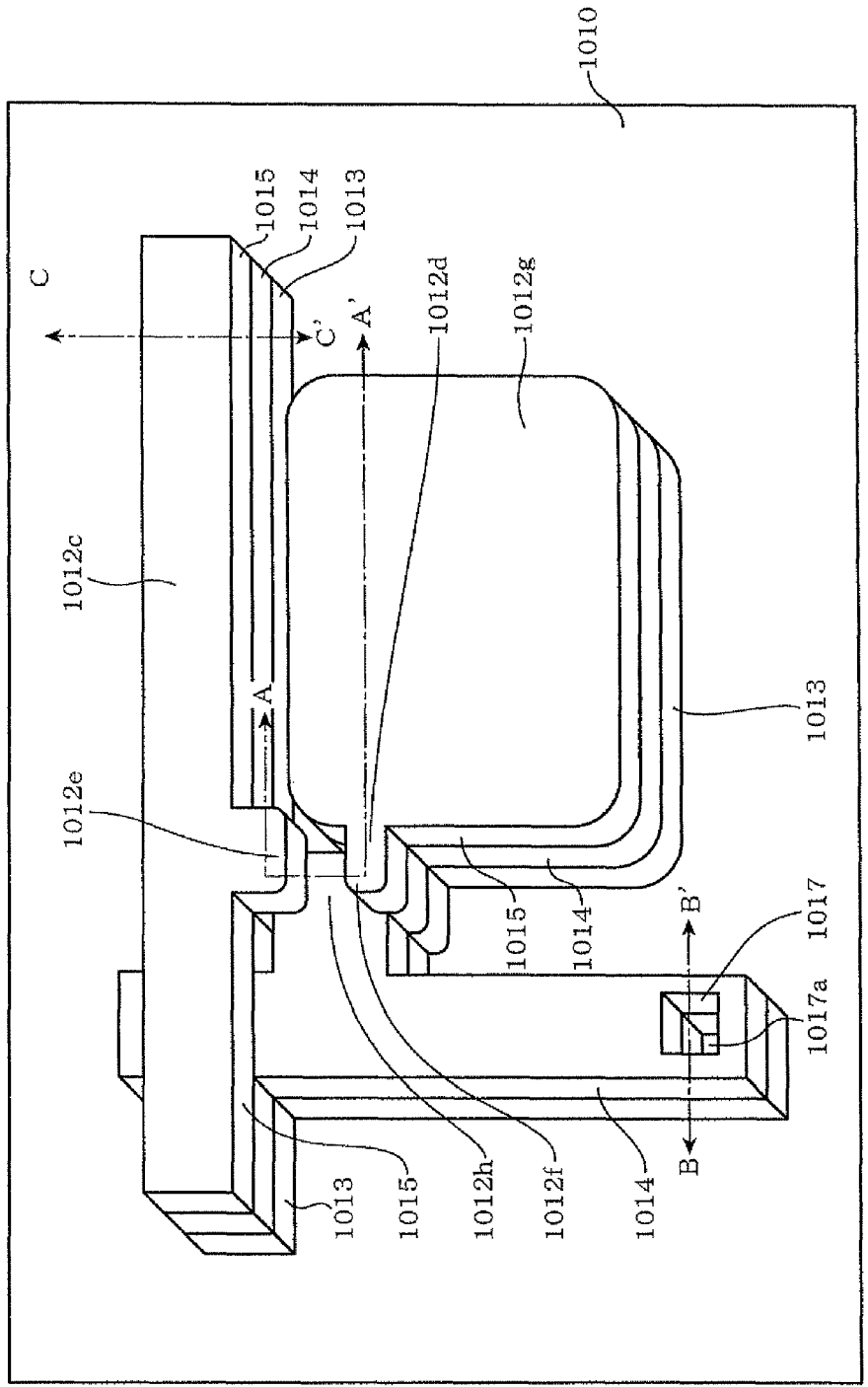
FIG. 10 is a schematic perspective view of FIG. 9.

FIG. 10 is a schematic perspective view of FIG. 9.

Next, as shown in FIGS. 9 and 10, by using a reactive etching gas such as a mixed gas of CHF ($CF_4$, $CHF_3$, or the like) with an oxygen gas or an argon gas, the gate insulating film 1013 below the gate wire withdrawal hole 1017 is patterned by a dry etching method, whereby a gate wire pad 1017a is formed. At this time, the unnecessary gate insulating film 1013 is also etched. The above dry etching is etching method C in which the etching rate of the gate insulating layer 1013 is faster than the etching rates of the oxide conductor layer 1015 and the n-type oxide semiconductor layer 1014.

Then, the resist 1016 is peeled off, and the glass substrate 1010 is cleaned. As a result, a TFT substrate 1001 can be obtained by the 2-mask method using a desired oxide semiconductor.

FIG. 9 is a cross-sectional view obtained by combining cross sections of parts indicated by line A-A', line B-B', and line C-C' shown in FIG. 10 into a single cross-sectional view. The same applies to the FIG. 1, FIG. 3 and FIG. 6.

Here, the thin film (oxide conductor layer 1015) formed by using an indium oxide-zinc oxide ($IZO:In_2O_3:ZnO$=about 90:10 wt %) target can be etched with the oxalic acid-based etchant or with an acid mixture.

On the other hand, the thin film (n-type oxide semiconductor layer 1014) formed by using an indium oxide-gallium oxide-zinc oxide ($InGaZnO_4$) target can be etched with an oxalic acid-based etchant, but is etched slowly when etched with an acid mixture.

Therefore, selective etching in the above-mentioned (b-b) Second etching step b is possible. Other materials may be used in the n-type oxide semiconductor layer 1014 and the oxide conductor layer 1015 insofar as they have the above-mentioned etching properties.

When the gate wire pad 1017a is formed by dry etching such as reactive etching, a small amount of the channel part 1012f is simultaneously etched. Since the channel part 1012f is formed of the first oxide layer 1014, the rate of dry etching is slow, and hence, substantially no damage is exerted on the channel part 1012f.

In this embodiment, indium oxide-gallium oxide-zinc oxide ($InGaZnO_4$) is used as the material for the n-type oxide semiconductor layer 1014. However, any other materials can be used insofar as they have substantial resistance to dry etching. That is, other oxide semiconductors having substantial dry etching resistance may preferably be selected as the material for the n-type oxide semiconductor layer 1014 (first oxide layer).

In this embodiment, each of the gate electrode 1012a and the gate wire 1012b has a double-layer structure of a thin metal film and IZO. As mentioned above, a metal oxide such as IZO has resistance to dry etching, and hence, exerts no damage on the underlying thin metal layer during dry etching.

In this embodiment, the thin metal film has a double-layer structure of aluminum and molybdenum (Al/Mo) in order to decrease the contact resistance between the oxide and the metal. If a metal with a small contact resistance is used, it is preferred that the thin metal film have a single-layer structure.

This embodiment is advantageous as an invention of a TFT substrate, and the above-mentioned TFT substrate 1001 corresponds to claims 1, 2, 3, 6 and 7.

Method for Producing a TFT Substrate According to a Second Embodiment

The method for producing a TFT substrate in this embodiment is a method in which three masks are used, and corresponds to claims 8, 9, 11, 12 and 13.

(a) Step Using a First Mask

In the step using a first mask, on a light-transmissive glass substrate 1010, Al and Mo (molybdenum) are stacked in this order by using the high-frequency sputtering method, whereby a thin metal film 1100 with a thickness of about 300 nm is formed. Subsequently, a thin film 1102 with a thickness of about 100 nm is formed by using an indium oxide-tin oxide-cerium oxide ($ITCO:In_2O_3:SnO_2:CeO_2$=about 90:7:3 wt %) sputtering target. As a result, a gate electrode and a thin film for wiring formed of the thin metal film 1100 and the thin metal film 1102 are formed.

Subsequently, a resist is formed by photolithography using the first mask, and the thin film for gate wire is patterned by an etching method with an acid mixture. As a result, a gate electrode 1012a and a gate wire 1012b are formed in a predetermined shape (see FIGS. 1 and 2).

In the etching as mentioned above, the metal thin film 1100 and the thin film 1102 are patterned simultaneously by an etching method since ITCO is etched with an acid mixture. Since ITCO is etched with an oxalic acid-based etching solution, at first, the thin film 1102 may be etched with an oxalic acid-based etching solution, and then, the thin metal film 1100 may be etched with an acid mixture.

(b) Step Using a Second Mask (b-a) First Etching Step a

Subsequently, a gate insulating film 1013 which is a silicon nitride (SiNx) film is deposited in a thickness of about 300 nm by the glow discharge CVD method. An $SiH_4$—$NH_3$—$N_2$-based mixed gas is used as a discharge gas.

Then, an n-type oxide semiconductor layer 1014 with a thickness of about 150 nm is formed by the high-frequency sputtering method using an indium oxide-gallium oxide-zinc oxide ($InGaZnO_4$) target in an atmosphere of about 15% oxygen and about 85% argon.

Subsequently, an oxide conductor layer 1015 with a thickness of about 150 nm is formed by the high-frequency sputtering method using an indium oxide-tin oxide-samarium oxide ($ITSmO:In_2O_3:SnO_2:Sm_2O_3$=about 90:7:3 wt %) target in an atmosphere of about 15% oxygen and about 85% argon.

Here, the n-type oxide semiconductor layer 1014 is a preferable example of the "first oxide layer" in claims, and the oxide conductor layer 1015 is a preferable example of the "second oxide layer" in claims.

After applying a resist 1016, the resist 1016 is formed in a predetermined shape by half-tone exposure.

After formation of the resist 1016, the above-mentioned ITSmO which is the oxide conductor layer 1015 and the above-mentioned indium oxide-gallium oxide-zinc oxide which is the n-type oxide semiconductor layer 1014 are simultaneously patterned by an etching method with an oxalic acid-based etching solution (etching method A). As a result, a source wire 1012*c*, a drain wire 1012*d*, part of a source electrode 1012*e*, part of a drain electrode 1012*f* and a pixel electrode 1012*g* are formed (see FIGS. 3 and 4).

As is apparent from the above, the characteristic feature of this embodiment is that the films of the two layers, i.e. the oxide conductor layer 1015 and the n-type oxide semiconductor layer 1014 have the functions of three parts (source/drain wires 1012*c* and 1012*d*, source/drain electrodes 1012*e* and 1012*f*, and pixel electrode 1012*g*). Therefore, in this embodiment, it is not necessary to prepare three masks matching these three parts, and these three parts can be formed by using a single piece of the second mask.

(b-b) Second Etching Step b

Then, the resist 1016 is removed through ashing process (peeled off and removed) and reformed in a predetermined shape.

Subsequently, ITSmO which is the oxide conductor layer 1015 is patterned by an etching method with an acid mixture (etching method B), whereby a channel part 1012*h* is formed. The unnecessary oxide conductor layer 1015 above the gate wire 1012*b* is removed by this etching (see FIGS. 6 and 7).

(c) Step for Forming a Gate Wire Pad

Next, by using a reactive etching gas such as a mixed gas of CHF ($CF_4$, $CHF_3$, or the like) with an oxygen gas or an argon gas, the gate insulating film 1013 below the gate wire withdrawal hole 1017 is patterned by a dry etching method (etching method C), whereby a gate wire pad 1017*a* is formed.

Then, the resist 1016 is peeled off, and the glass substrate 1010 is cleaned. As a result, a TFT substrate can be obtained by the 2-mask method using a desired oxide semiconductor.

The above-mentioned procedures of this embodiment are substantially similar to those of the first embodiment (production of a TFT substrate using two masks) (see FIG. 9).

(d) Treatment Using a Third Mask

Figure 11:
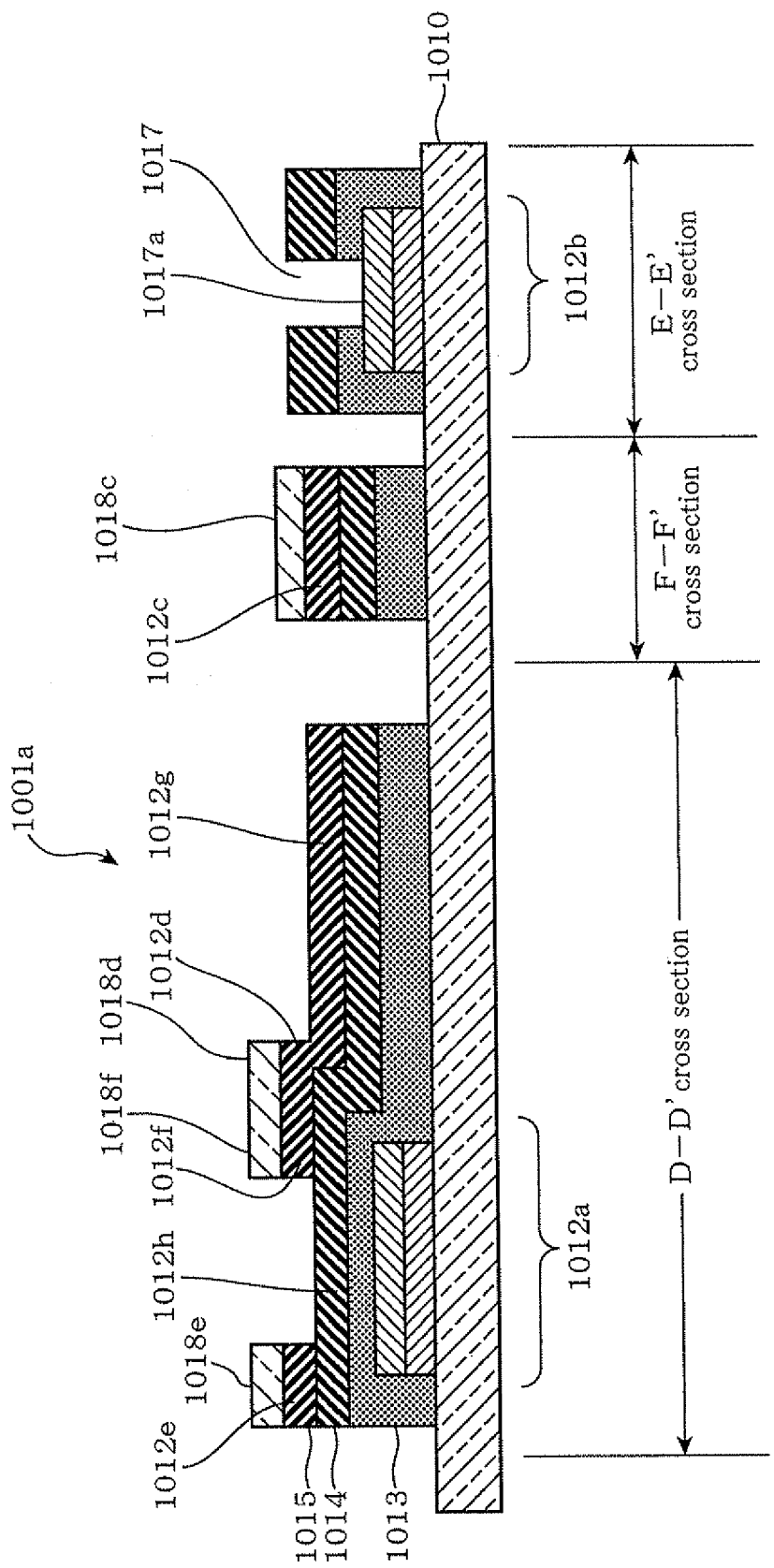
FIG. 11 is a schematic cross-sectional view for explaining the method of producing a TFT substrate according to a second embodiment of the invention, in which an auxiliary electrode and an auxiliary wire are formed.

FIG. 11 is a schematic cross-sectional view for explaining the method for producing a TFT substrate according to a second embodiment of the invention, in which an auxiliary electrode and an auxiliary wire are formed.

Figure 12:
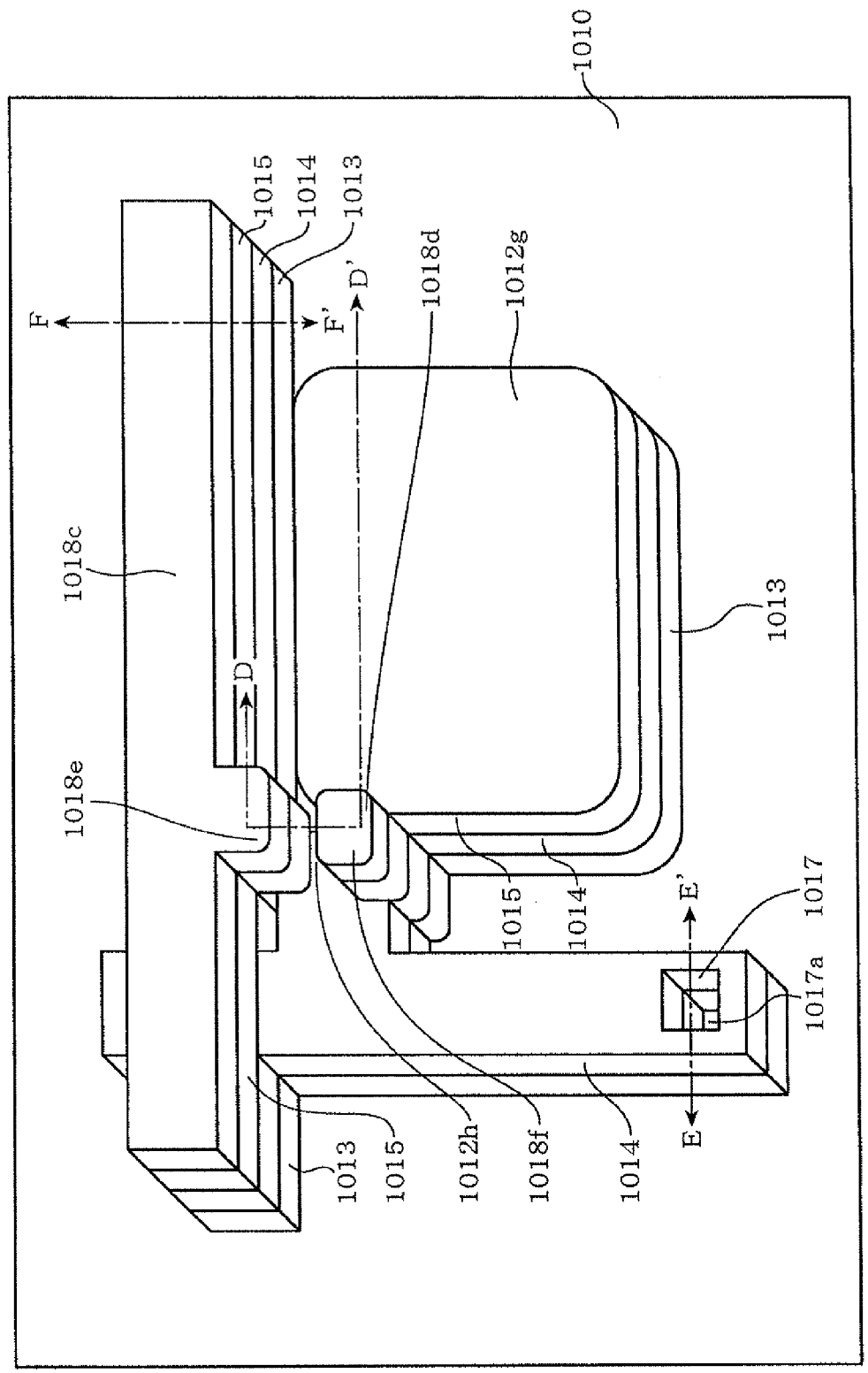
FIG. 12 is a schematic perspective view of FIG. 11.

FIG. 12 is a schematic perspective view of FIG. 11.

In FIGS. 11 and 12, the TFT substrate is subjected to heat treatment at 230° C. for about 30 minutes. Subsequently, an Al layer from which an auxiliary electrode and an auxiliary wire are formed is deposited in a thickness of about 250 nm. Then, an auxiliary electrode and an auxiliary wire are formed in predetermined shapes by using the third mask.

In this embodiment, the source wire 1012*c*, the drain wire 1012*d*, the source electrode 1012*e* and the drain electrode 1012*f* are formed of an oxide conductor. The material for the oxide conductor is ITSmO, which has a specific electric resistance as large as about 300 μΩcm. Use of ITSmO increases wiring resistance. Therefore, in this embodiment, the wiring resistance is rendered small by forming auxiliary electrodes 1018*e* and 1018*f*, as well as auxiliary wires 1018*c* and 1018*d*.

In the first embodiment, IZO is used instead of ITSmO. As in the case of the second embodiment, the wiring resistance in the first embodiment can be rendered small by performing treatment using the third mask (treatment for forming the auxiliary electrodes 1018*e* and 1018*f*, as well as the auxiliary wires 1018*c* and 1018*d*).

The Al layer is patterned by an etching method with an acid mixture (etching method B) to form the auxiliary electrodes 1018*e* and 1018*f* and the auxiliary wires 1018*c* and 1018*d*. In this case, due to the above-mentioned heat treatment at 230° C. for about 30 minutes, the oxide conductor is crystallized and has resistance to etching with an acid mixture. Therefore, it is possible to pattern only the Al layer by an etching method.

In this embodiment, ITCO or ITSmO is used as the oxide conductor. However, any oxide conductor which becomes resistant to etching with an acid mixture can be used to form an auxiliary electrode and an auxiliary wire.

Next, the resist is peeled off and the glass substrate 1010 is cleaned. As a result, a TFT substrate 1001*a* on which an auxiliary electrode and an auxiliary wire are formed can be obtained.

By stacking the auxiliary electrodes 1018*e* and 1018*f* and the auxiliary wires 1018*c* and 1018*d* on the source electrode 1012*e*, the drain electrode 1012*f*, the source wire 1012*c* and the drain wire 1012*d*, the resistance of each of the source electrode, the drain electrode, the source wire and the drain wire can be further decreased.

FIG. 11 is a cross-sectional view obtained by combining cross sections of parts indicated by line D-D', line E-E', line F-F' shown in FIG. 12 into a single cross-sectional view.

(Protective Film for Auxiliary Electrode and Auxiliary Wire)

The Al layer constituting each of the auxiliary electrodes 1018*e* and 1018*f* and the auxiliary wires 1018*c* and 1018*d* is exposed. Therefore, according to application, stability against corrosion or the like is required to be improved. In this case, stability can be improved by providing on the Al layer a protective film (not shown) formed of IZO with a thickness of about 10 to 50 nm. Since IZO is readily etched with an acid mixture which is an etching solution for Al, simultaneous etching with Al is possible. This simultaneous etching is preferable since it does not increase production steps.

In the case of the simultaneous etching, the Al layer and the protective film are stacked, and then, the Al layer and the protective film are patterned by an etching method with an acid mixture all at once in a predetermined shape.

It is also possible to form the above-mentioned protective film after the formation of the auxiliary electrode and the auxiliary wire which are formed of the Al layer.

In this embodiment, IZO is used as the material for the above-mentioned protective film. However, any other materials may be used insofar as the material can be etched simultaneously with the auxiliary electrode and the auxiliary wire. However, the material for the protective film should be conductive to some extent.

Therefore, as the above-mentioned protective film, it is preferable to use an amorphous film such an IZO film, an ITCO film, an ITSmO film, and an ITZO film. IZO is preferable from the viewpoint of etching properties. However, for the simplification of the production steps, it is preferable to use the same material as that for the transparent electrode which is used in the TFT substrate.

In IZO, the ratio of the indium oxide and the zinc oxide (In/In+Zn) (wherein In is the number of indium atoms per unit and Zn is the number of zinc atoms per unit) may preferably be about 0.55 to 0.95 (the ratio of the number of atoms). It is more preferred that this ratio be about 0.75 to 0.9.

In ITCO and ITSmO, the ratio of the number of tin atoms to the number of all metal atoms may preferably about 0.03 to 0.15. Also, the ratio of the number of cerium atoms or samarium atoms to the number of all metal atoms may preferably be about 0.01 to 0.15. It is more preferred that the ratio of the number of cerium atoms or samarium atoms be about 0.01 to 0.1 to improve the above-mentioned selective etching properties.

This embodiment is advantageous as an invention of a TFT substrate, and the above-mentioned TFT substrate 1001a corresponds to claims 1, 2, 3, 4, 5, 6 and 7.

Method for Producing a TFT Substrate According to a Third Embodiment

The method for producing a TFT substrate in this embodiment is a method in which two masks are used and the gate insulating film is patterned by an etching method at first, and corresponds to claims 10 and 13.

(a) Step Using a First Mask

Figure 13:
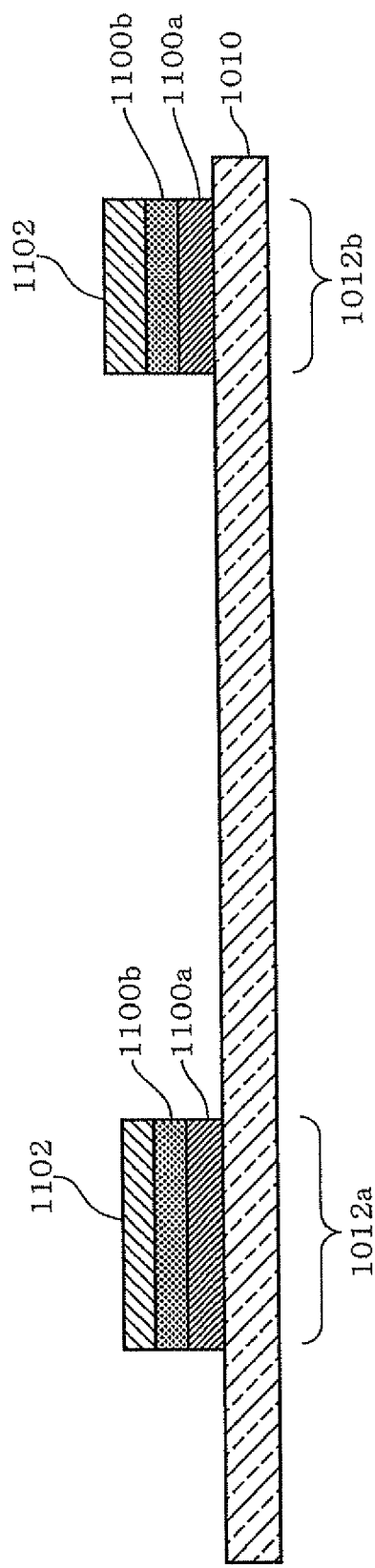
FIG. 13 is a schematic cross-sectional view for explaining the method of producing a TFT substrate according to a third embodiment of the invention, in which a gate electrode and a gate wire formed by using a first mask are shown.

FIG. 13 is a schematic cross-sectional view for explaining the method for producing a TFT substrate according to a third embodiment of the invention, in which a gate electrode and a gate wire formed by using the first mask are shown.

In FIG. 13, a gate electrode 1012a and a gate wire 1012b which are formed using a first mask are shown.

In the step using the first mask, on a light-transmissive glass substrate 1010, Al and Mo are deposited in this order by using the high-frequency sputtering method, whereby a thin metal film 1100a with a thickness of about 250 nm and a thin metal film 1100b with a thickness of about 50 nm are formed. Subsequently, a thin film 1102 with a thickness of about 100 nm is formed by using an indium oxide-zinc oxide-samarium oxide (ITSmO:$In_2O_3$:$SnO_2$:$Sm_2O_3$=about 90:7:3 wt %) sputtering target. As a result, a gate electrode and a thin film for wiring formed of the thin metal films 1100a and 1100b and the thin film 1102 are formed.

In this case, Mo is stacked on Al in order to decrease the contact resistance with the oxide thin film. If the contact resistance is negligibly low, stacking of Mo is not necessary. It is also preferable to use a metal other than Mo. Instead of Mo, Ti (titanium), Ni (nickel) or the like may preferably be used. As the gate wire, a thin metal film of Ag (silver), Cu (copper) or the like or a thin metal film of an alloy of these metals may preferably be used.

Subsequently, a resist is formed by photolithography using the first mask, and the ITSmO thin film is patterned by an etching method with an oxalic acid-based etching solution such as an aqueous oxalic acid solution, and the thin metal film is patterned by an etching method with an acid mixture. As a result, a gate electrode 1012a and a gate wire 1012b are formed in predetermined shapes. Since the ITSmO thin film can be patterned by an etching method with an acid mixture, the ITSmO thin film may be patterned by an etching method simultaneously with the thin metal film with an acid mixture.

Then, the resistance of Al is lowered by heat treatment. At this time, ITSmO may be crystallized by heat treatment. Due to this crystallization, ITSmO becomes resistant to an oxalic acid-based etching solution and an acid mixture.

The oxide conductive film such as the ITSmO film arranged on the surface of the gate wire prevents the surface of the metal used in the gate wire from being exposed when a through hole is formed in the gate insulating film to provide a gate wire pad 1017a. Due to such a configuration, a highly reliable electric connection becomes possible.

When an insulating substance such as SiNx, SiONx and $SiO_2$ is used in the gate insulating film, a through hole is preferably formed in the above-mentioned gate insulating film by reactive ion etching using CHF ($CF_4$, $CHF_3$). In this case, the above-mentioned ITSmO is effective as the protective film for the metal wire.

ITSmO is used in this embodiment. Instead of ITSmO, for example, a material obtained by incorporating a lanthanoide-based element into ITO, a material obtained by incorporating an oxide of a high-boiling-point metal such as Mo, W (tungsten) or the like can be used. Here, it is preferred that Mo, W or the like be added in an amount of about 10 at. % or less relative to all metal elements. It is more preferred that Mo, W or the like be added in an amount of about 1 to 5 at. %. If the amount exceeds about 10 at. %, the resulting material is hardly crystallized, and molten in an aqueous oxalic acid solution or in an acid mixture. The film thickness may preferably be about 20 nm to 500 nm. It is more preferred that the thickness be in the range of about 30 nm to 300 nm. If the thickness is less than about 20 nm, the film may have pinholes and cannot function as the protective film. On the other hand, if the film thickness exceeds 500 nm, film forming or etching takes a lot of time, leading to a prolonged production time. Therefore, the production thereof is neither efficient nor economically advantageous.

(b) Step Using a Second Mask

Figure 14:
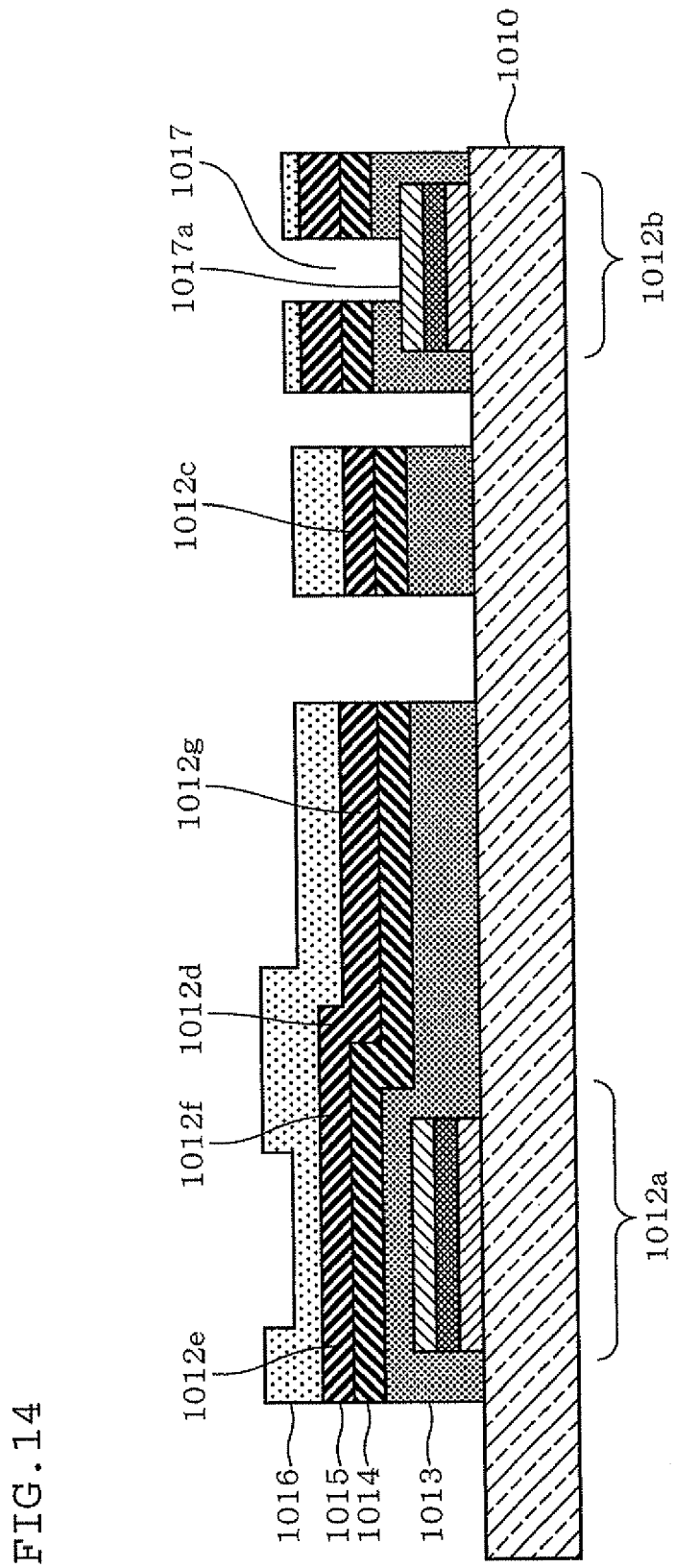
FIG. 14 is a schematic cross-sectional view for explaining the method for producing a TFT substrate according to the third embodiment of the invention, in which a source wire, a drain wire, and a pixel electrode formed by using a second mask are shown.

FIG. 14 is a schematic cross-sectional view for explaining the method for producing a TFT substrate according to a third embodiment of the invention, in which a source electrode, a drain wire and a pixel electrode which are formed by using a second mask are shown.

Figure 15:
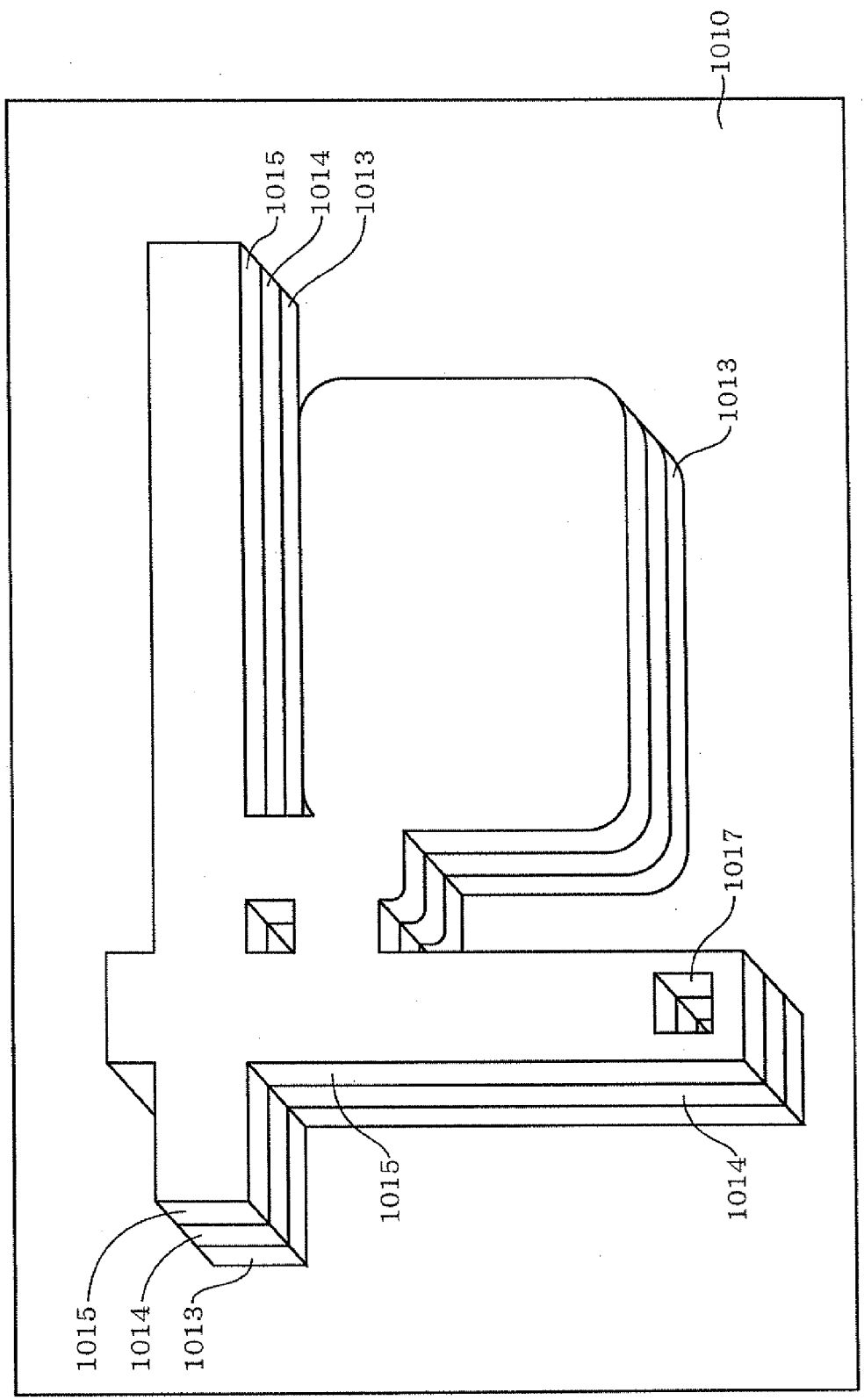
FIG. 15 is a schematic perspective view of FIG. 14.

FIG. 15 is a schematic perspective view of FIG. 14.

Subsequently, as shown in FIGS. 14 and 15, a gate insulating film 1013, which is a silicon nitride (SiNx) film, is deposited in a thickness of about 300 nm by the glow discharge CVD method. An $SiH_4$—$NH_3$—$N_2$-based mixed gas is used as a discharge gas.

Then, an n-type oxide semiconductor layer 1014 with a thickness of about 100 nm is formed by the high-frequency sputtering method using a tin oxide-zinc oxide ($SnO_2$:ZnO=about 30:70 wt %) target in an atmosphere of about 15% oxygen and about 85% argon with a substrate temperature of about 200° C.

Subsequently, an oxide conductor layer 1015 with a thickness of about 150 nm is formed by the high-frequency sputtering method using an indium oxide-tin oxide (IZO:$In_2O_3$:ZnO=about 90:10 wt %) target in an atmosphere of about 1% oxygen and about 99% argon.

Here, the n-type oxide semiconductor layer 1014 is a preferable example of the "first oxide layer" in claims, and the oxide conductor layer 1015 is a preferable example of the "second oxide layer" in claims.

Then, a resist 1016 is stacked on the oxide conductor layer 1015. Subsequently, the resist 1016 is formed in a predetermined shape by using the second mask by half-tone exposure.

Then, the oxide conductor layer 1015 formed of indium oxide-zinc oxide is patterned by an etching method with an acid mixture. Subsequently, the n-type oxide semiconductor layer 1014 formed of tin oxide-zinc oxide is patterned by an etching method with an aqueous oxalic acid solution. As a result, a source wire 1012c, a drain wire 1012d, part of a source electrode 1012e, part of a drain electrode 1012f and a pixel electrode 1012g are formed.

Then, the gate insulating film on a gate wire pad 1017a is removed by reactive ion etching using CHF (e.g. $CF_4$, $CHF_3$) to expose the ITSmO film, whereby a gate wire pad 1017a is formed.

In FIG. 15, for the convenience of understanding, the resist 1016 on the oxide conductor layer 1015 is omitted. As shown in FIGS. 14 and 15, a gate wire withdrawal hole 1017 is formed.

Figure 16:
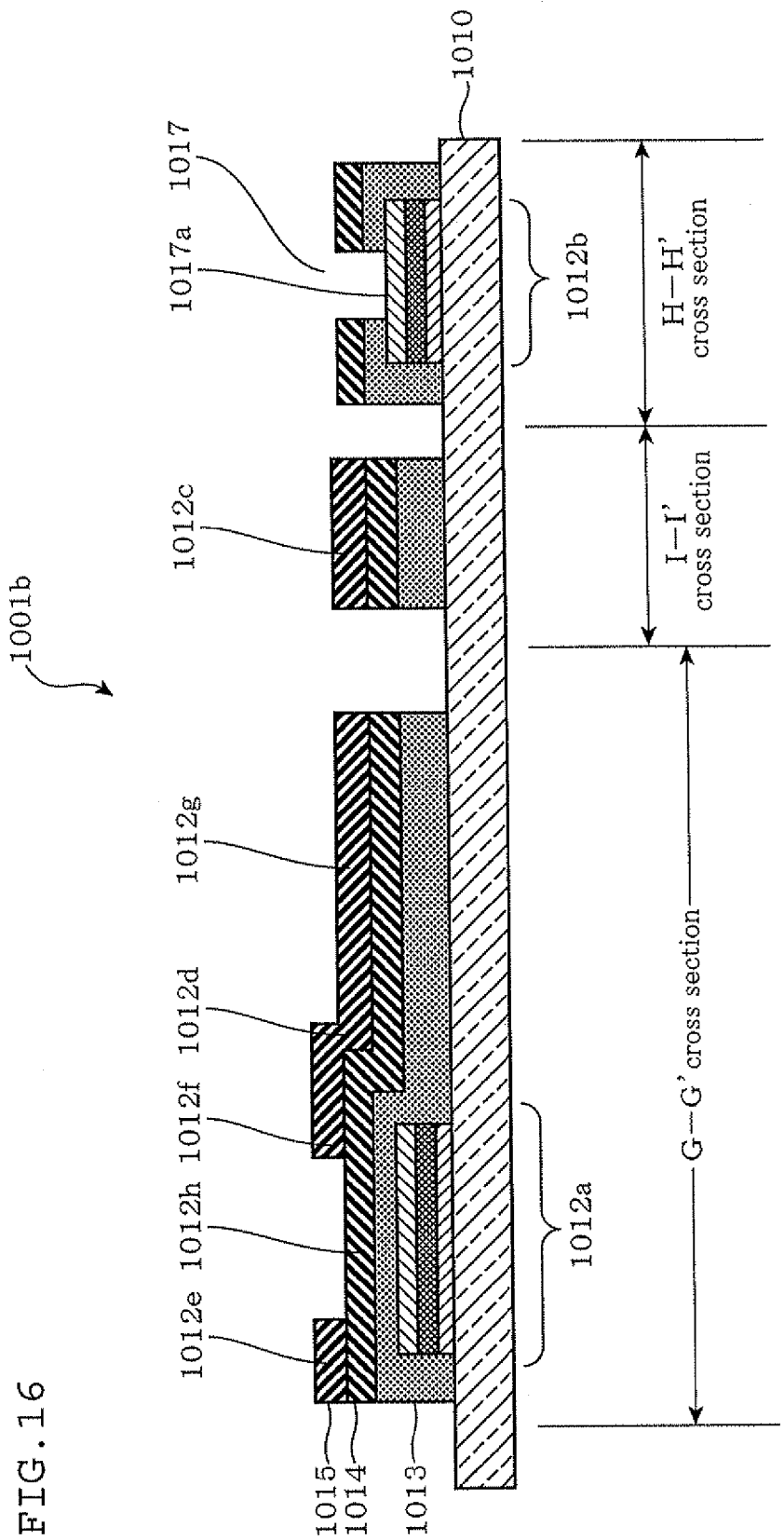
FIG. 16 is a schematic cross-sectional view for explaining the method for producing a TFT substrate according to the third embodiment of the invention, in which a source electrode and a drain electrode formed by using a second mask are shown.

FIG. 16 is a schematic cross-sectional view for explaining the method for producing a TFT substrate according to a third embodiment of the invention, in which a source electrode and a drain electrode formed by using the second mask are shown.

Figure 17:
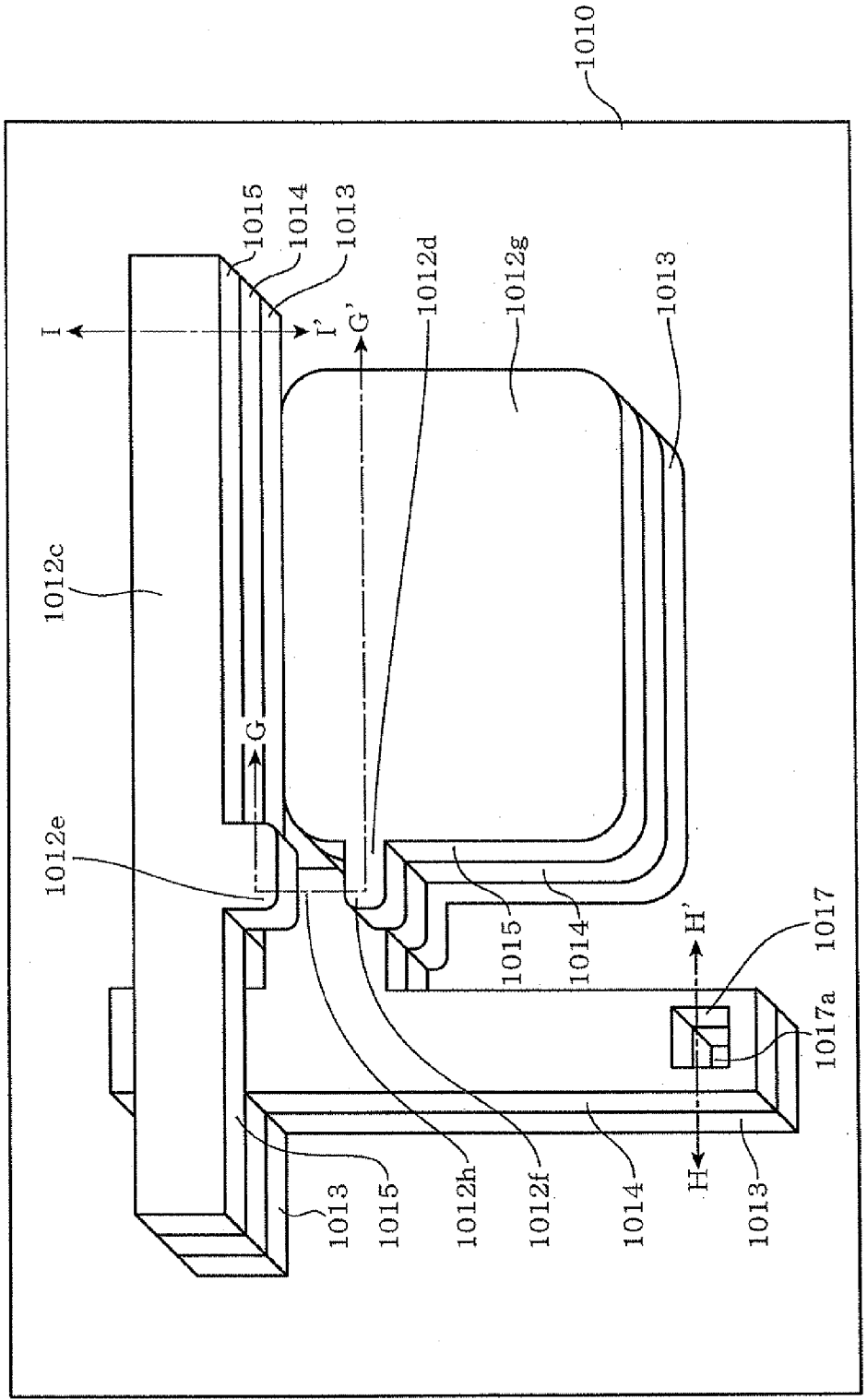
FIG. 17 is a schematic perspective view of FIG. 16.

FIG. 17 is a schematic cross-sectional view of FIG. 16.

Then, a resist 1016 (not shown) is removed partly through an ashing process and reformed in a predetermined shape.

Next, as shown in FIGS. 16 and 17, the oxide conductor layer 15 is patterned by an etching method with an acid mixture, whereby a channel part 1012h, a source electrode 1012e and a drain electrode 1012f are formed. In this case, the unnecessary oxide conductor layer 1015 on the gate wire 1012b is also etched.

The above-mentioned treatment is a preferable example of forming a channel part, a source electrode and a drain electrode by selectively patterning the n-type oxide semiconductor layer in claims by an etching method.

Then, the resist 1016 is removed to obtain a desired TFT substrate 1001b.

FIG. 16 is a cross-sectional view obtained by combining cross sections of parts indicated by line G-G', line H-H', line I-I' shown in FIG. 17 into a single cross-sectional view.

In this embodiment, the n-type oxide semiconductor layer 1014 is not crystallized even when film formation is performed at about 200° C. However, the tin oxide-zinc oxide ($SnO_2$:ZnO=about 30:70 wt %) thin film used is patterned by an etching method with an aqueous oxalic acid solution, but not with an acid mixture. Therefore, the tin oxide-zinc oxide thin film is not patterned by an etching method with chemicals used for etching the oxide conductor layer 1015 which is present above the tin oxide-zinc oxide thin film.

It is preferred that the oxide conductor layer 1015 be not crystallized. The inventors of the invention have confirmed that the oxide conductor layer 1015 is not crystallized even heated at about 350° C. Due to the use of such oxide conductor layer 1015, patterning by an etching method with an acid mixture becomes possible. In other words, the oxide conductor layer 1015 can be patterned by an etching method without damaging the n-type oxide semiconductor layer 1014.

In the tin oxide-zinc oxide ($SnO_2$:ZnO=about 30:70 wt %) target used for forming the n-type oxide semiconductor layer 1014, it is preferred that zinc oxide be added in an amount of 50 to 80 wt %. It is more preferred that zinc oxide be added in an amount of about 60 to 75 wt %. If the amount of the zinc oxide is less than 50 wt %, carrier density may not be lowered. On the other hand, if the amount exceeds 80 wt %, carrier density may not be lowered or resistance to an acid mixture may be deteriorated.

Measurement of an AC hall effect of the above-mentioned n-type oxide semiconductor layer 1014 was conducted ("RESITEST", manufactured by Toyo Technica Inc.). The results of the measurement were as follows: carrier density: $10^{+14}/cm^3$, mobility: 35 $cm^2$/V·sec.

Measurement of an AC hall effect was also conducted similarly for the oxide conductor layer 1015. The results of the measurement were as follows: carrier density: $10^{+20}/cm^3$, mobility: 42 $cm^2$/V·sec.

This embodiment is advantageous as an invention of a TFT substrate, and the above-mentioned TFT substrate 1001b corresponds to claims 1, 2, 6 and 7.

Method for Producing a TFT Substrate According to a Fourth Embodiment

The method for producing a TFT substrate in this embodiment is a method in which three masks are used, and corresponds to claims 10, 11, 12 and 13. According to the method for producing a TFT substrate of this embodiment, an auxiliary electrode and an auxiliary wire are formed by using a third mask on a TFT substrate in the above-mentioned third embodiment.

Figure 18:
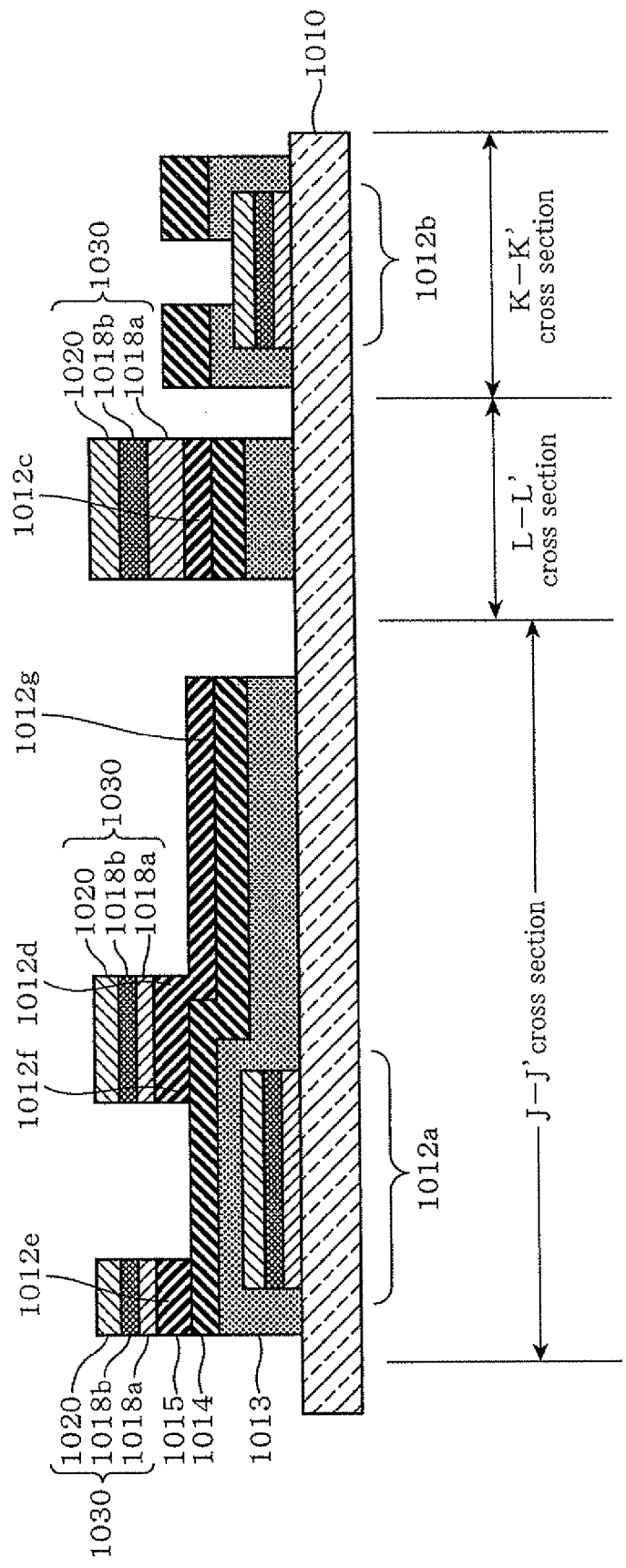
FIG. 18 is a schematic cross-sectional view for explaining the method of producing a TFT substrate according to a fourth embodiment of the invention, in which an auxiliary electrode and an auxiliary wire are formed.

FIG. 18 is a schematic cross-sectional view for explaining the method for producing a TFT substrate according to a fourth embodiment of the invention, in which an auxiliary electrode and an auxiliary wire are formed.

Figure 19:
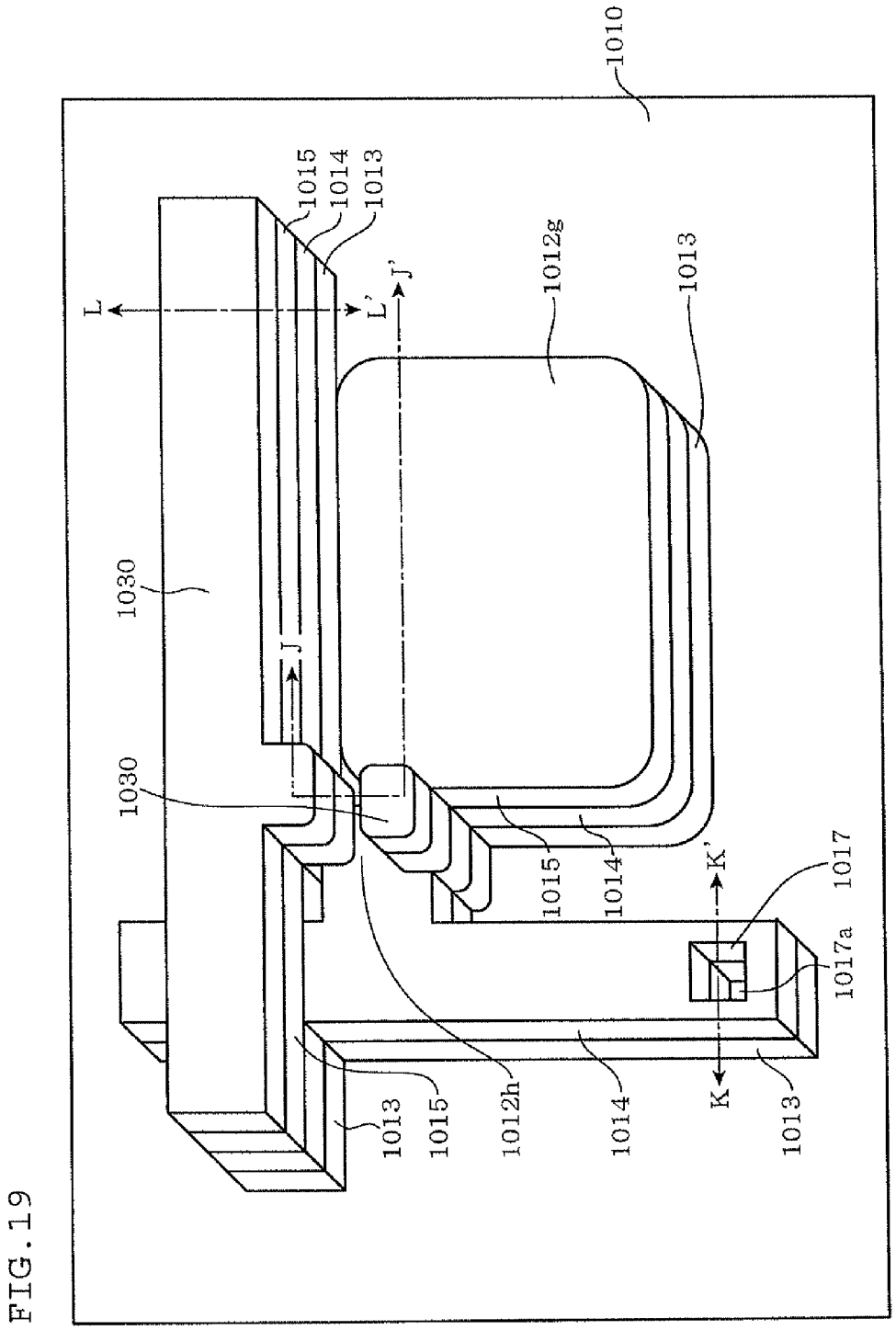
FIG. 19 is a schematic perspective view of FIG. 18.

FIG. 19 is a schematic perspective view of FIG. 18.

In the step using the third mask, on the TFT substrate formed in the above-mentioned third embodiment, Mo and Al are deposited in this order by using the high-frequency sputtering method, whereby a thin metal film 1018a with a thickness of about 50 nm and a thin metal film 1018b with a thickness of about 150 nm are formed. Subsequently, a transparent conductive layer 1020 with a thickness of about 50 nm is formed on the above-mentioned thin metal film 1018b by the high-frequency sputtering method using an indium oxide-zinc oxide ($In_2O_3$:ZnO=about 90:10 wt %) target in an atmosphere of about 1% oxygen and about 99% argon. This transparent conductive layer 1020 serves as a protective layer for the thin metal film 1018a formed of Mo and the thin metal film 1018b formed of Al. In FIGS. 18 and 19, the thin metal films 1018a, 1018b and the transparent conductive layer 1020 are all denoted by 1030.

Next, a resist (not shown) is applied thereon. The resist is formed in a predetermined shape by using the third mask. Then, the transparent conductive layer 1020 formed of indium oxide-zinc oxide is patterned by an etching method with an acid mixture. Next, Al and Mo are patterned by an etching method, whereby a source auxiliary electrode, a drain auxiliary electrode, a source auxiliary electrode and a drain auxiliary wire formed of the thin metal films 1018a and 1018b are formed. Then, the resist is peeled off, and the glass substrate 1010 is cleaned. As a result, a TFT substrate 1001c on which an auxiliary electrode and an auxiliary wire are formed can be obtained. The above-mentioned treatment is a preferable example of forming an auxiliary wire or an auxiliary electrode in claims.

FIG. 18 is a cross-sectional view obtained by combining cross sections of parts indicated by line J-J', line K-K', line L-L' shown in FIG. 19 into a single cross-sectional view.

As mentioned above, an auxiliary electrode and an auxiliary wire are formed by using the third mask.

This embodiment is advantageous as an invention of a TFT substrate, and the above-mentioned TFT substrate 1001c corresponds to claims 1, 2, 4, 6 and 7.

As mentioned above, according to claims 1 to 13 of the invention, production steps can be reduced, treatment time can be shortened, and production yield can be improved since the number of masks used in production decreases in comparison to the conventional one. In addition, according to the invention, production cost is also expected to be decreased due to the reduction of production steps.

Method for Producing a TFT Substrate According to a Fifth Embodiment

The method for producing a TFT substrate in this embodiment is a method in which three masks are used, and corresponds to claim 21.

Figure 20:
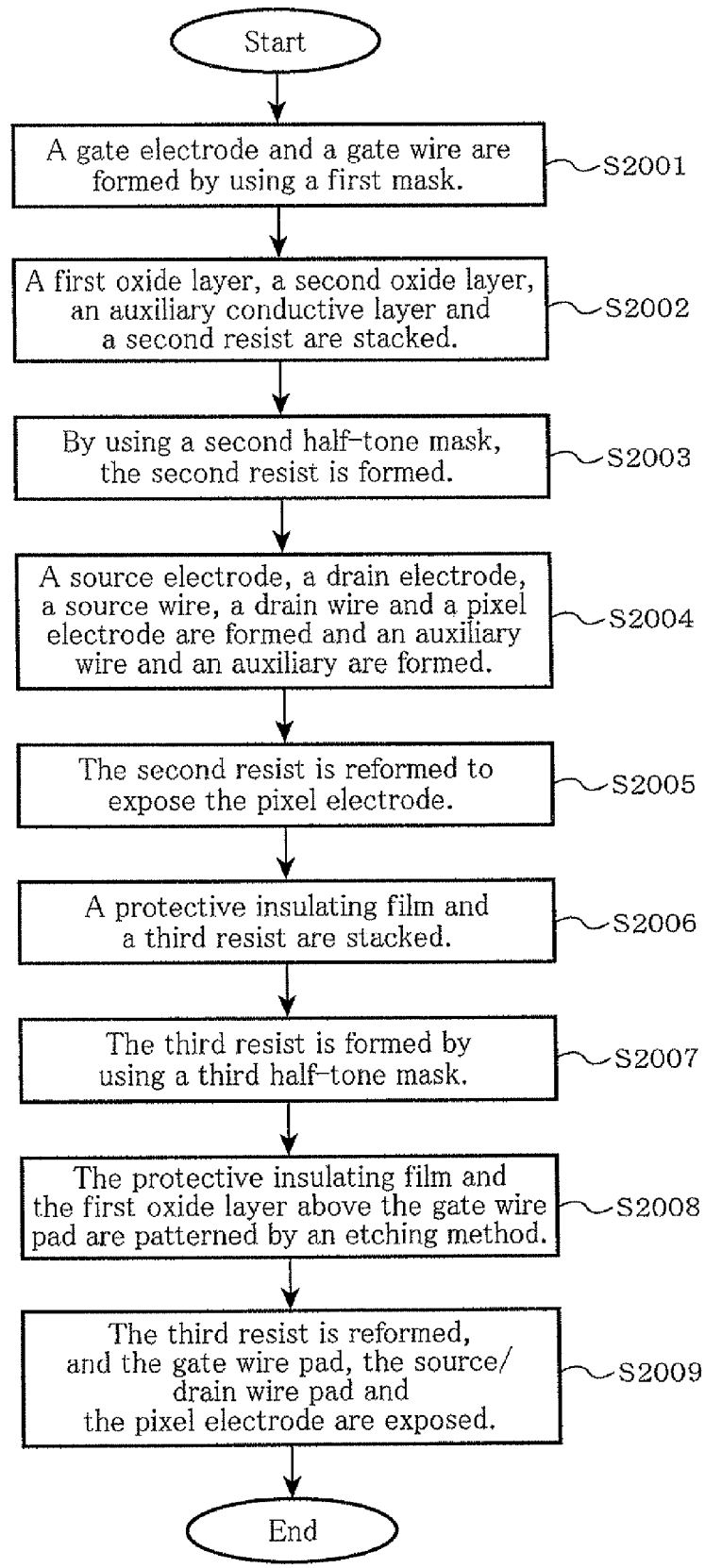
FIG. 20 is a schematic flow chart for explaining the method for producing a TFT substrate according to a fifth embodiment of the invention.

FIG. 20 is a schematic flow chart for explaining the method for producing a TFT substrate according to a fifth embodiment of the invention.

As shown in FIG. 20, a gate electrode 2021 and a gate wire 2022 are formed on a substrate 2010 by using a first mask 2022 (Step S2001).

Next, treatment using the first mask 2022 will be explained below referring to the drawing.

(Treatment Using a First Mask)

Figure 21:
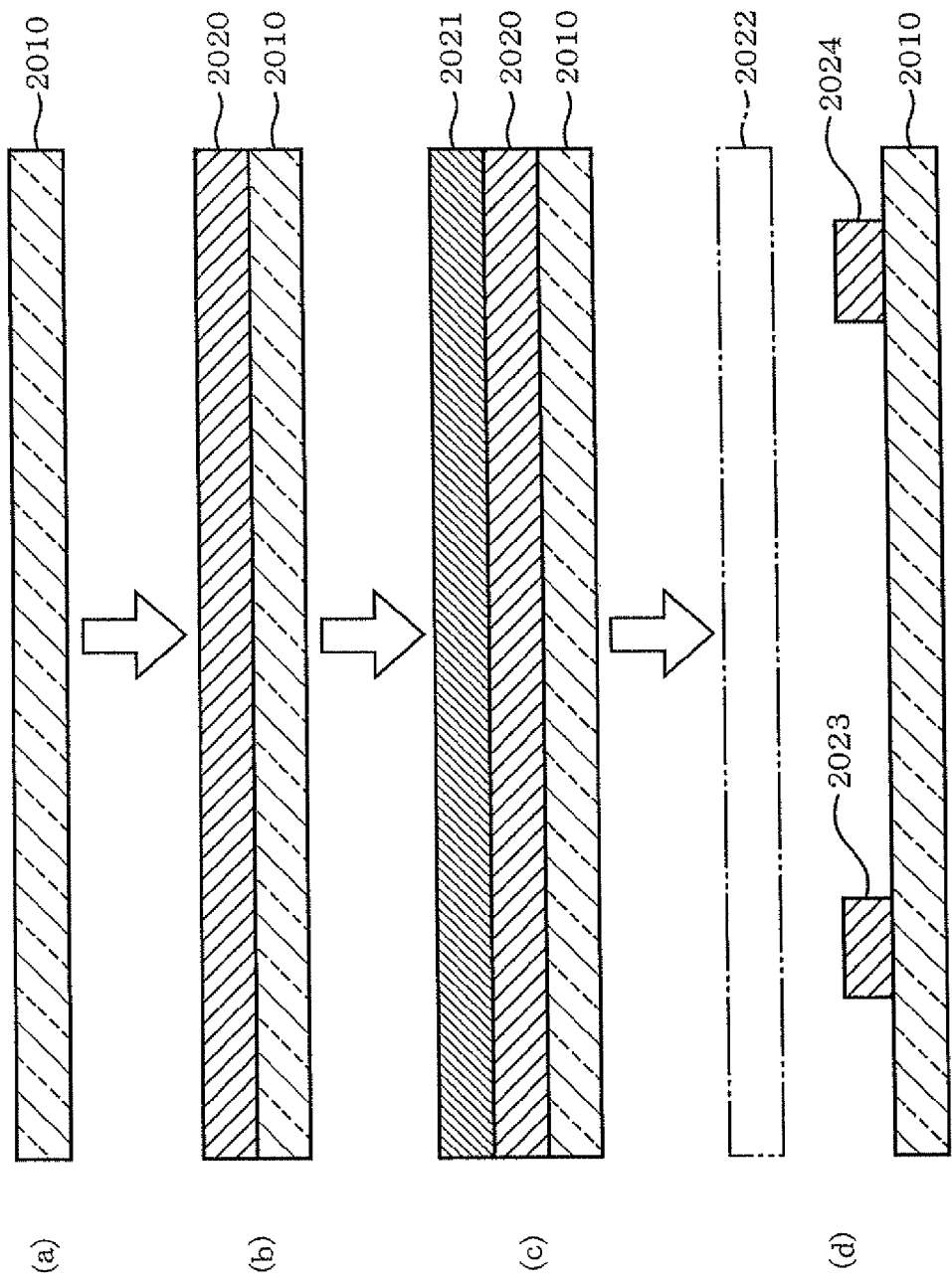
FIG. 21 is a schematic view for explaining treatment using a first mask in the method for producing a TFT substrate according to the fifth embodiment of the invention, in which (a) is a cross-sectional view of a glass substrate before the treatment, (b) is a cross-sectional view after formation of a metal film, (c) is a cross-sectional view after application of a resist, and (d) is a cross-sectional view after formation of a gate electrode and a gate wire as a result of exposure, development, first etching and peeling off of the resist.

FIG. 21 is a schematic view for explaining treatment using the first mask in the method for producing a TFT substrate according to the fifth embodiment of the invention. (a) is a cross-sectional of the glass substrate before the treatment. (b) is a cross-sectional view after formation of a metal film. (c) is a cross-sectional view after application of a resist. (d) is a cross-sectional view after formation of a gate electrode and a gate wire as result of exposure, development, first etching and peeling off of the resist.

In FIG. 21(a), a light-transmissive glass substrate 2010 is provided at first.

Then, as shown in FIG. 21(b), a metal film is formed on the glass substrate 2010, and a thin film for gate electrode/wire (a thin film for a gate electrode and a gate wire) 2020 is formed.

In this embodiment, on the glass substrate 2010, Al (aluminum) and Mo (molybdenum) are stacked in this order by the high frequency sputtering method. As a result, a thin metal film with a thickness of about 250 nm and a thin metal film with a thickness of about 50 nm are formed. Subsequently, a thin film with a thickness of about 100 nm is formed by using an indium oxide-tin oxide-samarium oxide (ITSmO:$In_2O_3$: $SnO_2$:$Sm_2O_3$=about 90:7:3 wt %) sputtering target, whereby the thin film for a gate electrode/wire 2020 formed of Al/Mo/ITSmO is formed.

Then, as shown in FIG. 21(c), a first resist 2021 is applied on the thin film for a gate electrode/wire 2020.

Figure 22:
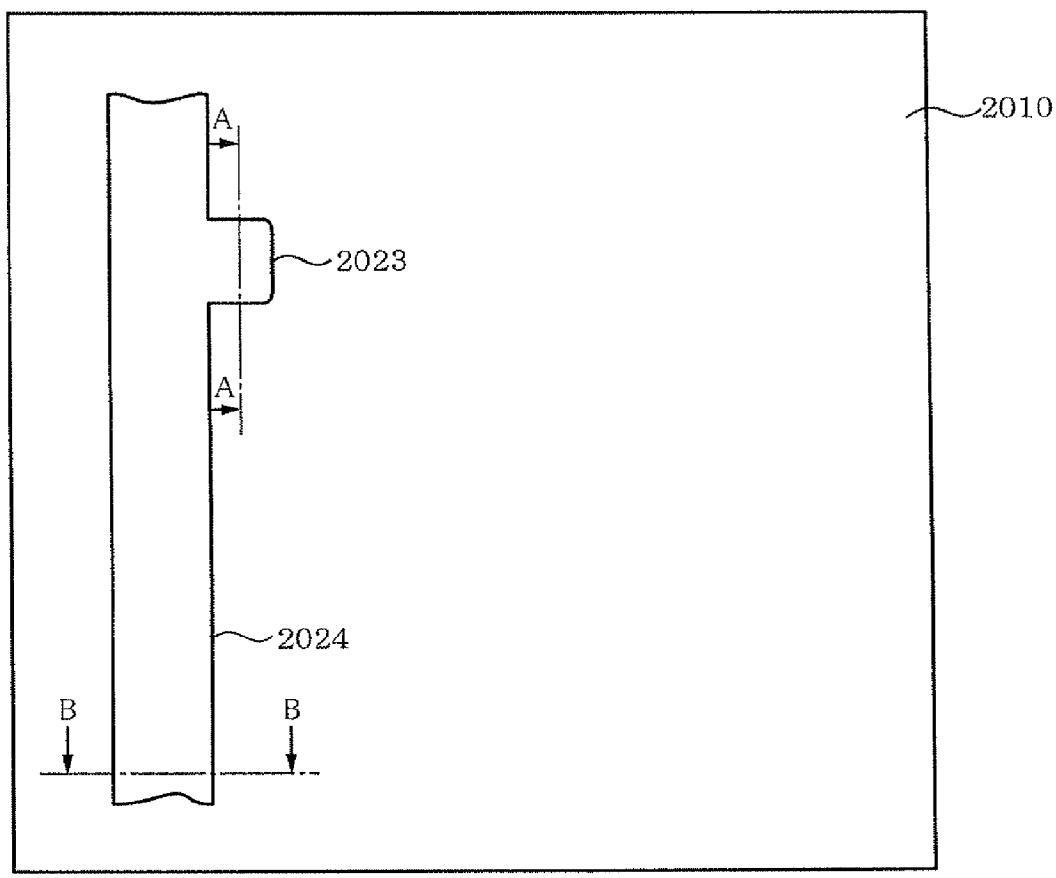
FIG. 22 is a schematic plan view of an essential part of the glass substrate on which a gate electrode and a gate wire are formed in the method for producing a TFT substrate according to the fifth embodiment of the invention.

Next, as shown in FIG. 21(d), a resist (not shown) is formed in a predetermined shape by photolithography using the first mask 2022. Then, the ITSmO thin film is patterned by an etching method with an aqueous oxalic acid solution. The thin metal film is patterned by an etching method with an acid mixture (generally called "PAN"), whereby a gate electrode 2023 and a gate wire 2024 shown in FIG. 21(d) are formed in predetermined shapes (see FIG. 22). The gate electrode 2023 and the gate wire 2024 are cross-sectional views taken along lines A-A and B-B in FIG. 22. Here, ITSmO can be patterned by an etching method with an acid mixture, or may be patterned simultaneously with the thin metal film by an etching method using the above-mentioned acid mixture.

After the formation of the thin film for a gate electrode/wire 2020, the thin film may be subjected to heat treatment to decrease the resistance of Al as well as to crystallize ITSmO. That is, since crystallized ITSmO becomes insoluble in an oxalic acid-based etching solution or an acid mixture, the crystallized ITSmO can protect the Al/Mo layer.

Further, by forming an oxide conductive film such as an ITSmO film on the surface of the gate wire 2024, the metal used in the gate wire 2024 is not exposed when forming a gate wire pad 2025. As a result, a highly reliable connection becomes possible. That is, when a through hole for forming the gate wire pad 2025 is formed in a gate insulating film 2030, an insulating substance such as SiNx, SiONx and $SiO_2$ is used in the gate insulating film 2030, and a through hole is formed by reactive ion etching using CHF (e.g. $CF_4$, $CHF_3$). In this case, the oxide conductive film such as ITSmO is effective as the protective film for the thin metal film (Al/Mo layer).

Then, as shown in FIG. 20, on the glass substrate 2010, the gate electrode 2023 and the gate wire 2024, a gate insulating film 2030, an n-type oxide semiconductor layer 2040 as the first oxide layer, an oxide conductor layer 2050 as the second oxide layer, a metal layer 2060 as the auxiliary conductive layer and a second resist 2061 are stacked in this order (Step S2002), and the second resist 2061 is formed in a predetermined shape by half-tone exposure using a second half-tone mask 2062 (Step S2003).

Subsequently, treatment using the second half-tone mask 2062 will be explained below referring to the drawing.

(Treatment Using a Second Half-Tone Mask)

Figure 23:
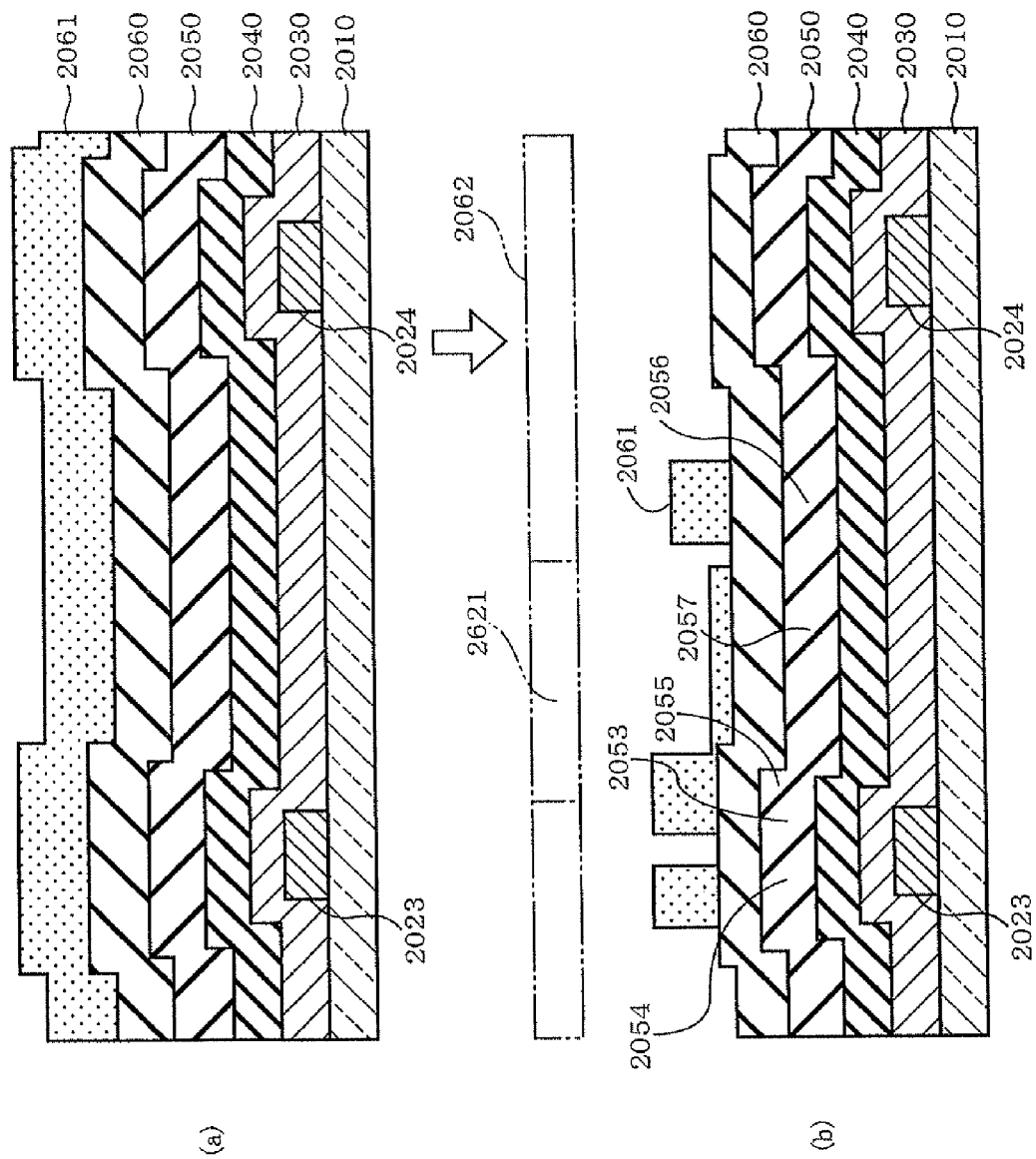
FIG. 23 is a schematic view for explaining treatment using a second mask in the method for producing a TFT substrate according to the fifth embodiment of the invention, in which (a) is a cross-sectional view after formation of a gate insulating film, an n-type oxide semiconductor layer, an oxide conductor layer, a metal layer, and application of a resist, and (b) is a cross-sectional view after half-tone exposure and development.

FIG. 23 is a schematic view for explaining treatment using a second half-tone mask in the method for producing a TFT substrate according to a fifth embodiment of the invention. (a) is a cross-sectional view after formation of a gate insulating film, an n-type oxide semiconductor film, an oxide conductive film, a metal layer, and application of a resist. (b) is a cross-sectional view after half-tone exposure and development.

In FIG. 23(a), a gate insulating film 2030, which is a silicon nitride (SiNx) film, is deposited in a thickness of about 300 nm by the glow discharge CVD (Chemical Vapor Deposition) method on the glass substrate 2010, the gate electrode 2023 and the gate wire 2024. In this embodiment, an $SiH_4$—$NH_3$—$N_2$-based mixed gas is used as a discharge gas.

Then, on the gate insulating film 2030, an n-type oxide semiconductor layer 2040 with a thickness of about 100 nm is formed by using a tin oxide-zinc oxide ($SnO_2$:ZnO=about 65:35 wt %) target by the high-frequency sputtering method in an atmosphere of about 15% oxygen and about 85% argon with a substrate temperature of about 200° C. The n-type oxide semiconductor layer 2040 had an energy gap of about 3.6 eV.

Subsequently, an oxide conductor layer 2050 with a thickness of about 150 nm is formed on the n-type oxide semiconductor layer 2040 by using an indium oxide-tin-oxide-zinc oxide ($In_2O_3$:$SnO_2$:ZnO=about 60:20:20 wt %) target by the high-frequency sputtering method in an atmosphere of about 1% oxygen and about 99% argon. The oxide conductor layer 2050 had an energy gap of about 3.2 eV.

On the oxide conductor layer 2050, a metal layer (Mo/Al/Mo layer) 2060, which serves as an auxiliary conductive layer, is formed at room temperature such that it has a thickness of about 350 nm (the thicknesses of the Mo layer, the Al layer and the Mo layer are about 50 nm, about 150 nm and about 50 nm, respectively). Then, on the metal layer 2060, the second resist 2061 is stacked (Step S2002).

In the Step S2009 mentioned later, when a protective insulating film 2070 on a drain wire pad 2058 is patterned by a dry etching method with an etching gas (CHF ($CF_4$, $CHF_3$ gas, or the like)), the metal layer 2060 is exposed. Therefore, a thin film of IZO ($In_2O_3$:ZnO=about 90:10 wt %) may be formed on the surface of the Mo/Al/Mo layer. This thin film has a thickness of about 10 to 500 nm, preferably about 20 to 100 nm. The reason therefor is as follows. If the thickness is less than about 10 nm, pinholes may be formed, and if the thickness exceeds about 500 nm, film formation or patterning by an etching method takes a lot of time.

Then, as shown in FIG. 23(b), a second resist 2061 is formed in a predetermined shape by using the second half-tone mask 2062 by half-tone exposure (Step S2003 in FIG. 20). The second resist 2061 covers a source electrode 2053, a drain electrode 2054, a source wire 2055, a drain wire 2056 and a pixel electrode 2057, and part of the second resist 2061 covering the pixel electrode 2057 is rendered thinner than other parts due to a half-tone mask part 2621.

The metal layer 2060 is not limited to the Mo/Al/Mo stacked film, and a stacked thin metal film such as a Ti/Al/Ti film may also be used. Also, a single layer or a multilayer stacked film of a metal such as Al, Mo, Ag and Cu or alloys thereof may also be used.

Figure 24:
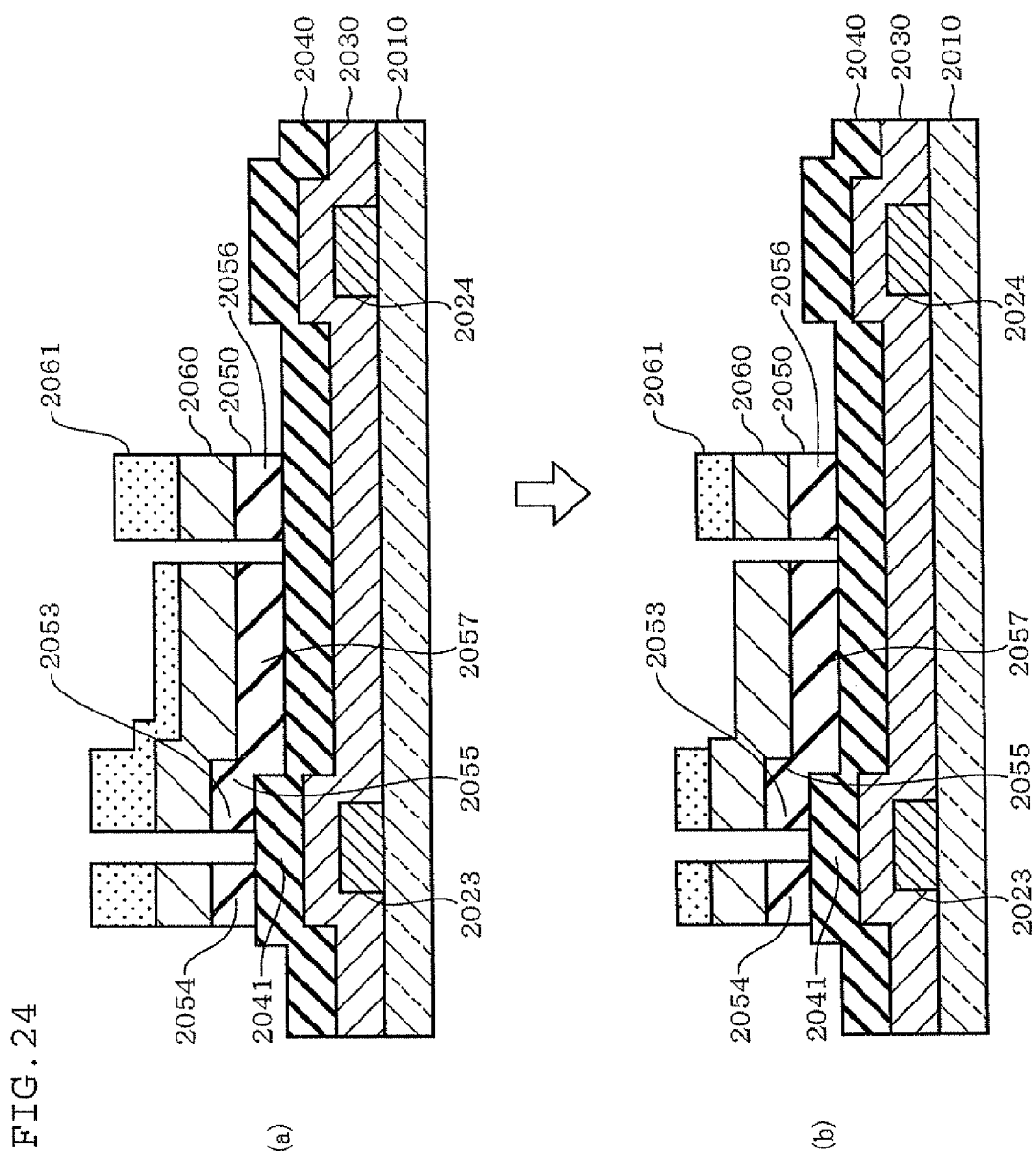
FIG. 24 is a schematic view for explaining treatment using a second half-tone mask in the method for producing a TFT substrate according to the fifth embodiment of the invention, in which (a) is a cross-sectional view after second etching, and (b) is a cross-sectional view after reformation of a second resist.

FIG. 24 is a schematic view for explaining treatment using the second half-tone mask in the method for producing a TFT substrate according to a fifth embodiment of the invention. (a) is a cross-sectional view after second etching. (b) is a cross-sectional view after reformation of a second resist.

In FIG. 24(a), the second etching is conducted for the metal layer 2060 and the oxide conductor layer 2050 by using the second resist 2061, whereby a source electrode 2053, a drain electrode 2054, a source wire 2055, a drain wire 2056 and a pixel electrode 2057 are formed as desired, and an auxiliary wire and an auxiliary electrode which will be mentioned later are formed (Step S2004 in FIG. 20). The Mo/Al/Mo layer constituting the metal layer 2060 is patterned by an etching method with an acid mixture, and the n-type oxide semiconductor layer 2040 is patterned by an etching method with an aqueous oxalic acid solution.

As a result of the above-mentioned etching, a channel part 2041 is formed in the n-type oxide semiconductor layer above the gate electrode 2023. As a result, the TFT substrate 2001 is called a channel etch type TFT.

The tin oxide-zinc oxide ($SnO_2$:ZnO=about 65:35 wt %) thin film used as the n-type oxide semiconductor layer 2040 in this embodiment is not crystallized even when film formation is conducted at about 200° C. This n-type oxide semiconductor layer 2040 is not etched with an aqueous oxalic acid solution or an acid mixture even if it is not crystallized. Therefore, the n-type oxide semiconductor layer 2040 is not etched with chemicals used for etching the oxide conductor layer 2050 and the metal layer 2060 which are present above the n-type oxide semiconductor layer 2040.

Further, the indium oxide-tin oxide-zinc oxide ($In_2O_3$:$SnO_2$:ZnO=about 60:20:20 wt %) thin film used as the oxide conductor layer 2050 in this embodiment is not crystallized even heated at about 350° C. It is preferred that the oxide conductor layer 2050 be not crystallized. Without crystallization, etching with an aqueous oxalic acid solution becomes possible. Due to the above-mentioned composition, the oxide conductor layer 2050 is not crystallized with an acid mixture. That is, it is important that the oxide conductor layer 2050 has selective etching properties, i.e., has resistance to an etching solution for the metal layer 2060, and can be etched with an etching solution which does not affect the metal layer 2060.

In the tin oxide-zinc oxide ($SnO_2$:ZnO=about 65:35 wt %) target used for the formation of the n-type oxide semiconductor layer 2040, zinc oxide may be added preferably in an amount of about 5 to 70 wt %, more preferably about 10 to 50 wt %. The reason therefor is as follows. If the amount of zinc oxide is less than about 5 wt %, carrier density may not be lowered, and if the amount of zinc oxide exceeds about 70 wt %, carrier density may not be lowered or resistance to an aqueous oxalic acid solution or to an acid mixture may be deteriorated.

Measurement of an AC hall effect of the above-mentioned n-type oxide semiconductor layer was conducted ("RESITEST", manufactured by Toyo Technica Inc.). The results of the measurement were as follows: carrier density: $10^{+15}/cm^3$, mobility: 5 $cm^2$/V·sec. Measurement of an AC hall effect was also conducted for the oxide conductor layer. The results of the measurement were as follows: carrier density: $10^{+20}/cm^3$, mobility: 22 $cm^2$/V·sec.

As shown in FIG. 20, the above-mentioned second resist 2061 is reformed to expose the pixel electrode 2057 (Step S2005). That is, first, as shown in FIG. 24(b), part of the second resist 2061 above the pixel electrode 2057 which is rendered thinner by half-tone exposure is removed through an ashing process, whereby the second resist 2061 is reformed.

Then, treatment for exposing the pixel electrode 2057 will be explained below referring to the drawing.

Figure 25:
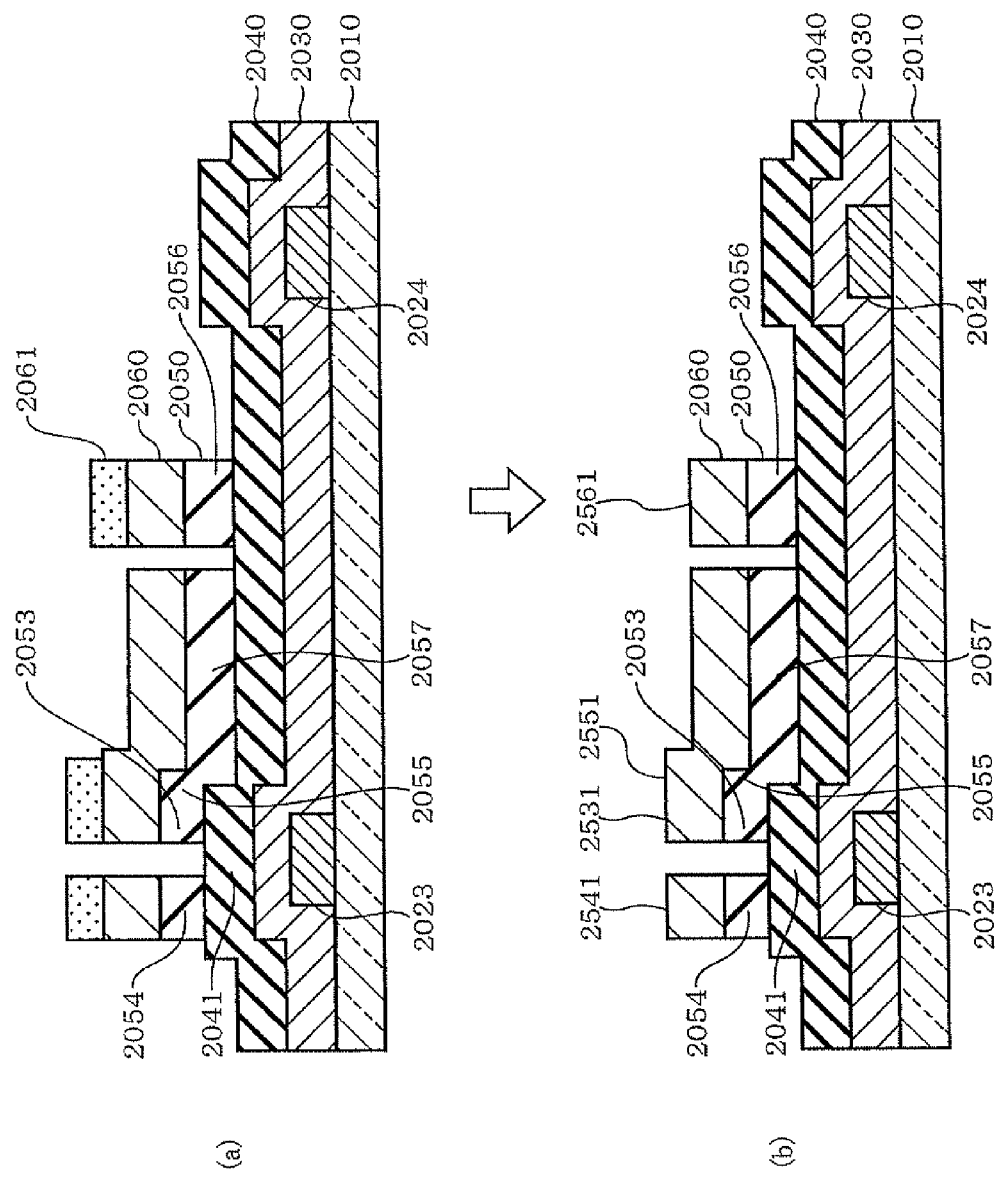
FIG. 25 is a schematic view for explaining treatment using a second half-tone mask in the method for producing a TFT substrate according to the fifth embodiment of the invention, in which (a) is a cross-sectional view after third etching, and (b) is a cross-sectional view after peeling off of a second resist.

FIG. 25 is a schematic view for explaining treatment using a second half-tone mask in the method for producing a TFT substrate according to a fifth embodiment of the invention. (a) is a cross-sectional after third etching. (b) is a cross-sectional view after peeling off of the second resist.

In FIG. 25(a), by using the reformed second resist 2061, the metal layer 2060 above the pixel electrode 2057 is patterned by an etching method with an acid mixture containing nitric acid to expose the pixel electrode 2057, whereby a transparent pixel electrode is formed.

Figure 26:
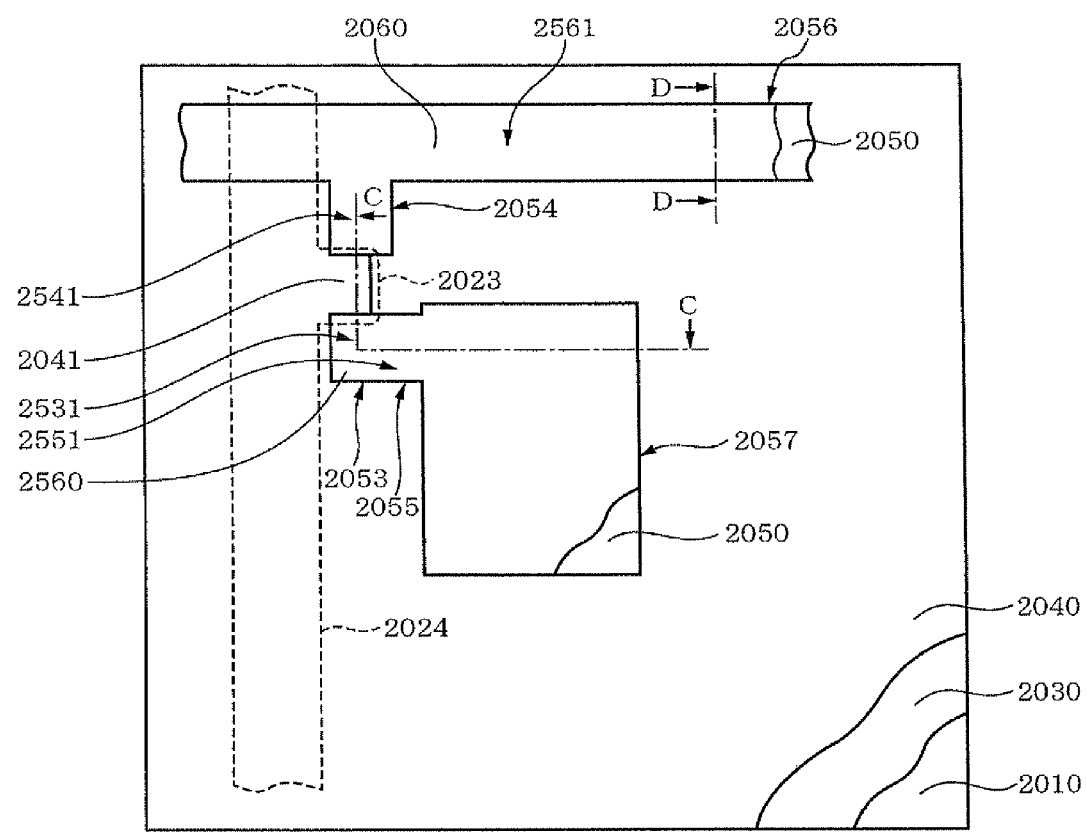
FIG. 26 is a schematic plan view of an essential part of the glass substrate on which a drain electrode, a source electrode, a drain wire, a source wire and a pixel electrode are formed in the method for producing a TFT substrate according to the fifth embodiment of the invention.

Then, the reformed second resist 2061 is removed through an ashing process completely, an auxiliary conductive layer (auxiliary wire and auxiliary electrode) formed of the metal layer 2060, which is formed on a source electrode 2053, a drain electrode 2054, a source wire 2055 and a drain wire 2056, is exposed. That is, an auxiliary electrode for the source electrode 2531, an auxiliary electrode for the drain electrode 2541, an auxiliary wire for the source wire 2551 and an auxiliary wire for the drain wire 2561, each being formed of the metal layer 2060, are exposed (see FIG. 26). The drain electrode 2054, the channel part 2041, the source electrode 2053, the source wire 2055 and the pixel electrode 2057 shown in FIG. 25(b) are cross-sectional views taken along line C-C in FIG. 26. The drain wire 2056 shown in FIG. 25(b) is a cross-sectional view taken along line D-D in FIG. 26.

As shown in FIG. 20, a protective insulating film 2070 and a third resist 2071 are stacked in this order on the n-type oxide semiconductor layer 2040, the pixel electrode 2057, the auxiliary wire for the source wire 2551, the auxiliary wire for the drain wire 2561, the auxiliary electrode for the source electrode 2531 and the auxiliary electrode for the drain electrode 2541 (Step S2006), and the third resist 2071 is formed in a predetermined shape by using a third half-tone mask 2072 by half-tone exposure (Step S2007).

Next, treatment using the third half-tone mask 2072 will be explained.

(Treatment Using a Third Half-Tone Mask)

Figure 27:
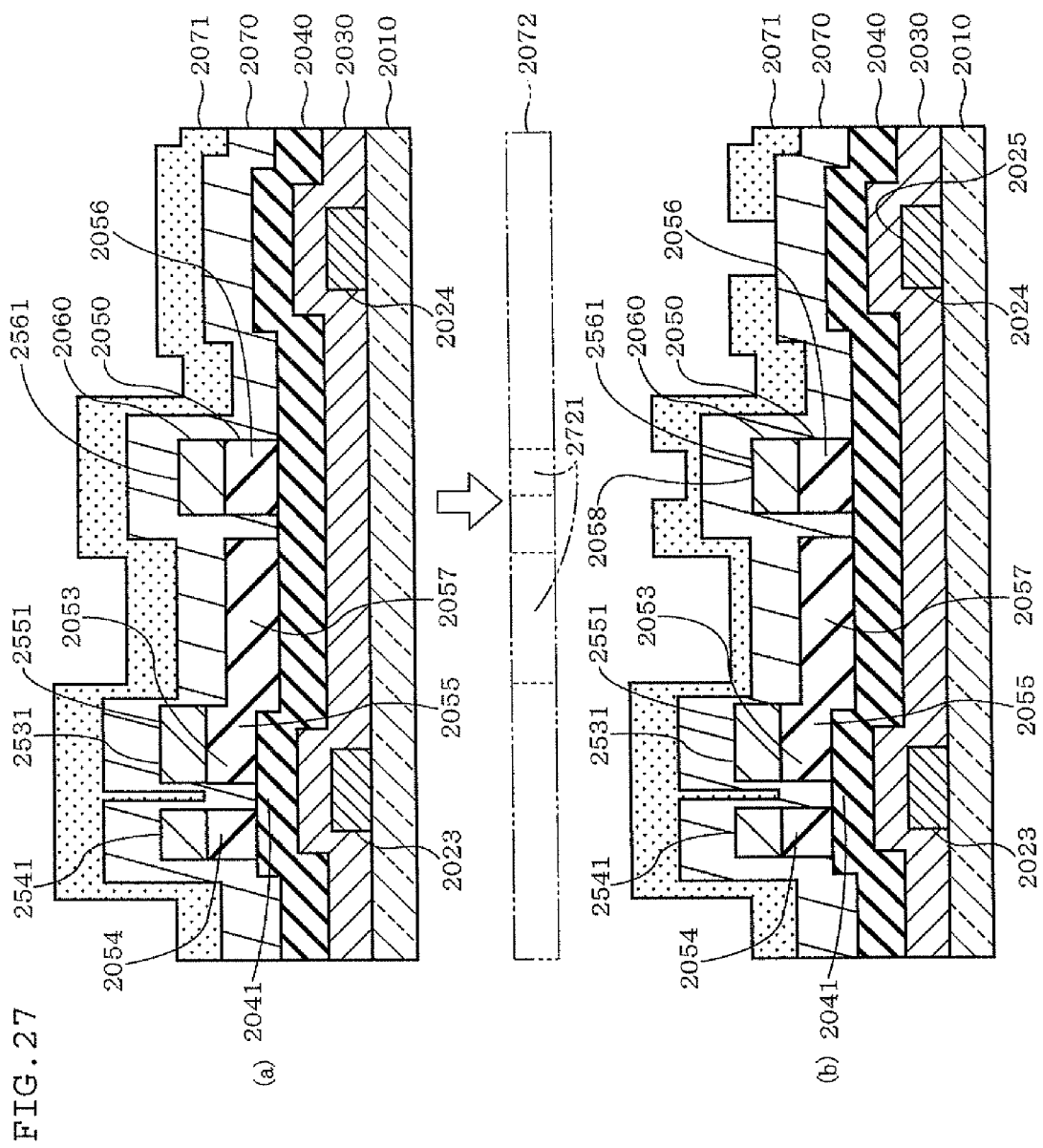
FIG. 27 is a schematic view for explaining treatment using a third half-tone mask in the method for producing a TFT substrate according to the fifth embodiment of the invention, in which (a) is a cross-sectional view after formation of a protective insulating film and application of a resist, and (b) is a cross-sectional view after half-tone exposure and development.

FIG. 27 is a schematic view for explaining treatment using a third half-tone mask in the method for producing a TFT substrate according to the fifth embodiment of the invention. (a) is a cross-sectional view after formation of a protective insulating film and application of a resist. (b) is a cross-sectional view after half-tone exposure and development.

In FIG. 27(a), first, a protective insulating film 2070 which is a silicon nitride (SiNx) film is deposited on the TFT substrate 2001 on which the pixel electrode 2057 is exposed in a thickness of about 200 nm by the glow discharge CVD method. An $SiH_4$—$NH_3$—$N_2$-based mixed gas is used as a discharge gas. Subsequently, the third resist 2071 is stacked on the protective insulating film 2070 (Step S2006).

Then, as shown in FIG. 27(b), the third resist 2071 is formed in a predetermined shape by using the third half-tone mask 2072 by half-tone exposure (Step S2007). The third resist 2071 covers the protective insulating film 2070 entirely except for the part above the gate wire pad 2025, and the part of the third resist covering the drain wire pad 2058 and the pixel electrode 2057 is rendered thinner than other parts by a half-tone mask part 2721.

Figure 28:
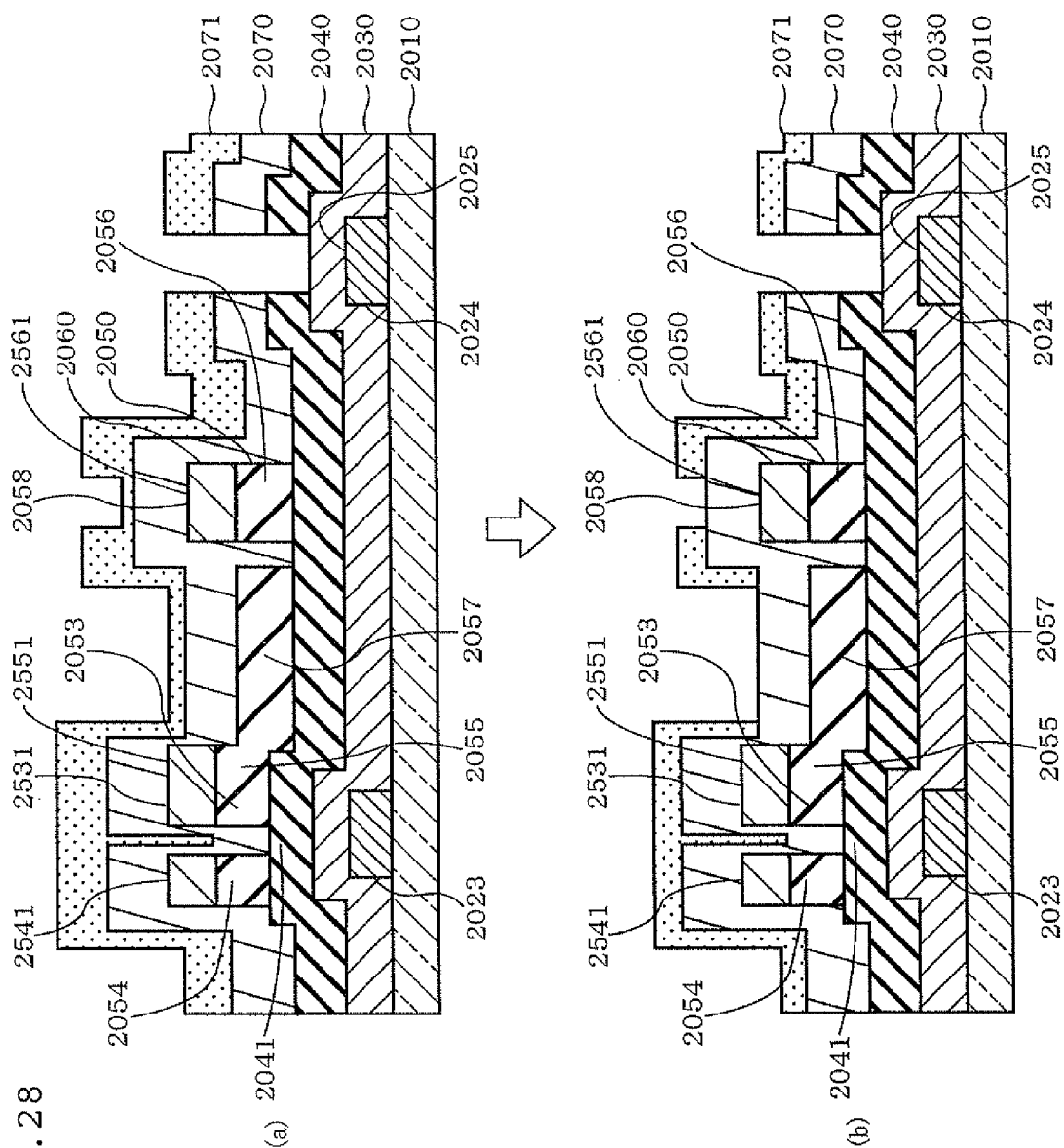
FIG. 28 is a schematic view for explaining treatment using a third half-tone mask in the method for producing a TFT substrate according to the fifth embodiment of the invention, in which (a) is a cross-sectional view after fourth etching, and (b) is a cross-sectional view after reformation of a third resist.

FIG. 28 is a schematic view for explaining treatment using a third half-tone mask in the method for producing a TFT substrate according to a fifth embodiment of the invention. (a) is a cross-sectional view after fourth etching. (b) is a cross-sectional view after reformation of a third resist.

In FIG. 28(a), as the fourth etching, the protective insulating film 2070 above the gate wire pad 2025 is patterned by a dry etching method using CHF ($CF_4$, $CHF_3$, or the like), and the n-type oxide semiconductor layer 2040 is patterned by an etching method with hydrochloric acid, an etchant based on ferric chloride, HBr (hydrogen bromide), aqua regia or the like (Step S2008).

Subsequently, as shown in FIG. 28(b), of the third resist 2071, the part which is rendered thinner (the part above the pixel electrode 2057 and the drain wire pad 2058) is removed through an ashing process, whereby the third resist 2071 is reformed.

Figure 29:
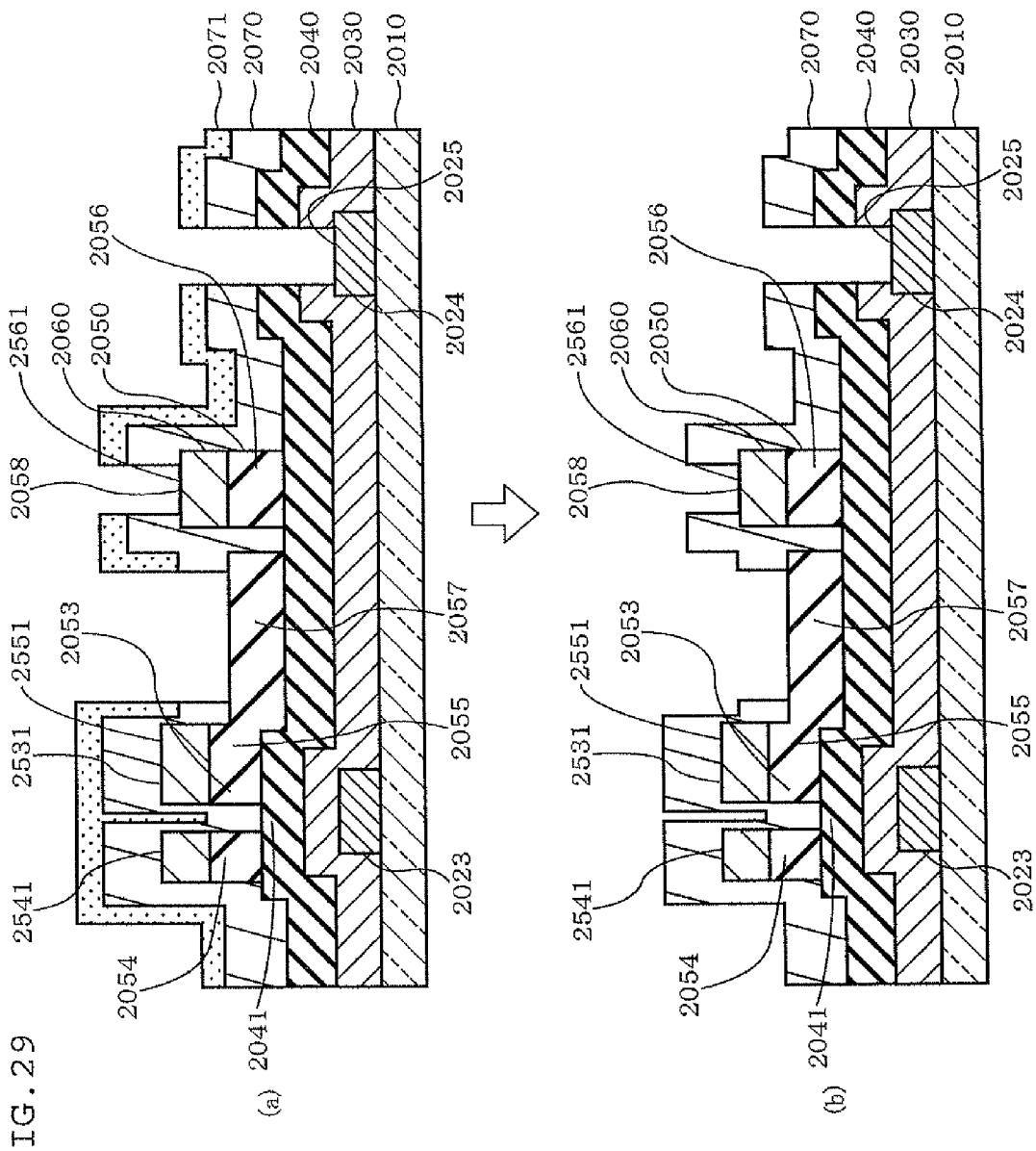
FIG. 29 is a schematic view for explaining treatment using a third half-tone mask in the method for producing a TFT substrate according to the fifth embodiment of the invention, in which (a) is a cross-sectional view after fifth etching, and (b) is a cross-sectional view after peeling off of a third resist.

FIG. 29 is schematic view for explaining treatment using a third half-tone mask in the method for producing a TFT substrate according to the fifth embodiment of the invention. (a) is a cross-sectional view after fifth etching. (b) is a cross-sectional view after peeling off of a third resist.

In FIG. 29(a), by using the reformed third resist 2071 and CHF ($CF_4$, $CHF_3$ gas or the like), the protective insulating film 2070 above the pixel electrode 2057 and the drain wire pad 2058, and the gate insulating film 2030 above the gate wire pad 2025 are selectively patterned by a dry etching method, whereby the pixel electrode 2057, the drain wire pad 2058 and the gate wire pad 2025 are exposed (Step S2009).

Figure 30:
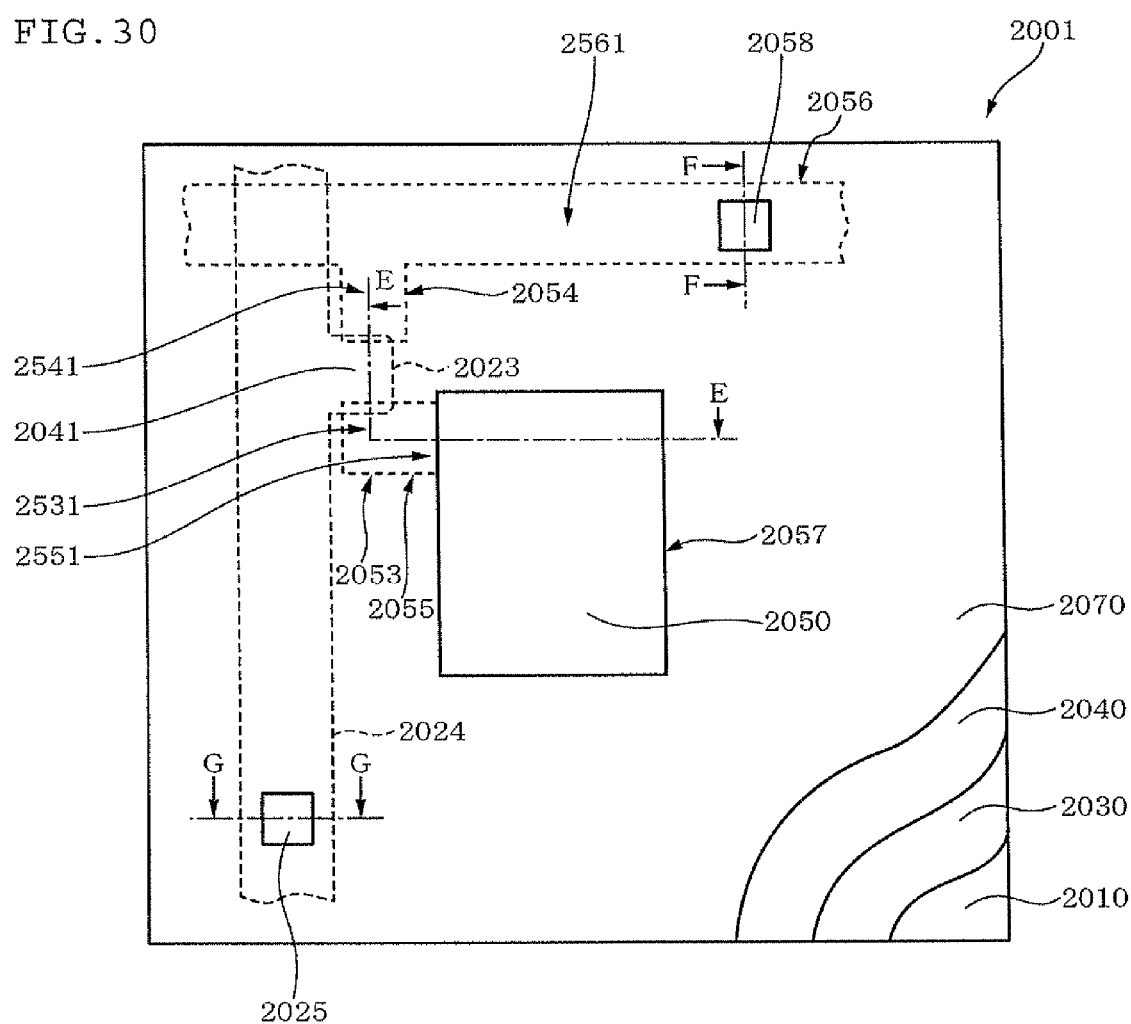
FIG. 30 is a schematic plan view of an essential part of a TFT substrate produced according to the fifth embodiment of the method for producing a TFT substrate in which a pixel electrode, a drain wire pad, and a gate wire pad are exposed.

Then, by removing the reformed third resist 2071 through an ashing process, as shown in FIG. 30, on the substrate 2010, the protective insulating film 2070 is exposed except for an area above the pixel electrode 2057, the drain wire pad 2058 and the gate wire pad 2025. The drain electrode 2054, the channel part 2041, the gate electrode 2023, the source electrode 2053, the source wire 2055 and the pixel electrode 2057 shown in FIG. 29(b) are cross-sectional views taken along line E-E in FIG. 30. The drain wire pad 2058 shown in FIG. 29(b) is a cross-sectional view taken along line F-F in FIG. 30. The gate wire pad 2025 shown in FIG. 29(b) is a cross-sectional view taken along line G-G in FIG. 30.

As mentioned hereinabove, according to the method for producing a TFT substrate 2001 in this embodiment, production cost can be significantly reduced by decreasing the number of steps in the production process. In addition, since the upper part of the n-type oxide semiconductor layer 2040 in the channel part 2041 is protected by the protective insulating film 2070, the TFT substrate 2001 can be operated stably for a prolong period of time. Further, due to the presence of the protective insulating film 2070, an organic EL apparatus can be readily obtained by providing organic EL materials, electrodes and protective films on the TFT substrate 2001.

In addition, by forming an auxiliary electrode for the source electrode 2531, an auxiliary electrode for the drain electrode 2541, an auxiliary electrode for the source wire 2551 and an auxiliary electrode for the drain wire 2561, each being formed of the metal layer 2060, the electric resistance of each of the source electrode 2053, the drain electrode 2054, the source wire 2055 and the drain wire 2056 is decreased, leading to improved reliability and suppression of a decrease in energy efficiency.

This embodiment is advantageous as an invention of a TFT substrate, and the above-mentioned TFT substrate 2001 corresponds to claims 1 and 14 to 19.

As shown in FIG. 29(b) and FIG. 30, the TFT substrate 2001 is provided with the glass substrate 2010, the gate electrode 2023 and the gate wire 2024 formed on the glass substrate 2010, the gate insulating film 2030 formed on the glass substrate 2010, the gate electrode 2023 and the gate wire 2024, the n-type oxide semiconductor layer 2040 formed on the gate insulating film 2030 at least above the gate electrode 2030, and the oxide conductor layer 2050 formed on the n-type oxide semiconductor layer 2040 with the channel part 2041 interposed therebetween. That is, the n-type oxide semiconductor layer 2040 is provided as the first oxide layer and the oxide conductor layer 2050 is provided as the second oxide layer. In the TFT substrate 2001, by using the n-type oxide semiconductor layer as an active layer for a TFT, electric current flows stably. This is advantageous for an organic EL apparatus which is operated under current control mode. Furthermore, the channel part 2041, the source electrode 2053 and the drain electrode 2054 can be readily formed.

In the TFT substrate 2001, the source wire 2055, the drain wire 2056, the source electrode 2053, the drain electrode 2054 and the pixel electrode 2057 are formed from the oxide conductor layer 2050. That is, by the above-mentioned production method according to the fifth embodiment, a TFT substrate can be produced by using three masks (first mask 2022, second half-tone mask 2062, third half-tone mask 2072), leading to reduced production steps. As a result, production efficiency can be improved and production cost can be decreased.

Further, the TFT substrate 2001 is provided with a protective insulating layer 2070 formed above the gate electrode 2023 and the gate wire 2024, as well as above the source wire 2055, the drain wire 2056, the source electrode 2053 and the drain electrode 2054, with the pixel electrode 2057, the drain wire pad 2058 and the gate wire pad 2025 being exposed. Due to such a configuration, the TFT substrate 2001 can be operated stably for a prolonged period of time since the upper part of the n-type oxide semiconductor layer 2040 of the channel part 2041 is covered by the protective insulating film 2070. Further, due to the formation of the protective insulting film 2070, an organic EL apparatus can be readily obtained by providing organic EL materials, electrodes, and protective films on the TFT substrate 2001.

In the TFT substrate 2001, the pixel electrode 2057 is formed of a stacked film of the n-type oxide semiconductor layer 2040 and the oxide conductor layer 2050. Due to such a configuration, malfunction caused by light can be prevented since the multilayer film can be rendered transparent.

In the TFT substrate 2001, the n-type oxide semiconductor layer 2040 is formed at least below the oxide conductor layer 2050, and malfunction caused by light can be surely prevented since the oxide conductor layer 2050 and the n-type oxide conductor layer 2040 can be transparent.

The energy gap of the n-type oxide semiconductor layer 2040 and the oxide conductor layer 2050 is 3.0 eV or more. By rendering the energy gap 3.0 eV or more, malfunction by light can be prevented.

In the TFT substrate 2001, an auxiliary wire for the source wire 2551, an auxiliary wire for the drain wire 2561, an auxiliary electrode for the source electrode 2531, and an auxiliary electrode for the drain electrode 2541, each being formed of the metal layer 2060, are formed on the source wire 2055, the drain wire 2056, the source electrode 2053 and the drain electrode 2054. Due to such a configuration, electric resistance of each of the wires 2055 and 2056 and the electrodes 2053 and 2054 can be decreased, whereby reliability can be improved and a decrease in energy efficiency can be suppressed.

In this embodiment, an auxiliary conductive layer is formed on the source electrode 2053, the drain electrode 2054, the source wire 2055 and the drain wire 2056. The invention is, however, not limited to this configuration. For example, a configuration in which an auxiliary conductive layer is formed on at least one of the source electrode 2053, the drain electrode 2054, the source wire 2055, the drain wire 2056 and the pixel electrode 2057 may also be possible. That is, by forming an auxiliary conductive layer (not shown) (formed of the metal layer 2060), which is connected with the auxiliary wire for the source wire 2551, on part of the pixel electrode 2057, the auxiliary conductive layer serves to improve electric conductivity of the pixel electrode 2057 and operation reliability. The shape of the above-mentioned auxiliary conductive layer is not specifically restricted. For example, the auxiliary conductive layer may have a shape similar to a comb-shaped electrode.

As mentioned hereinabove, the TFT substrate 2001 of this embodiment can significantly reduce production cost by decreasing the number of steps in production process, and can be operated stably for a prolonged period of time since the upper part of the n-type oxide semiconductor layer 2040 of the channel part 2041 is covered by the protective insulating film 2070. Further, due to the presence of the protective insulating film 2070, an organic EL apparatus can be readily obtained by providing organic EL materials, electrodes and protective films on the TFT substrate 2001. In addition, by forming an auxiliary electrode for the source electrode 2531, an auxiliary electrode for the drain electrode 2541, an auxiliary electrode for the source wire 2551 and an auxiliary electrode for the drain wire 2561, each being formed of the metal layer 2060, the electric resistance of each of the source electrode 2053, the drain electrode 2054, the source wire 2055 and the drain wire 2056 is decreased, leading to improved reliability and suppression of a decrease in energy efficiency.

Method for Producing a TFT Substrate According to a Sixth Embodiment

The method for producing a TFT substrate in this embodiment is a method in which three masks are used, and corresponds to claim 20.

Figure 31:
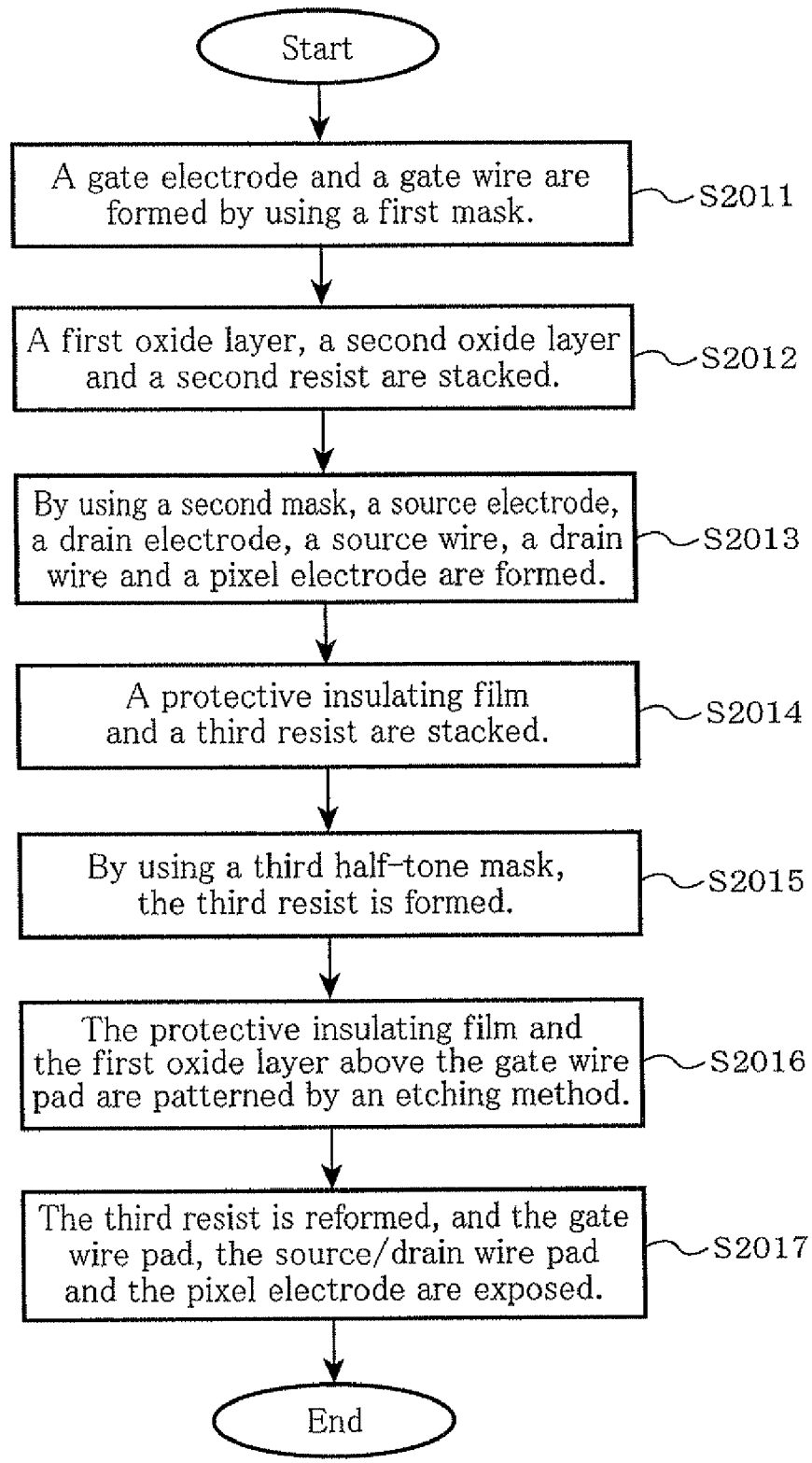
FIG. 31 is a schematic flow chart for explaining the method for producing a TFT substrate according to the sixth embodiment of the invention.

FIG. 31 is a schematic flow chart for explaining the method for producing a TFT substrate according to a sixth embodiment of the invention.

As shown in FIG. 31, a gate electrode 2021 and a gate wire 2022 are formed on a substrate 2010 by using a first mask 2022 (Step S2011).

Treatment using the first mask 2022 in step S2011 is similar to treatment using the first mask 2022 in step S2001 of the fifth embodiment.

Then, as shown in FIG. 31, on the glass substrate 2010, the gate electrode 2023 and the gate wire 2024, a gate insulating film 2030, an n-type oxide semiconductor layer 2040 as the first oxide layer, an oxide conductor layer 2050 as the second oxide layer and a second resist 2051 are stacked in this order (Step S2012), and the second resist 2051 is formed in a predetermined shape by using a second mask 2052.

Subsequently, treatment using the second mask 2052 will be explained below referring to the drawing.
(Treatment Using a Second Mask)

Figure 32:
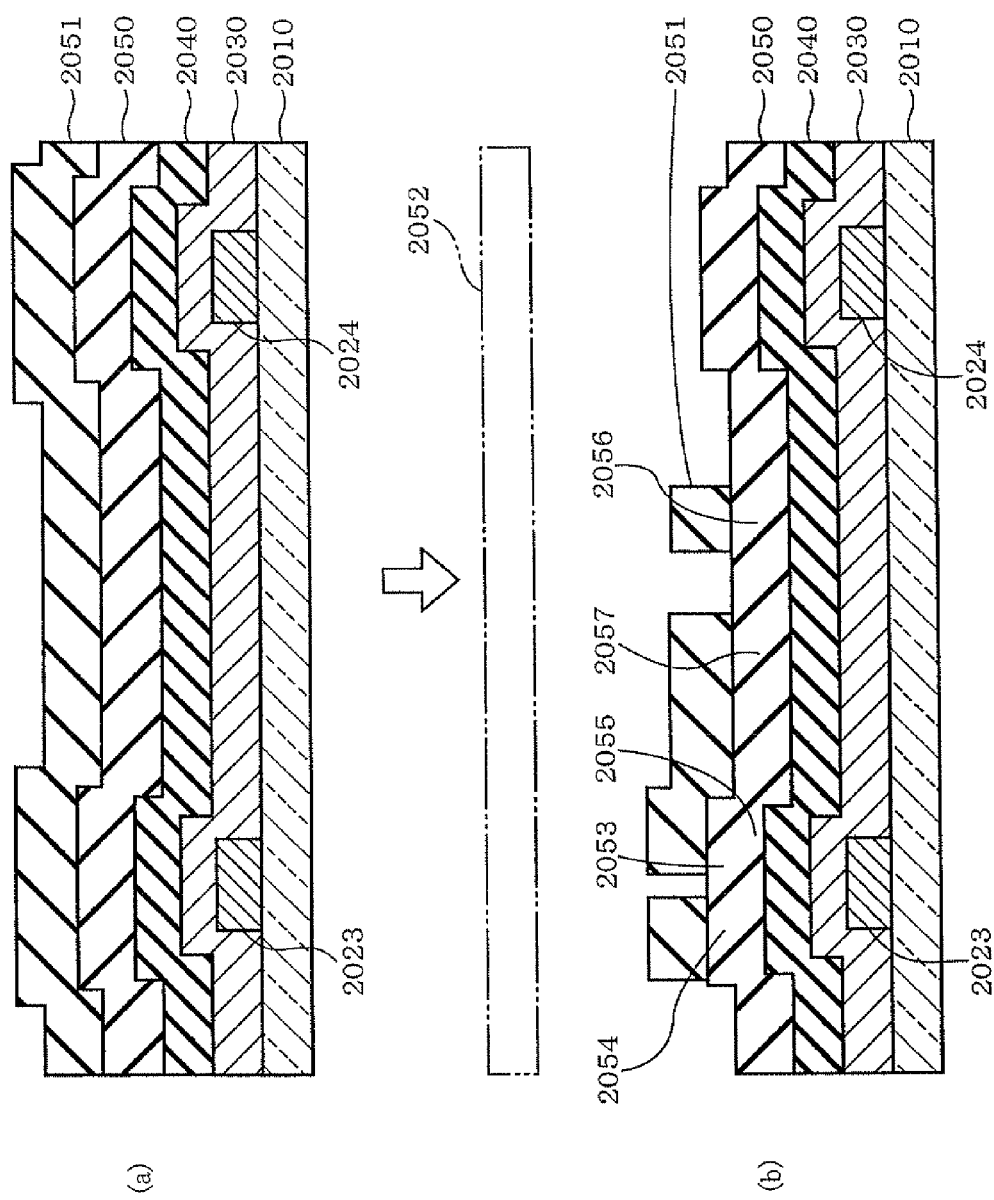
FIG. 32 is a schematic view for explaining treatment using a second mask in the method for producing a TFT substrate according to the sixth embodiment of the invention, in which (a) is a cross-sectional view after formation of a gate insulating film, an n-type oxide semiconductor layer, an oxide conductor layer, and application of a resist, and (b) is a cross-sectional view after exposure and development.

FIG. 32 is a schematic view for explaining treatment using a second mask in the method for producing a TFT substrate according to the sixth embodiment of the invention. (a) is a cross-sectional view after formation of a gate insulating film, an n-type oxide semiconductor layer, an oxide conductor layer, and application of a resist. (b) is a cross-sectional view after exposure and development.

In FIG. 32(*a*), a gate insulating film 2030, which is a silicon nitride (SiNx) film, is deposited in a thickness of about 300 nm by the glow discharge CVD (Chemical Vapor Deposition) method on the glass substrate 2010, the gate electrode 2023 and the gate wire 2024. In this embodiment, an SiH$_4$—NH$_3$—N$_2$-based mixed gas is used as a discharge gas.

Then, on the gate insulating film 2030, an n-type oxide semiconductor layer 2040 with a thickness of about 100 nm is formed by using a tin oxide-zinc oxide (SnO$_2$:ZnO=about 65:35 wt %) target by the high-frequency sputtering method in an atmosphere of about 15% oxygen and about 85% argon with a substrate temperature of about 200° C.

Subsequently, an oxide conductor layer 2050 with a thickness of about 150 nm is formed on the n-type oxide semiconductor layer 2040 by using an indium oxide-tin-oxide-zinc oxide (In$_2$O$_3$:SnO$_2$:ZnO=about 60:20:20 wt %) target by the high-frequency sputtering method in an atmosphere of about 1% oxygen and about 99% argon.

Then, as shown in FIG. 32(*b*), a second resist 2051 is formed in a predetermined shape by using the second mask 2052. The second resist 2051 is formed in a shape to cover a source electrode 2053, a drain electrode 2054, a source wire 2055, a drain wire 2056 and a pixel electrode 2057.

Figure 33:
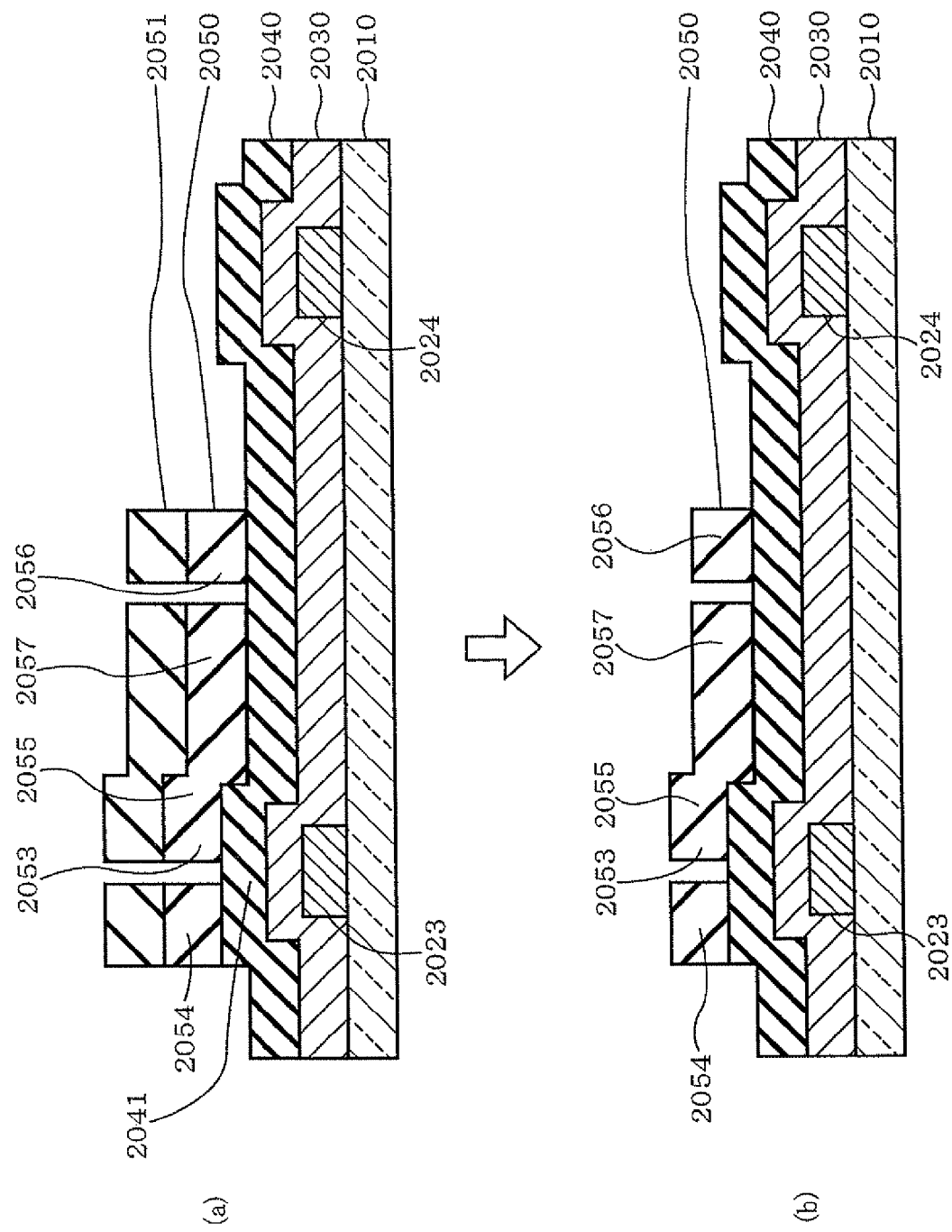
FIG. 33 is a schematic view for explaining treatment using a second half-tone mask in the method for producing a TFT substrate according to the sixth embodiment of the invention, in which (a) is a cross-sectional view after second etching, and (b) is a cross-sectional view after peeling off of a second resist.

FIG. 33 is a schematic view for explaining treatment using a second half-tone mask in the method for producing a TFT substrate according to a sixth embodiment of the invention. (a) is a cross-sectional view after second etching. (b) is a cross-sectional view after peeling off of a second resist.

In FIG. 33(*a*), the second etching is conducted for the oxide conductor layer 2050 by using the second resist 2051, whereby a source electrode 2053, a drain electrode 2054, a source wire 2055, a drain wire 2056 and a pixel electrode 2057 are formed as desired (Step S2013 in FIG. 31). The n-type oxide semiconductor layer 2040 is patterned by an etching method with an aqueous oxalic acid solution.

As a result of the above-mentioned etching, a channel part 2041 is formed in the n-type oxide semiconductor layer 2040 above the gate electrode 2023. As a result, the TFT substrate 2001*a* is called a channel etch type TFT.

Figure 34:
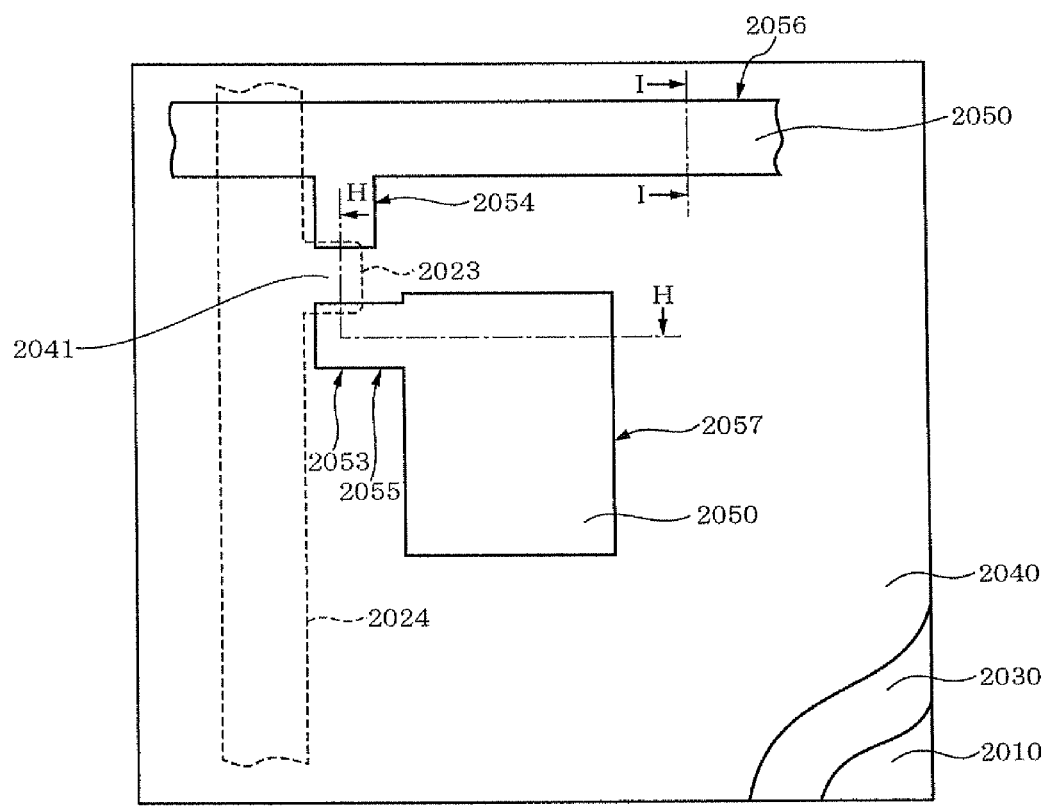
FIG. 34 is a schematic plan view of an essential part of the glass substrate on which a drain electrode, a source electrode, a drain wire, a source wire and a pixel electrode are formed in the method for producing a TFT substrate according to the sixth embodiment of the invention.

Then, as shown in FIG. 33(*b*), the second resist 2051 is removed through an ashing process completely, a source electrode 2053, a drain electrode 2054, a source wire 2055, a drain wire 2056 and a pixel electrode 2057 are exposed. The drain electrode 2054, the channel part 2041, the source electrode 2053, the source wire 2055 and the pixel electrode 2057 shown in FIG. 33(*b*) are cross-sectional views taken along line H-H in FIG. 34. The drain wire 2056 shown in FIG. 33(*b*) is a cross-sectional view taken along line I-I in FIG. 34.

As shown in FIG. 31, a protective insulating film 2070 and a third resist 2071 are stacked in this order on the n-type oxide semiconductor layer 2040, the drain electrode 2054, the source electrode 2053, the source wire 2055, the pixel electrode 2057 and the drain wire 2056 (Step S2014), and the third resist 2071 is formed in a predetermined shape by using a third half-tone mask 2072 by half-tone exposure (Step S2015).

Next, treatment using the third half-tone mask 2072 will be explained.
(Treatment Using a Third Half-Tone Mask)

Figure 35:
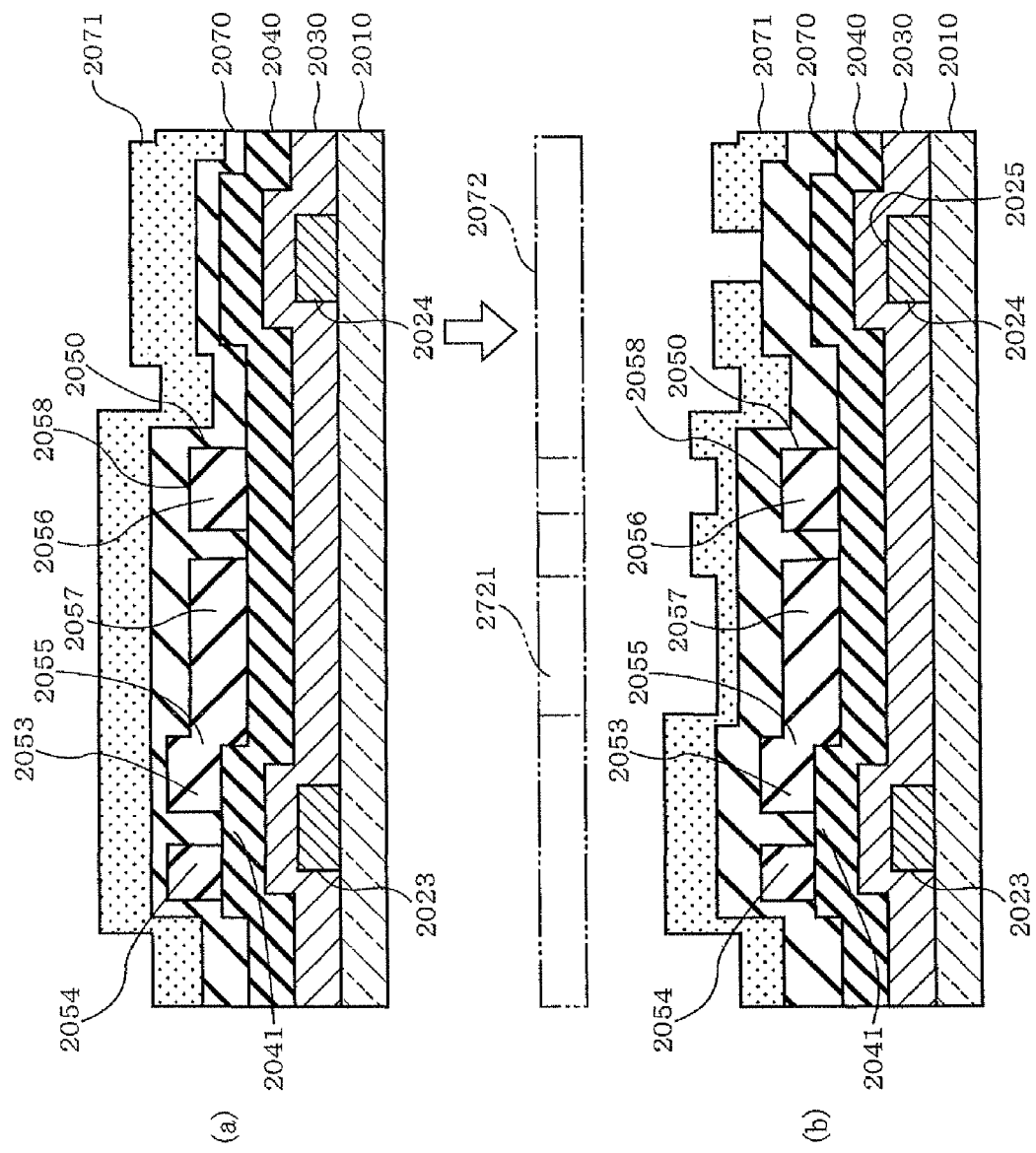
FIG. 35 is a schematic view for explaining treatment using a third half-tone mask in the method for producing a TFT substrate according to the sixth embodiment of the invention, in which (a) is a cross-sectional view after formation of a protective insulating film and application of a resist, and (b) is a cross-sectional view after half-tone exposure and development.

FIG. 35 is a schematic view for explaining treatment using a third half-tone mask in the method for producing a TFT substrate according to the sixth embodiment of the invention. (a) is a cross-sectional view after formation of a protective insulating film and application of a resist. (b) is a cross-sectional view after half-tone exposure and development.

In FIG. 35(*a*), first, a protective insulating film 2070 which is a silicon nitride (SiNx) film is deposited on the TFT substrate 2001*a* on which the pixel electrode 2057 is exposed in a thickness of about 200 nm by the glow discharge CVD method. An SiH$_4$—NH$_3$—N$_2$-based mixed gas is used as a discharge gas. Subsequently, the third resist 2071 is stacked on the protective insulating film 2070 (Step S2014).

Then, as shown in FIG. 35(*b*), the third resist 2071 is formed in a predetermined shape by using the third half-tone mask 2072 by half-tone exposure (Step S2015). The third resist 2071 covers the protective insulating film 2070 entirely except for the part above the gate wire pad 2025, and the part of the third resist covering the drain wire pad 2058 and the pixel electrode 2057 is rendered thinner than other parts by a half-tone mask part 2721.

Figure 36:
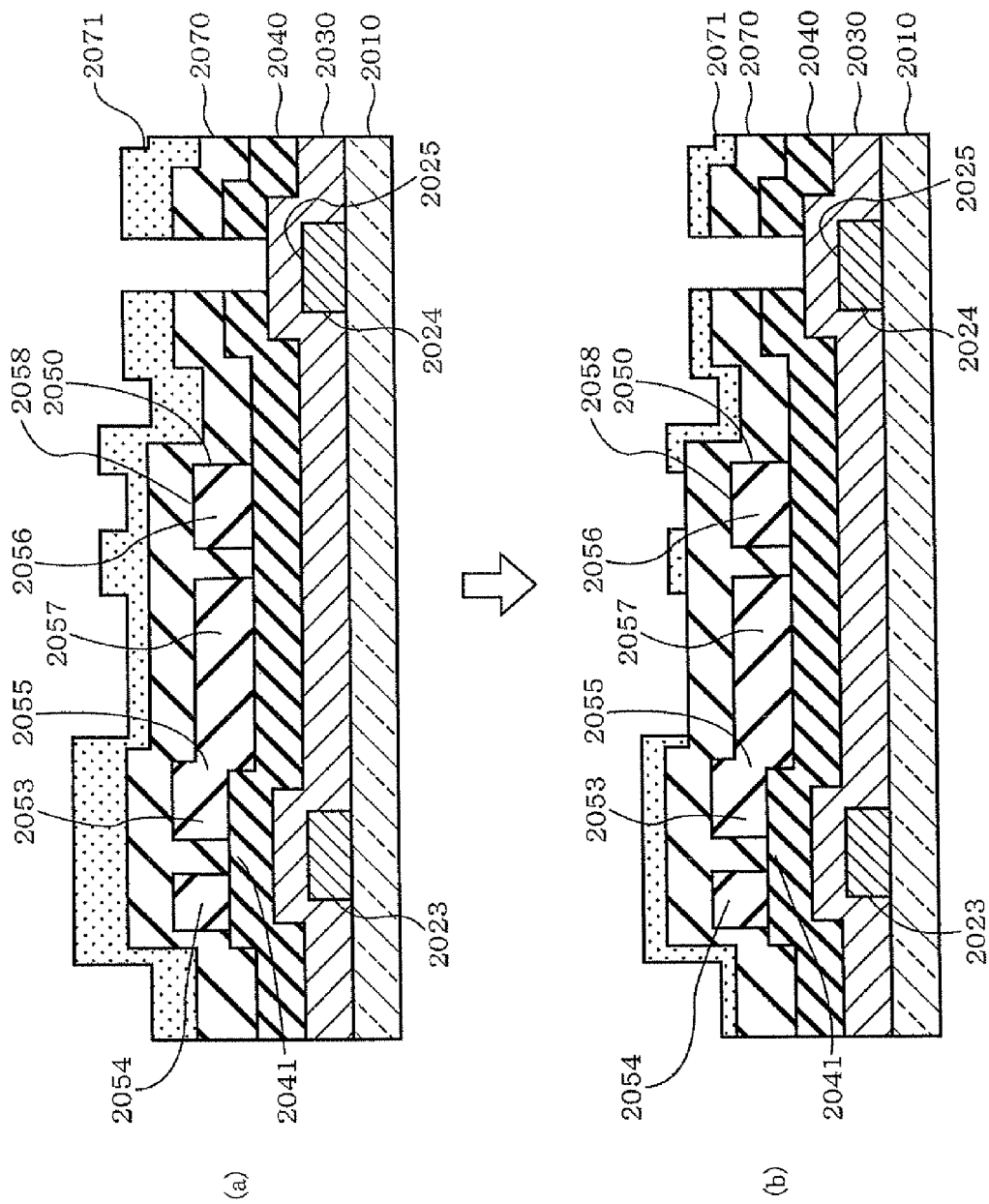
FIG. 36 is a schematic view for explaining treatment using a third half-tone mask in the method for producing a TFT substrate according to the sixth embodiment of the invention, in which (a) is a cross-sectional view after third etching, and (b) is a cross-sectional view after reformation of a third resist.

FIG. 36 is a schematic view for explaining treatment using a third half-tone mask in the method for producing a TFT substrate according to the sixth embodiment of the invention. (a) is a cross-sectional view after third etching. (b) is a cross-sectional view after reformation of a third resist.

In FIG. 36(a), as the third etching, the protective insulating film 2070 above the gate wire pad 2025 is patterned by a dry etching method using CHF ($CF_4$, $CHF_3$, or the like). Then, the n-type oxide semiconductor layer 2040 is patterned by an etching method with hydrochloric acid, an etchant based on ferric chloride, HBr (hydrogen bromide), aqua regia or the like (Step S2016).

Subsequently, as shown in FIG. 36(b), of the third resist 2071, the part which is rendered thinner (the part above the pixel electrode 2057 and the drain wire pad 2058) is removed through an ashing process, whereby the third resist 2071 is reformed.

Figure 37:
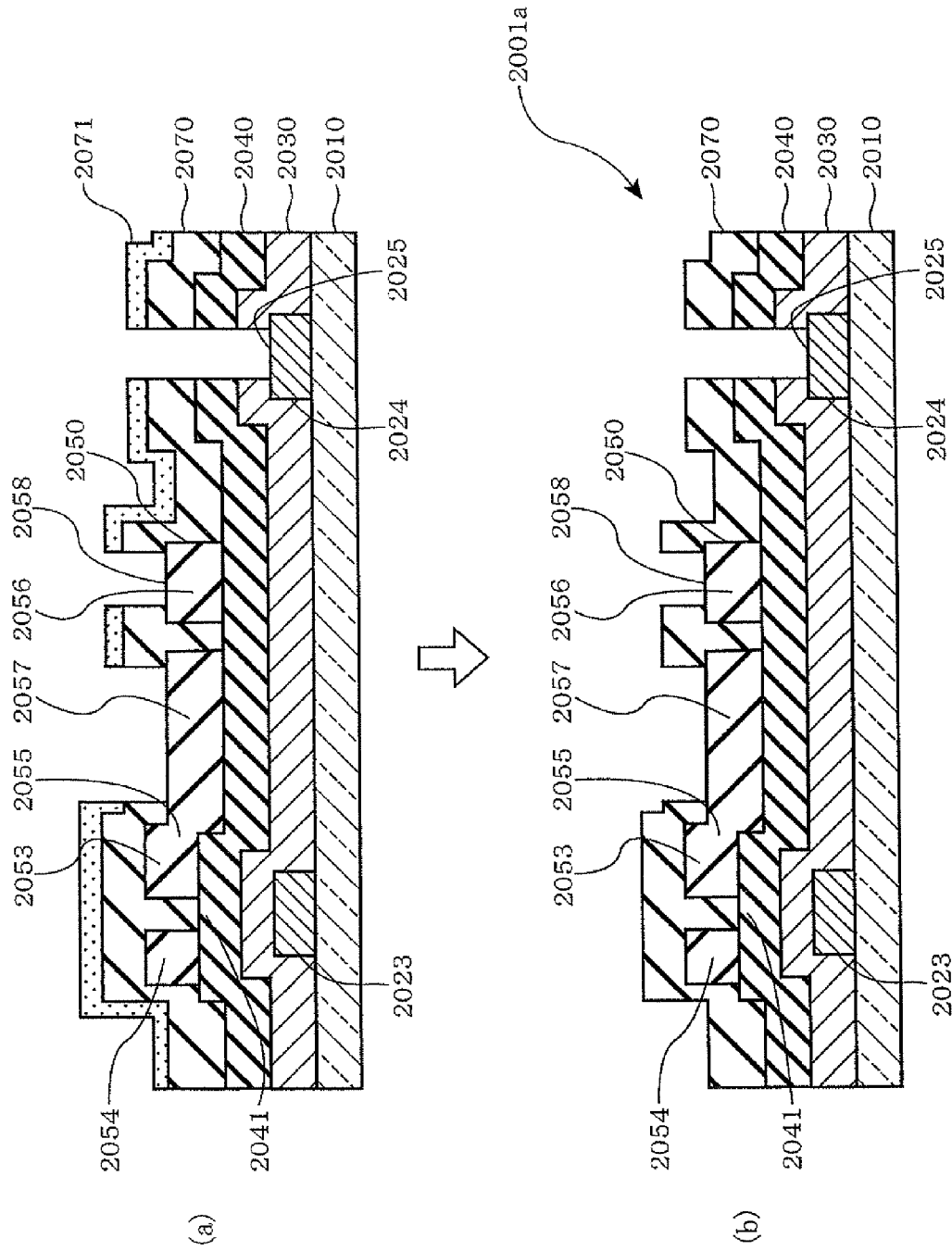
FIG. 37 is a schematic view for explaining treatment using a third half-tone mask in the method for producing a TFT substrate according to the sixth embodiment of the invention, in which (a) is a cross-sectional view after fourth etching, and (b) is a cross-sectional view after peeling off of a third resist.

FIG. 37 is a schematic view for explaining treatment using a third half-tone mask in the method for producing a TFT substrate according to the sixth embodiment of the invention. (a) is a cross-sectional view after fourth etching. (b) is a cross-sectional view after peeling off of a third resist;

In FIG. 37(a), by using the reformed third resist 2071 and CHF ($CF_4$, $CHF_3$ gas or the like), the protective insulating film 2070 above the pixel electrode 2057 and the drain wire pad 2058, and the gate insulating film 2030 above the gate wire pad 2025 are selectively patterned by a dry etching method, whereby the pixel electrode 2057, the drain wire pad 2058 and the gate wire pad 2025 are exposed (Step S2017).

Figure 38:
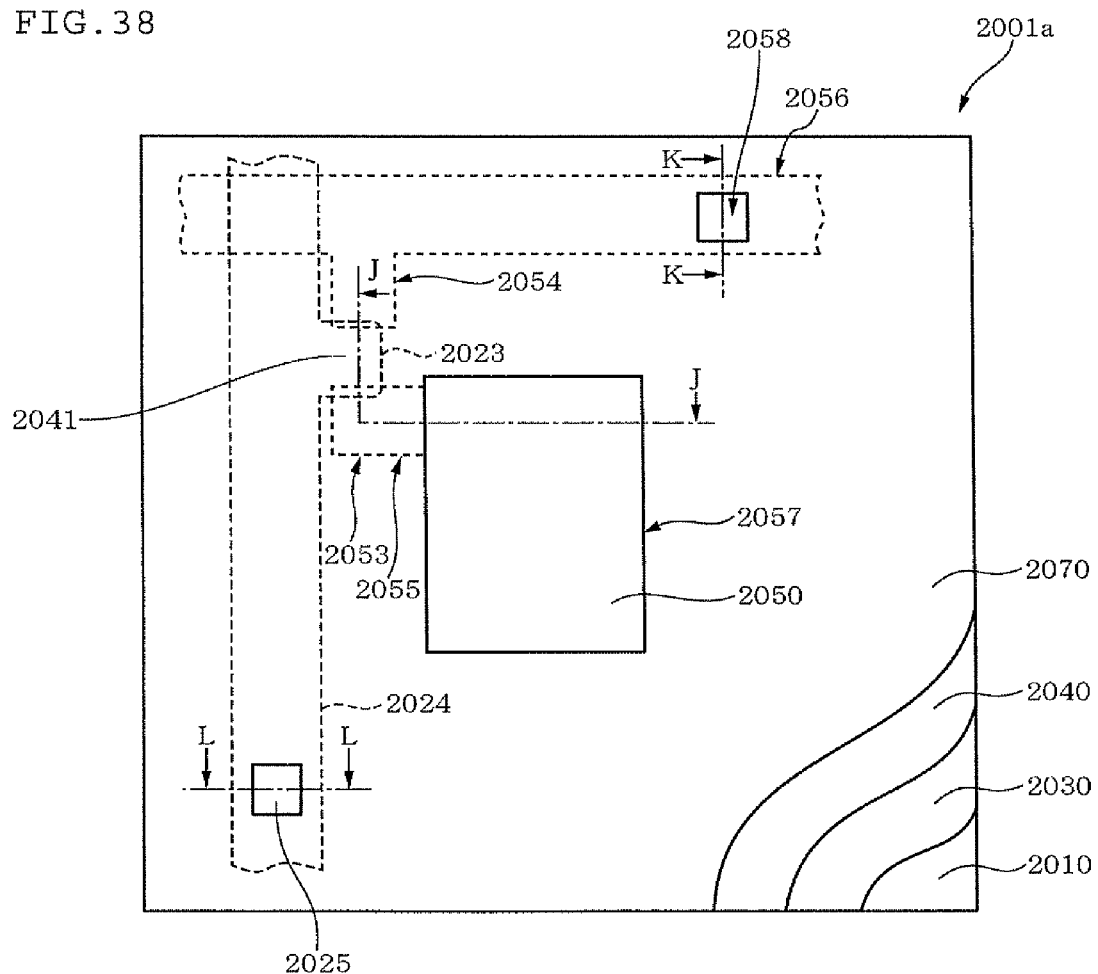
FIG. 38 is a schematic plan view of an essential part of a TFT substrate produced according to the sixth embodiment of the method for producing a TFT substrate in which a pixel electrode, a drain wire pad, and a gate wire pad are exposed.

Then, by removing the reformed third resist 2071 through an ashing process, as shown in FIG. 38, on the substrate 2010, the protective insulating film 2070 is exposed except for an area above the pixel electrode 2057, the drain wire pad 2058 and the gate wire pad 2025. The drain electrode 2054, the channel part 2041, the gate electrode 2023, the source electrode 2053, the source wire 2055 and the pixel electrode 2057 shown in FIG. 37(b) are cross-sectional views taken along line J-J in FIG. 38. The drain wire pad 2058 shown in FIG. 37(b) is a cross-sectional view taken along line K-K in FIG. 38. The gate wire pad 2025 shown in FIG. 37(b) is a cross-sectional view taken along line L-L in FIG. 38.

As mentioned hereinabove, according to the method for producing a TFT substrate 2001a in this embodiment, production cost can be significantly reduced by decreasing the number of steps in the production process. In addition, since the upper part of the n-type oxide semiconductor layer 2040 in the channel part 2041 is protected by the protective insulating film 2070, the TFT substrate 2001a can be operated stably for a prolong period of time. Further, due to the presence of the protective insulating film 2070, an organic EL apparatus can be readily obtained by providing organic EL materials, electrodes and protective films on the TFT substrate 2001a.

This embodiment is advantageous as an invention of a TFT substrate, and the above-mentioned TFT substrate 2001a corresponds to claims 1, 14, 15, 16, 17, 19.

In comparison to the TFT substrate 2001, as shown in FIG. 37(b), the TFT substrate 2001a differs from the TFT substrate 2001 in that an auxiliary wire for the source wire 2551, an auxiliary wire for the drain wire 2561, an auxiliary electrode for the source electrode 2531, and an auxiliary electrode for the drain electrode 2541, each being formed of the metal layer 2060, are not formed on the source wire 2055, the drain wire 2056, the source electrode 2053 and the drain electrode 2054. That is, by the above-mentioned production method according to the sixth embodiment, the TFT substrate 2001a can be produced by using three masks (first mask 2022, second mask 2052, third half-tone mask 2072), whereby production steps are reduced as compares with the TFT substrate 2001. As a result, production efficiency can be improved and production cost can be decreased.

As mentioned hereinabove, the TFT substrate 2001a of this embodiment has an effect almost equivalent to that of the TFT substrate 2001 (except for the effect of an auxiliary conductive layer) and production steps are reduced as compared with the TFT substrate 2001. As a result, production efficiency can be further improved and production cost can be decreased.

As mentioned above, according to claims 14 to 21 of the invention, a TFT substrate having an auxiliary conductive layer and a protective insulating film can be produced by using three masks and the number of masks decreases and production steps are reduced. As a result, production efficiency can be improved and production cost can be decreased. Moreover, since the upper part of the first oxide layer of the channel part is protected by the protective insulating film, a TFT substrate can be operated stably for a prolonged period of time. In addition, since the electric resistance of each wire or each electrode can be decreased by an auxiliary conductive layer, reliability can be improved and a decrease in energy efficiency can be suppressed.

Method for Producing a TFT Substrate According to a Seventh Embodiment

The method for producing a TFT substrate in this embodiment is a method in which three masks are used, and corresponds to claim 36.

Figure 39:
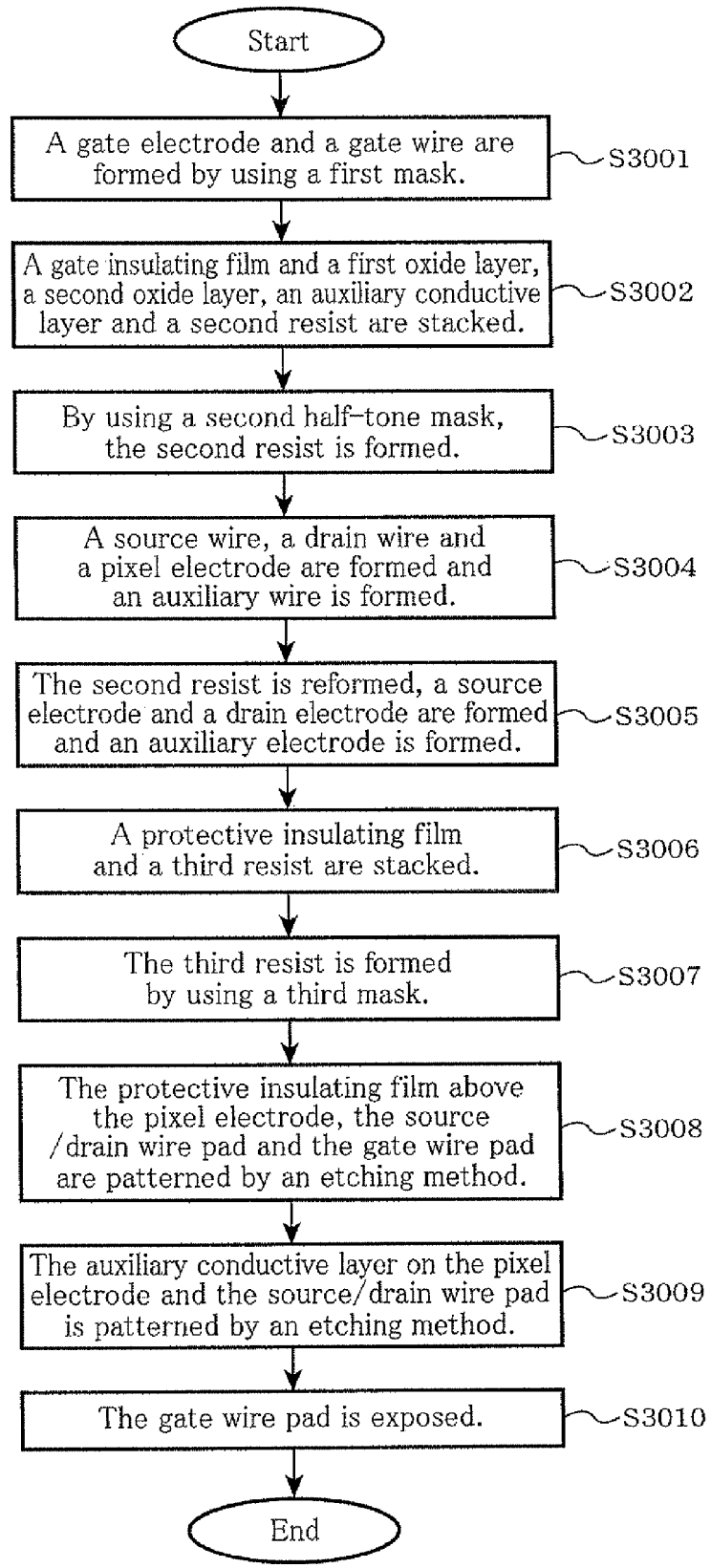
FIG. 39 is a schematic flow chart for explaining the method for producing a TFT substrate according to a seventh embodiment of the invention.

FIG. 39 is a schematic flow chart for explaining the method for producing a TFT substrate according to a seventh embodiment of the invention.

As shown in FIG. 39, a gate electrode 3023 and a gate wire 3024 are formed on a substrate 3010 by using a first mask 3022 (Step S3001).

Next, treatment using the first mask 3022 will be explained below referring to the drawing.
(Treatment Using a First Mask)

Figure 40:
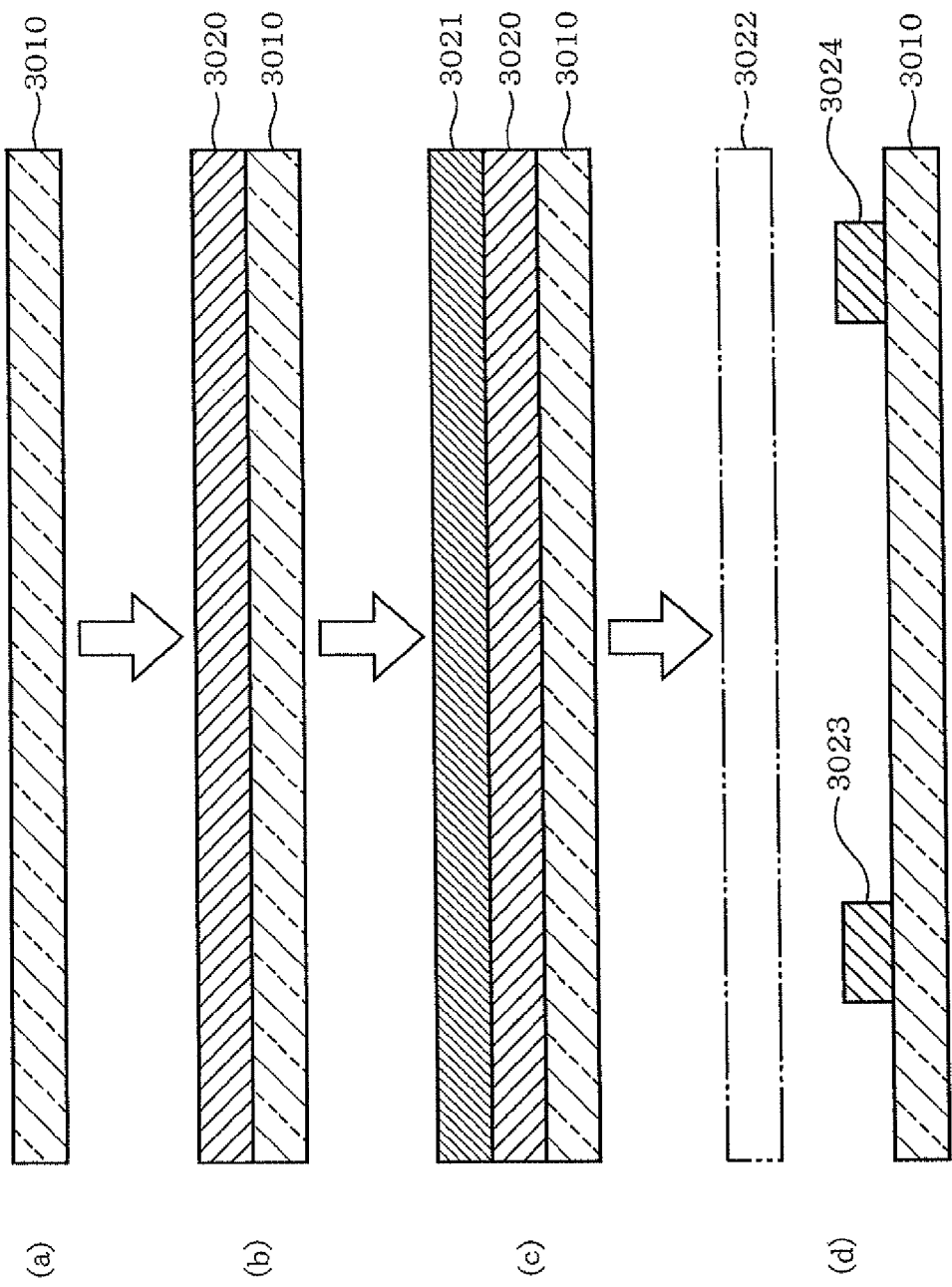
FIG. 40 is a schematic view for explaining treatment using a first mask in the method for producing a TFT substrate according to the seventh embodiment of the invention, in which (a) is a cross-sectional view of a glass substrate before the treatment, (b) is a cross-sectional view after formation of a metal film, (c) is a cross-sectional view after application of a resist, and (d) is a cross-sectional view after formation of a gate electrode and a gate wire as a result of exposure, development, first etching and peeling off of the resist.

FIG. 40 is a schematic view for explaining treatment using a first mask in the method for producing a TFT substrate according to the seventh embodiment of the invention. (a) is a cross-sectional view of the glass substrate before the treatment. (b) is a cross-sectional view after formation of a metal film. (c) is a cross-sectional view after application of a resist. (d) is a cross-sectional view after formation of a gate electrode and a gate wire as a result of exposure, development, first etching and peeling off of the resist.

In FIG. 40(a), a light-transmissive glass substrate 3010 is provided at first.

The material for the TFT substrate 3001 is not limited to glass like the above-mentioned glass substrate 3010. For example, a plate- or sheet-like member formed of a resin may also be used.

Then, as shown in FIG. 40(b), a metal film is formed on the glass substrate 3010, and a thin film for gate electrode/wire (a thin film for a gate electrode and a gate wire) 3020 is formed.

In this embodiment, on the glass substrate 3010, Al and Mo are stacked in this order by the high frequency sputtering method. As a result, a thin metal film with a thickness of about 250 nm and a thin metal film with a thickness of about 50 nm are formed respectively. Subsequently, a thin film with a thickness of about 100 nm is formed by using an indium oxide-tin oxide-samarium oxide (generally called ITSmO: $In_2O_3$:$SnO_2$:$Sm_2O_3$=about 90:7:3 wt %) sputtering target, whereby the thin film for a gate electrode/wire 3020 formed of Al/Mo/ITSmO is formed.

Then, as shown in FIG. 40(c), a first resist 3021 is applied on the thin film for a gate electrode/wire 3020.

Figure 41:
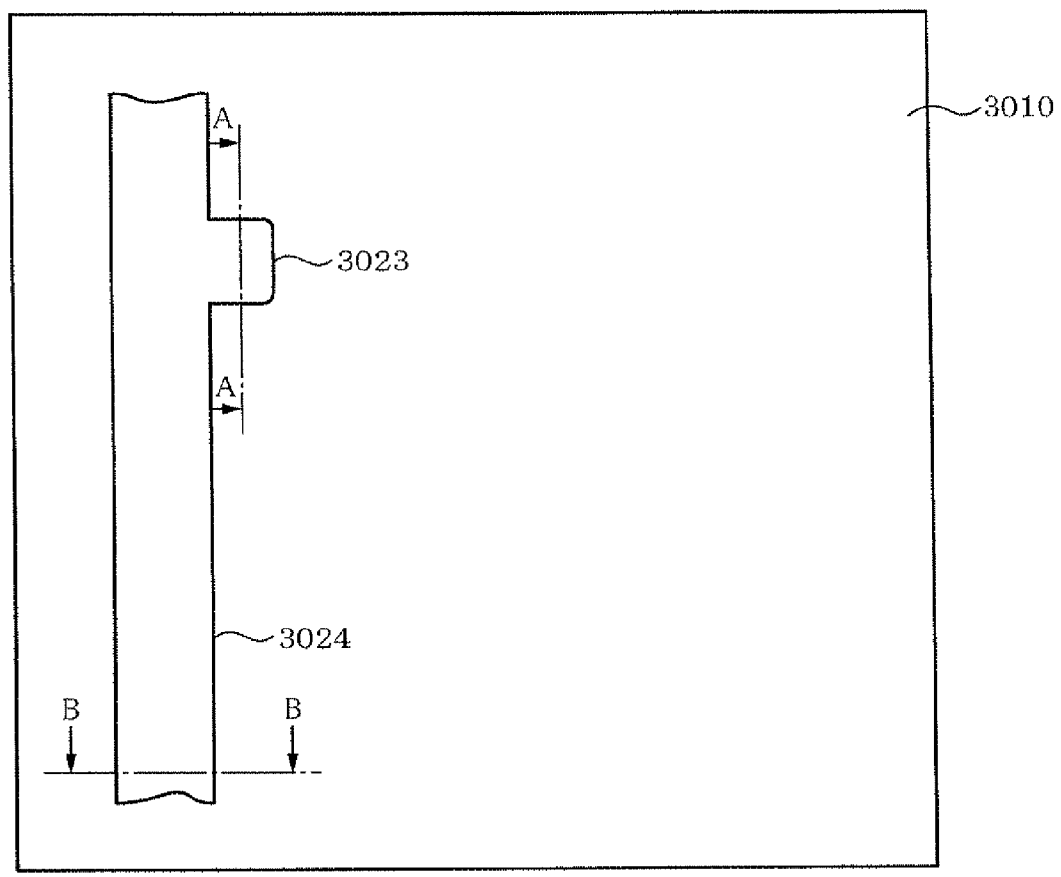
FIG. 41 is a schematic plan view of an essential part of the glass substrate on which a gate electrode and a gate wire are formed in the method for producing a TFT substrate according to the seventh embodiment of the invention.

Next, as shown in FIG. 40(d), a resist (not shown) is formed in a predetermined shape by photolithography using the first mask 3022. Then, the ITSmO thin film is patterned by an etching method with an aqueous oxalic acid solution. The thin metal film is patterned by an etching method with an acid mixture (generally called "PAN"), whereby a gate electrode 3023 and a gate wire 3024 are formed in predetermined shapes (see FIG. 41). The gate electrode 3023 and the gate wire 3024 shown in FIG. 40(d) are cross-sectional views taken along lines A-A and B-B in FIG. 41. Here, ITSmO can be patterned by an etching method with an acid mixture. Therefore, ITSmO and the thin metal film may be patterned simultaneously by an etching method using the above-mentioned acid mixture.

After the formation of the thin film for a gate electrode/wire 3020, the thin film may be subjected to heat treatment to decrease the resistance of Al as well as to crystallize ITSmO. That is, since crystallized ITSmO becomes insoluble in an oxalic acid-based etching solution or an acid mixture, the crystallized ITSmO can protect the Al/Mo layer.

Further, by forming an oxide conductive film such as an ITSmO film on the surface of the gate wire 3024, the metal used in the gate wire 3024 is not exposed when forming a gate wire pad 3025. As a result, a highly reliable connection becomes possible. That is, when a through hole (opening section) for forming the gate wire pad 3025 is formed in a gate insulating film 3030, an insulating substance such as SiNx, SiONx and $SiO_2$ is used in the gate insulating film 3030. Then, a through hole is formed by reactive ion etching using CHF (e.g. $CF_4$, $CHF_3$), whereby the oxide conductive film such as ITSmO is effective as the protective film (also called "an oxide conductor layer for protecting the metal layer") for the thin metal film (Al/Mo layer).

Here, instead of ITSmO, for example, a material obtained by incorporating a lanthanoide-based element into ITO, a material obtained by incorporating an oxide of a high-boiling-point metal such as Mo, W (tungsten) or the like can be used. The oxide of a high-boiling-point metal is added in an amount of about 10 at. % or less relative to all metal elements, preferably about 1 to 5 at. %. If the amount exceeds about 10 at. %, the resulting material is hardly crystallized, and molten in an aqueous oxalic acid solution or in an acid mixture. The film thickness is about 20 nm to 500 nm, preferably about 30 nm to 300 nm. If the thickness is less than about 20 nm, the film may have pinholes and cannot function as the protective film. On the other hand, if the film thickness exceeds 500 nm, film forming or etching takes a lot of time, leading to a prolonged production time. Therefore, the production thereof is neither efficient nor economically advantageous.

Then, as shown in FIG. 39, on the glass substrate 3010, the gate electrode 3023 and the gate wire 3024, a gate insulating film 3030, an n-type oxide semiconductor layer 3040 as the first oxide layer, an oxide conductor layer 3050 as the second oxide layer, a metal layer 3060 as the auxiliary conductive layer and a second resist 3061 are stacked in this order (Step S3002), and the second resist 3061 is formed in a predetermined shape by half-tone exposure using a second half-tone mask 3062 (Step S3003).

Subsequently, treatment using the second half-tone mask 3062 will be explained below referring to the drawing.

(Treatment Using a Second Half-Tone Mask)

Figure 42:
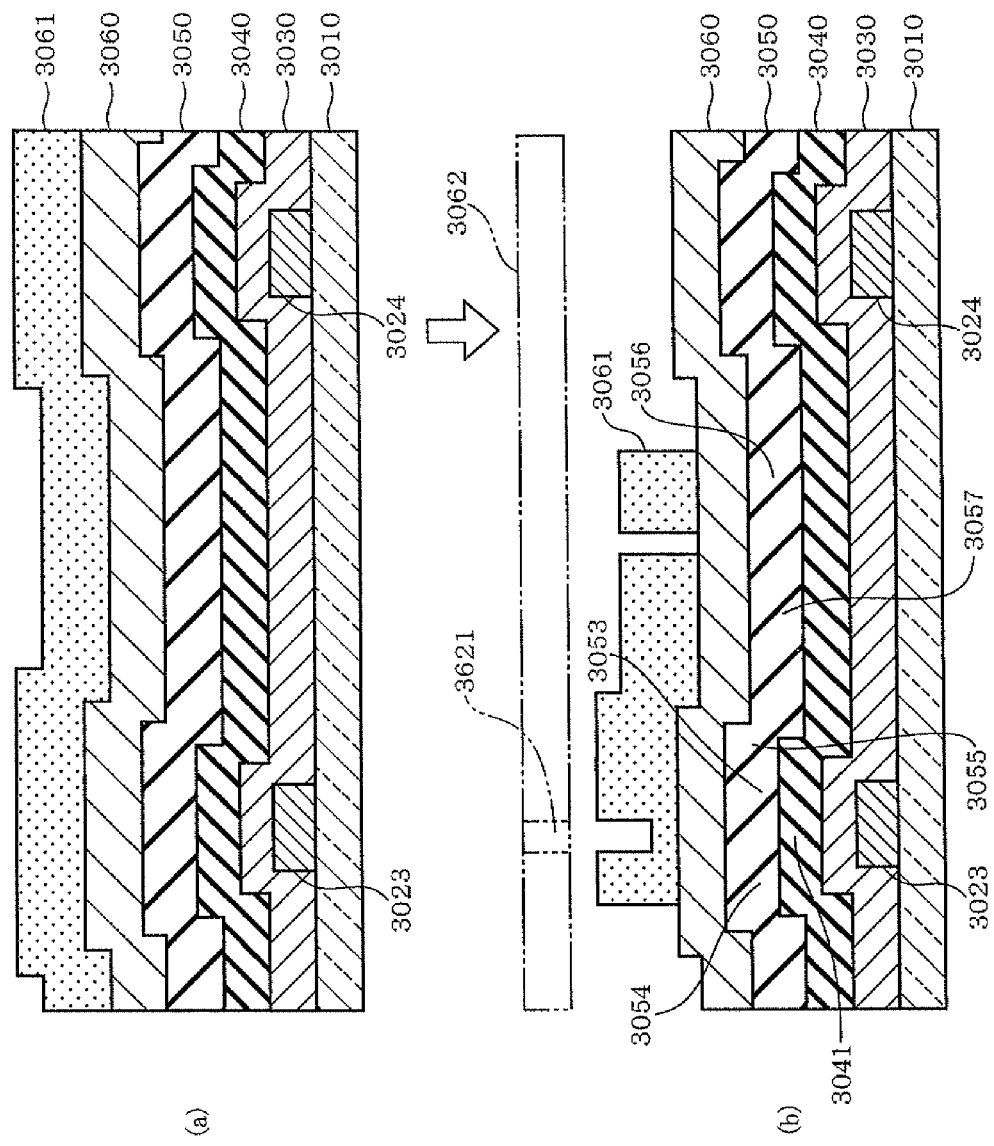
FIG. 42 is a schematic view for explaining treatment using a second half-tone mask in the method for producing a TFT substrate according to the seventh embodiment of the invention, in which (a) is a cross-sectional view after formation of a gate insulating film, an n-type oxide semiconductor layer, an oxide conductor layer, a metal layer, and application of a resist, and (b) is a cross-sectional view after half-tone exposure and development.

FIG. 42 is a schematic view for explaining treatment using a second half-tone mask in the method for producing a TFT substrate according to a seventh embodiment of the invention. (a) is a cross-sectional view after formation of a gate insulating film, an n-type oxide semiconductor layer, an oxide conductor layer, a metal layer, and application of a resist. (b) is a cross-sectional view after half-tone exposure and development.

In FIG. 42(a), a gate insulating film 3030, which is a silicon nitride (SiNx) film, is deposited in a thickness of about 300 nm by the glow discharge CVD (Chemical Vapor Deposition) method on the glass substrate 3010, the gate electrode 3023 and the gate wire 3024. In this embodiment, an $SiH_4$—$NH_3$—$N_2$-based mixed gas is used as a discharge gas.

Then, on the gate insulating film 3030, an n-type oxide semiconductor layer (an active layer) 3040 with a thickness of about 100 nm is formed by using an indium oxide-zinc oxide-gallium oxide ($In_2O_3$:ZnO:$Ga_2O_3$=about 70:3:27 wt %) target by the high-frequency sputtering method in an atmosphere of about 10% oxygen and about 90% argon with a substrate temperature of about 200° C. or less (i.e., under conditions where the n-type oxide semicondutor layer 3040 is not crystallized). The n-type oxide semiconductor layer 3040 had an energy gap of about 3.6 eV.

Subsequently, an oxide conductor layer 3050 with a thickness of about 150 nm is formed on the n-type oxide semiconductor layer 3040 by using an indium oxide-zinc oxide-tin oxide ($In_2O_3$:ZnO:$SnO_2$=about 60:20:20 wt %) target by the high-frequency sputtering method in an atmosphere of about 1% oxygen and about 99% argon, and further, under conditions where the oxide conductor layer 3050 is not crystallized. The oxide conductor layer 3050 had an energy gap of about 3.2 eV.

On the oxide conductor layer 3050, a metal layer (Mo/Al/Mo/IZO layer) 3060, which serves as an auxiliary conductive layer, is formed such that it has a thickness of about 450 nm (the thicknesses of the Mo layer, the Al layer, the Mo layer and the IZO layer are about 50 nm, about 200 nm, about 50 nm and about 150 nm, respectively). That is, first, on the oxide conductor layer 3050, the Mo/Al/Mo layer is formed at room temperature. Then, on the Mo/Al/Mo layer, an oxide protective film (also called "an oxide conductor layer for protecting the metal layer" corresponding to the thin IZO film in this embodiment) with a thickness of about 150 nm is formed by using an indium oxide-zinc oxide ($In_2O_3$:ZnO=about 90:10 wt %) target by the high-frequency sputtering method in an atmosphere of about 1% oxygen and about 99% argon.

The metal layer 3060 is not limited to the Mo/Al/Mo stacked film, and a stacked thin metal film such as a Ti/Al/Ti film may also be used. Also, a single layer or a multilayer stacked film of a metal such as Al, Mo, Ag and Cu or alloys thereof may also be used.

The second resist 3061 is stacked on the metal layer 3060.

Then, as shown in FIG. 42(b), a second resist 3061 is formed in a predetermined shape by using the second half-tone mask 3062 by half-tone exposure (Step S3003 in FIG. 39). The second resist 3061 covers a gate electrode 3023, a source electrode 3053, a drain electrode 3054, a source wire 3055, a drain wire 3056 and a pixel electrode 3057, and part of the second resist 3061 covering a channel part 3041 is rendered thinner than other parts due to a half-tone mask part 3621.

Figure 43:
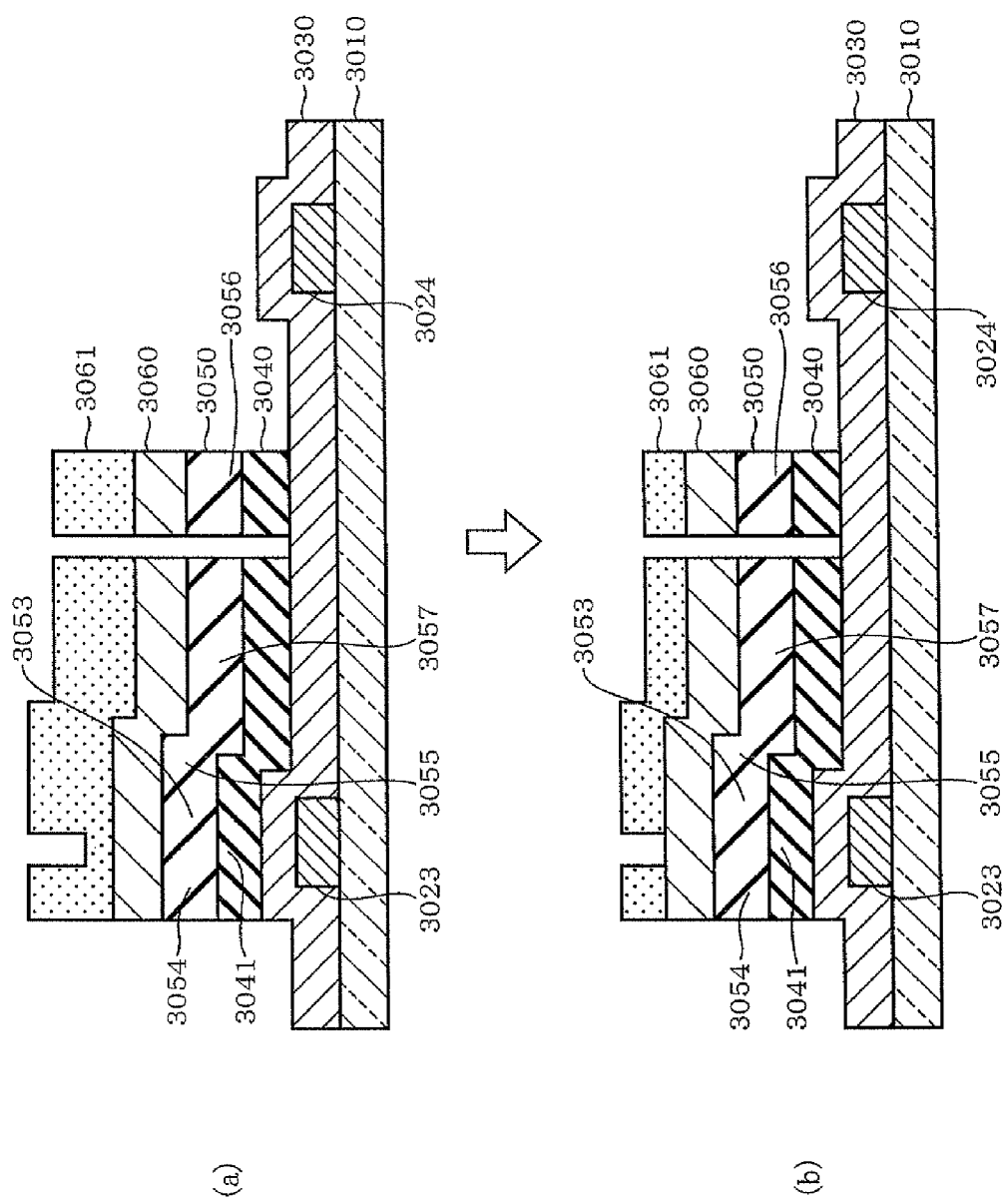
FIG. 43 is a schematic view for explaining treatment using a second half-tone mask in the method for producing a TFT substrate according to the seventh embodiment of the invention, in which (a) is a cross-sectional view after second etching and third etching, and (b) is a cross-sectional view after reformation of a second resist.

FIG. 43 is a schematic view for explaining treatment using a second half-tone mask in the method for producing a TFT substrate according to a seventh embodiment of the invention.

(a) is a cross-sectional view after second etching and third etching. (b) is a cross-sectional view after reformation of a second resist.

In FIG. 43(a), by using the second resist 3061 and an acid mixture, the second etching is conducted for the metal layer (Mo/Al/Mo/IZO layer) 3060. Next, by using the second resist 3061 and an aqueous oxalic acid solution, the third etching is conducted for the oxide conductor layer 3050 and the n-type oxide semiconductor layer 3040. By these etching, a source wire 3055, a drain wire 3056 and a pixel electrode 3057 are formed as desired, and an auxiliary wire which will be mentioned later is formed (Step S3004 in FIG. 39).

Although a space separating the source electrode 3053 and the drain electrode 3054 is not formed by the above-mentioned second and third etching, part of the outline of each of the source electrode 3053, the drain electrode 3054 and an auxiliary electrode which is mentioned later, is formed.

Then, as shown in FIG. 43(b), the above-mentioned second resist 3061 is reformed (Step S3005 in FIG. 39). That is, first, as shown in FIG. 43(b), part of the second resist 3061 above the channel part 3041 which is rendered thinner by half-tone exposure is removed through an ashing process, whereby the second resist 3061 is reformed.

Then, by using the reformed second resist 3061, the metal layer 3060 and the oxide conductor layer 3050 above the gate electrode 3023 are selectively patterned by an etching method, whereby the source electrode 3053 and the drain electrode 3054 are formed and an auxiliary electrode formed of the metal layer 3060 is formed (Step S3005 in FIG. 39).

Then, treatment for forming the source electrode 3053 and the drain electrode 3054 will be explained below referring to the drawing.

Figure 44:
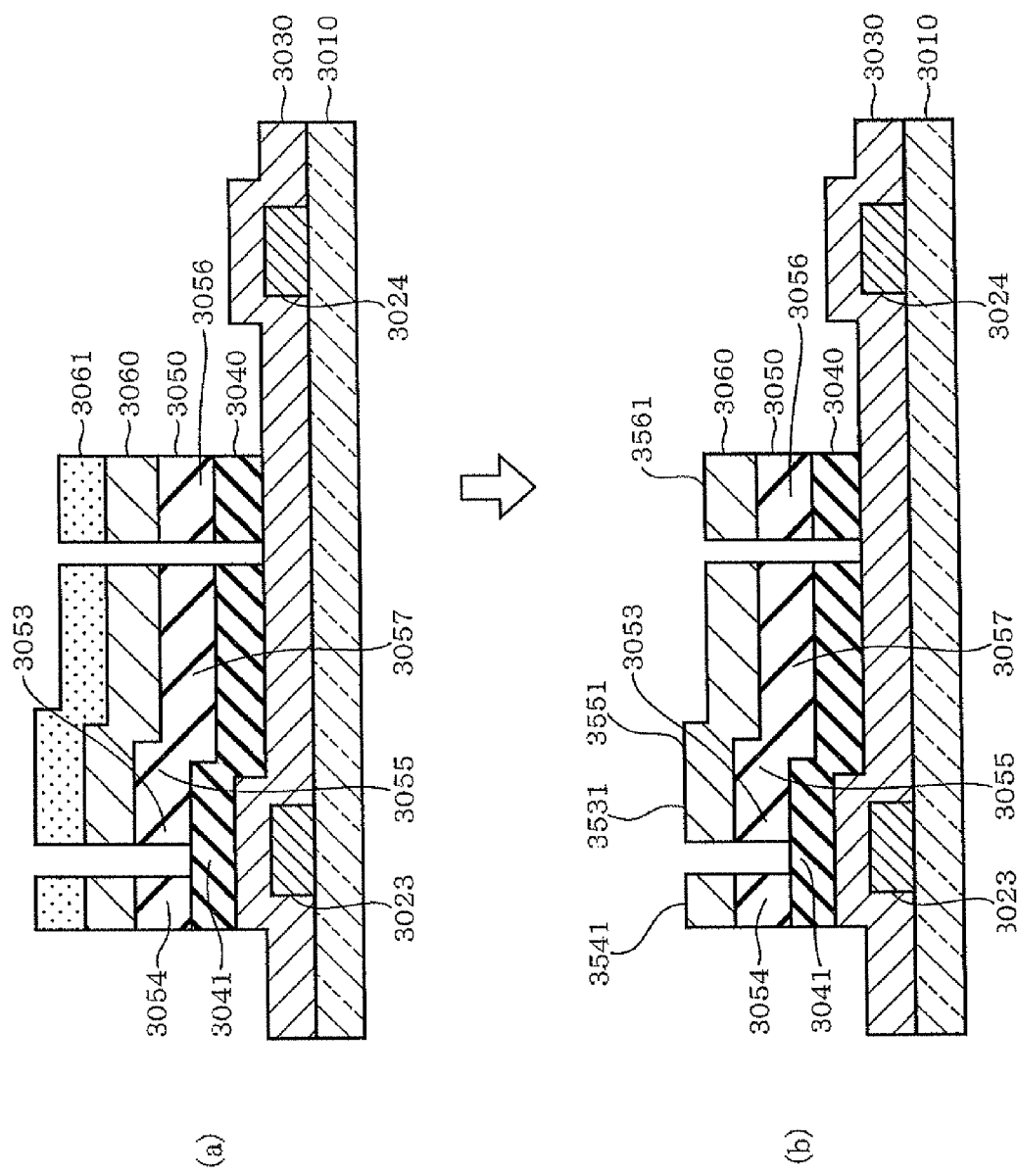
FIG. 44 is a schematic view for explaining treatment using a second half-tone mask in the method for producing a TFT substrate according to the seventh embodiment of the invention, in which (a) is a cross-sectional view after fourth etching and fifth etching, and (b) is a cross-sectional view after peeling off of a second resist.

FIG. 44 is a schematic view for explaining treatment using a second half-tone mask in the method for producing a TFT substrate according to a seventh embodiment of the invention. (a) is a cross-sectional view after fourth etching and fifth etching. (b) is a cross-sectional view after peeling off of a second resist.

In FIG. 44(a), by using the reformed second resist 3061 and an acid mixture, the fourth etching is conducted for the metal layer 3060 above the gate electrode 3023. Next, by using the reformed second resist 3061 and an aqueous oxalic acid solution, the fifth etching is selectively conducted for the oxide conductor layer 3050 (That is, etching is conducted without melting the n-type oxide semiconductor layer 3040 which constitutes the channel part 3041.). As a result of the above-mentioned etching, a channel part 3041 is formed in the n-type oxide semiconductor layer 3040 above the gate electrode 3023. As a result, the TFT substrate 3001 is called a channel etch type TFT.

Here, it is preferred that the n-type oxide semiconductor layer 3040 be heated (for example, at a temperature of 200° C. to 350° C.) and crystallized before conducting the above-mentioned etching. That is, the indium oxide-zinc oxide-gallium oxide ($In_2O_3$:$Ga_2O_3$:ZnO=about 70:27:3 wt %), which is used as the n-type oxide semiconductor layer 3040 in this embodiment, is patterned by an etching method with an aqueous oxalic acid solution in an amorphous state (non-crystallized state). If crystallized, the indium oxide-zinc oxide-gallium oxide is not patterned by an etching method with an aqueous oxalic acid solution or an acid mixture. Due to such crystallization, the n-type oxide semiconductor layer 3040 becomes resistant to chemicals (an aqueous oxalic acid solution in this embodiment) used for etching the oxide conductor layer 3050 present above the n-type oxide semiconductor layer 3040. As a result, problems in which the n-type oxide semiconductor layer 3040 which constitutes the channel part 3041 is eroded can be prevented. In addition, due to crystallization, the n-type oxide semiconductor layer 3040 (an active layer) exhibits stable semiconductive properties.

In the indium oxide-zinc oxide-gallium oxide ($In_2O_3$:$Ga_2O_3$:ZnO=about 70:27:3 wt %) target used for forming the n-type oxide semiconductor layer 3040, it is preferred that zinc oxide be added in an amount of 1 to 6 wt %. It is more preferred that zinc oxide be added in an amount of about 2 to 5 wt %. The reason therefor is as follows. If the amount of the zinc oxide is less than 1 wt %, carrier density may not be lowered, and if the amount exceeds 6 wt %, carrier density may not be lowered or resistance to an acid mixture may be deteriorated without crystallizing.

The indium oxide-tin oxide-zinc oxide ($In_2O_3$:$SnO_2$:ZnO=about 60:20:20 wt %) thin film used as the oxide conductor layer 3050 in this embodiment is not crystallized by heating at 350° C. Preferably, the oxide conductor layer 3050 is not crystallized. Without crystallization, the oxide conductor layer 3050 can be patterned by an etching method with an aqueous oxalic acid solution. In addition, the oxide conductor layer 3050 is not patterned by an etching method with an acid mixture even though it is not crystallized. That is, the oxide conductor layer 3050 has selective etching properties; specifically, while it has resistance to an etching solution for etching the metal layer 3060 above the pixel electrode 3057 (an acid mixture), it can be patterned by an etching method with an etching solution which does not affect the crystallized n-type oxide semiconductor layer 3040 (an aqueous oxalic acid solution). Furthermore, it is important that the oxide conductor layer 3050 has selective etching properties; specifically, it can be patterned by an etching method together with the non-crystallized n-type oxide semiconductor layer 3040 with a predetermined etching solution (an aqueous oxalic acid solution) and can be patterned by an etching method with an etching solution (an aqueous oxalic acid solution) to which the crystallized n-type oxide semiconductor layer 3040 has resistance.

Measurement of an AC hall effect of the above-mentioned n-type oxide semiconductor layer 3040 was conducted (measurement by using "RESITEST", manufactured by Toyo Technica Inc.). The results of the measurement were as follows: carrier density: $10^{+14}$/cm$^3$, mobility: 30 cm$^2$/V·sec. Measurement of an AC hall effect was conducted for the oxide conductor layer 3050. The results of the measurement were as follows: carrier density: $10^{+20}$/cm$^3$, mobility: 38 cm$^2$/V·sec. As mentioned above, the mobility of the active layer is 30 cm$^2$/V·sec or more, which is significantly larger than the mobility of the common amorphous silicon, which is 0.1 to 1 cm$^2$/V·sec. Therefore, the TFT of the present invention is very effective as a switching device. Materials for the n-type oxide semiconductor layer 3040 and the oxide conductor layer 3050 are not limited to those mentioned above.

Figure 45:
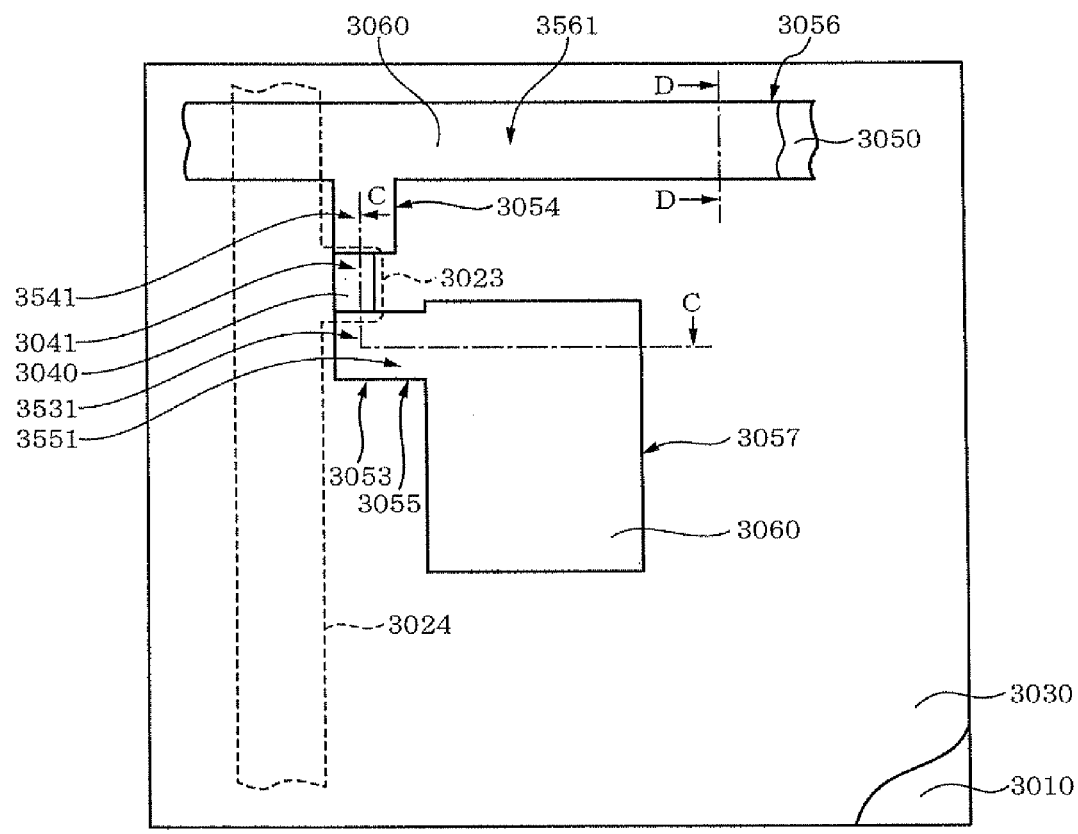
FIG. 45 is a schematic plan view of an essential part of the glass substrate on which an auxiliary electrode for a source electrode, an auxiliary electrode for a drain electrode, an auxiliary wire for a source wire, and an auxiliary wire for a drain wire are exposed in the method for producing a TFT substrate according to the seventh embodiment of the invention.

Then, as shown in FIG. 44(b), the reformed second resist 3061 is removed through an ashing process completely, whereby an auxiliary conductive layer (auxiliary wire and auxiliary electrode (the metal layer 3060 on the pixel electrode 3057 is patterned by an etching method later)) formed of the metal layer 3060, which is formed on a source electrode 3053, a drain electrode 3054, a source wire 3055, a drain wire 3056 and the pixel electrode 3057, is exposed. That is, an auxiliary electrode for the source electrode 3531, an auxiliary electrode for the drain electrode 3541, an auxiliary wire for the source wire 3551 and an auxiliary wire for the drain wire 3561, each being formed of the metal layer 3060, are exposed (see FIG. 45). The drain electrode 3054, the channel part 3041, the source electrode 3053, the source wire 3055 and the pixel electrode 3057 shown in FIG. 44(b) are cross-sectional views taken along line C-C in FIG. 45. The drain wire 3056 shown in FIG. 44(b) is a cross-sectional view taken along line D-D in FIG. 45.

As shown in FIG. 39, a protective insulating film 3070 and a third resist 3071 are stacked in this order on the exposed gate insulating film 3030 and the exposed n-type oxide semiconductor layer 3040, as well as on the exposed metal layer 3060 formed on the source wire 3055, the drain wire 3056, the source electrode 3053, the drain electrode 3054 and the pixel electrode 3057 (Step S3006), and the third resist 3071 is formed in a predetermined shape by using a third mask 3072 (Step S3007).

Next, treatment using the third mask 3072 will be explained.

(Treatment Using a Third Mask)

Figure 46:
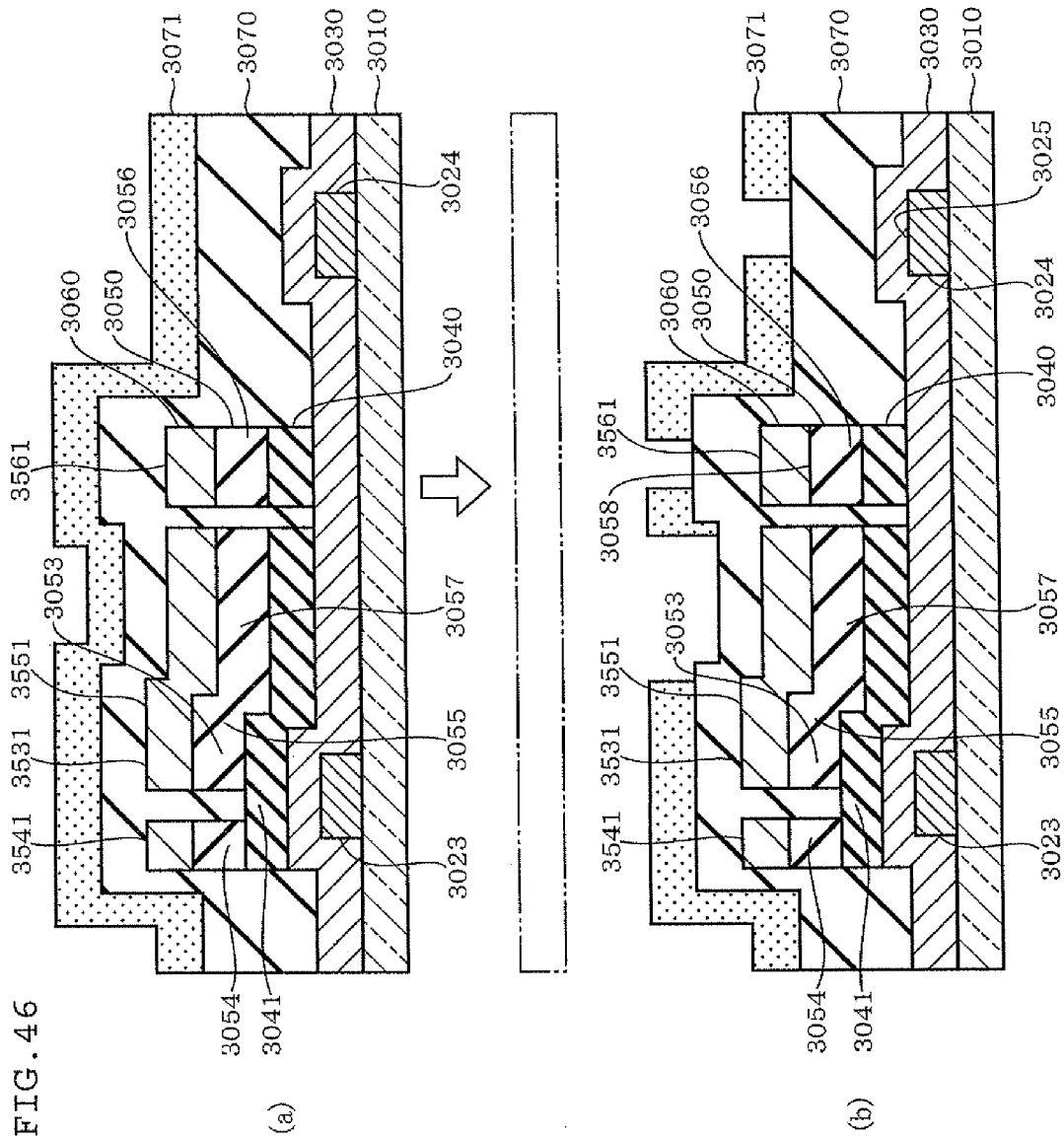
FIG. 46 is a schematic view for explaining treatment using a third mask in the method for producing a TFT substrate according to the seventh embodiment of the invention, in which (a) is a cross-sectional view after formation of a protective insulating film and application of a resist, and (b) is a cross-sectional view after exposure and development.

FIG. 46 is a schematic view for explaining treatment using a third mask in the method for producing a TFT substrate according to a seventh embodiment of the invention. (a) is a cross-sectional view after formation of a protective insulating film and application of a resist. (b) is a cross-sectional view after exposure and development.

In FIG. 46(a), first, a protective insulating film 3070 which is a silicon nitride (SiNx) film is deposited on the TFT substrate 3001 on which the channel part 3041 is formed in a thickness of about 200 nm by the glow discharge CVD method. An $SiH_4$—$NH_3$—$N_2$-based mixed gas is used as a discharge gas. Subsequently, the third resist 3071 is stacked on the protective insulating film 3070 (Step S3006).

Then, as shown in FIG. 46(b), the third resist 3071 is formed in a predetermined shape by using the third mask 3072 (Step S3007). The third resist 3071 is formed in such a shape that the third resist 3071 covers the protective insulating film 3070 entirely except for the part above the pixel electrode 3057, the drain wire pad 3058 and the gate wire pad 3025.

Figure 47:
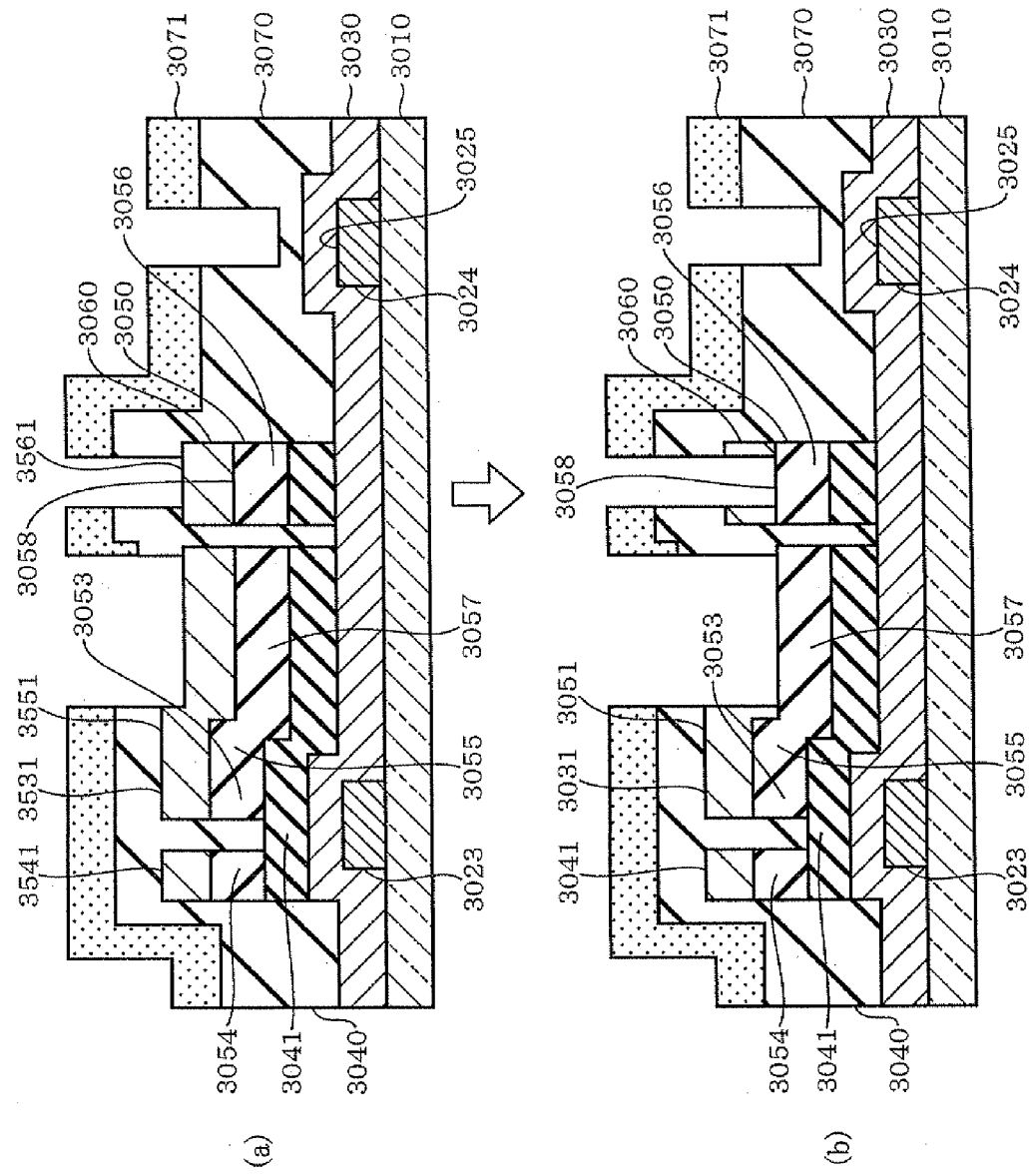
FIG. 47 is a schematic view for explaining treatment using a third mask in the method for producing a TFT substrate according to the seventh embodiment of the invention, in which (a) is a cross-sectional view after sixth etching, and (b) is a cross-sectional view after seventh etching.

FIG. 47 is a schematic view for explaining treatment using a third mask in the method for producing a TFT substrate according to the seventh embodiment of the invention. (a) is a cross-sectional view after sixth etching. (b) is a cross-sectional view after seventh etching.

In FIG. 47(a), as the sixth etching, the protective insulating film 3070 above the pixel electrode 3057 and the drain wire pad 3058, as well as the protective insulating film 3070 above the gate wire pad 3025 are patterned by a dry etching method using the third resist 3071 and CHF ($CF_4$, $CHF_3$, or the like) (Step S3008 in FIG. 39), whereby the metal layer 3060 on the pixel electrode 3057 and the drain wire pad 3058 is exposed. Since the gate insulating film 3030 and the protective insulating film 3070 are stacked on the gate wire pad 3025, the gate wire pad 3025 is not usually exposed by the above-mentioned sixth etching.

Next, as shown in FIG. 47(b), as the seventh etching, the metal layer 3060 on the pixel electrode 3057 and the drain wire pad 3058 is patterned by an etching method using the third resist 3071 and an acid mixture (Step S3009 in FIG. 39), whereby the pixel electrode 3057 and the drain wire pad 3058 are exposed. Here, the metal layer 3060 on the pixel electrode 3057 is patterned by an etching method and the pixel electrode 3057 is exposed, whereby a transparent pixel electrode is formed.

Figure 48:
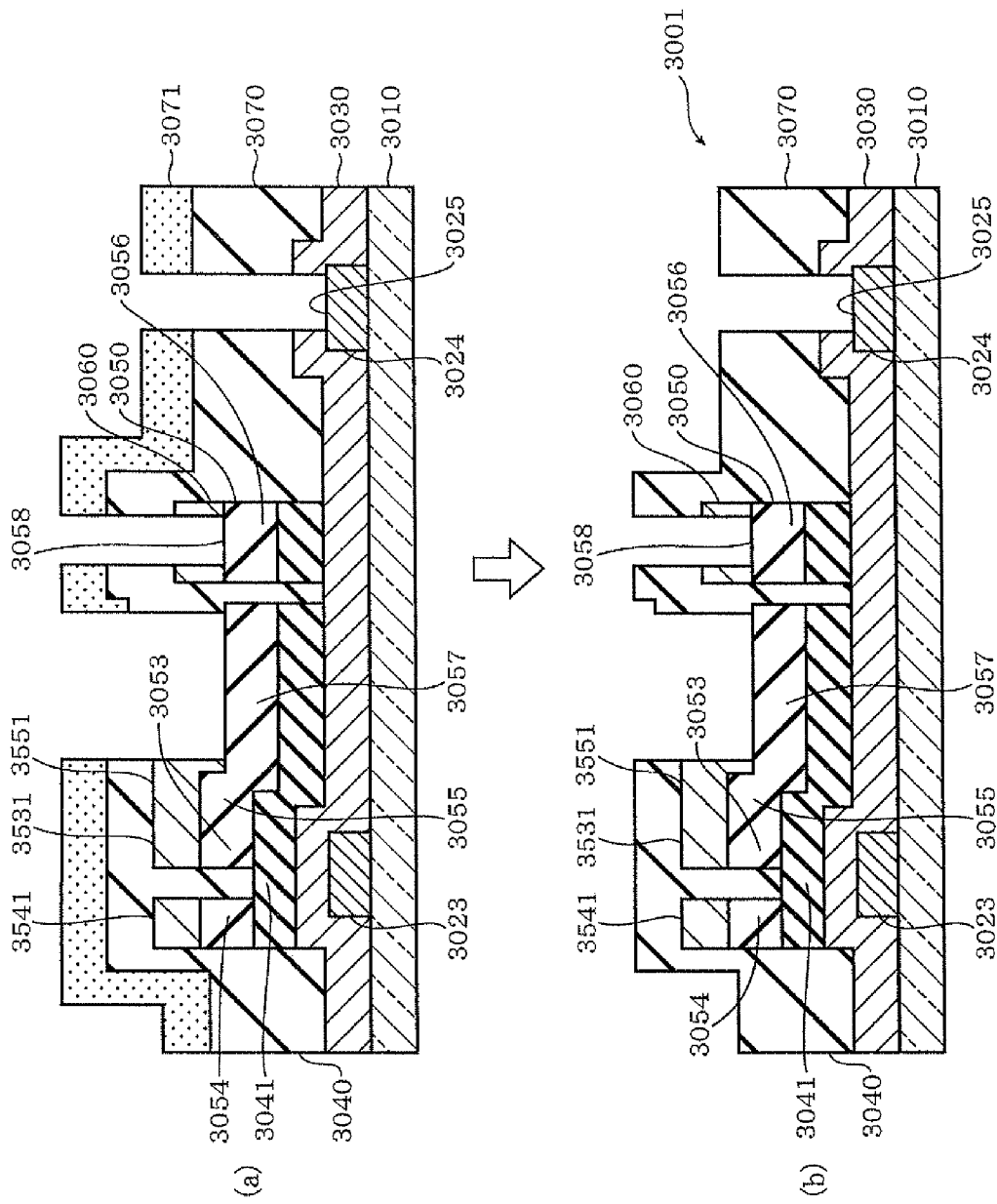
FIG. 48 is a schematic view for explaining treatment using a third mask in the method for producing a TFT substrate according to the seventh embodiment of the invention, in which (a) is a cross-sectional view after eighth etching, and (b) is a cross-sectional view after peeling off of a third resist.

FIG. 48 is a schematic view for explaining treatment using a third mask in the method for producing a TFT substrate according to the seventh embodiment of the invention. (a) is a cross-sectional view after eighth etching. (b) is a cross-sectional view after peeling off of a third resist.

In FIG. 48(a), as the eighth etching, the protective insulating film 3070 and the gate insulating film 3030 above the gate wire pad 3025 is patterned by a dry etching method using the third resist 3071 and CHF ($CF_4$, $CHF_3$, or the like), whereby the gate wire pad 3025 is exposed (Step S3010 in FIG. 39).

Figure 49:
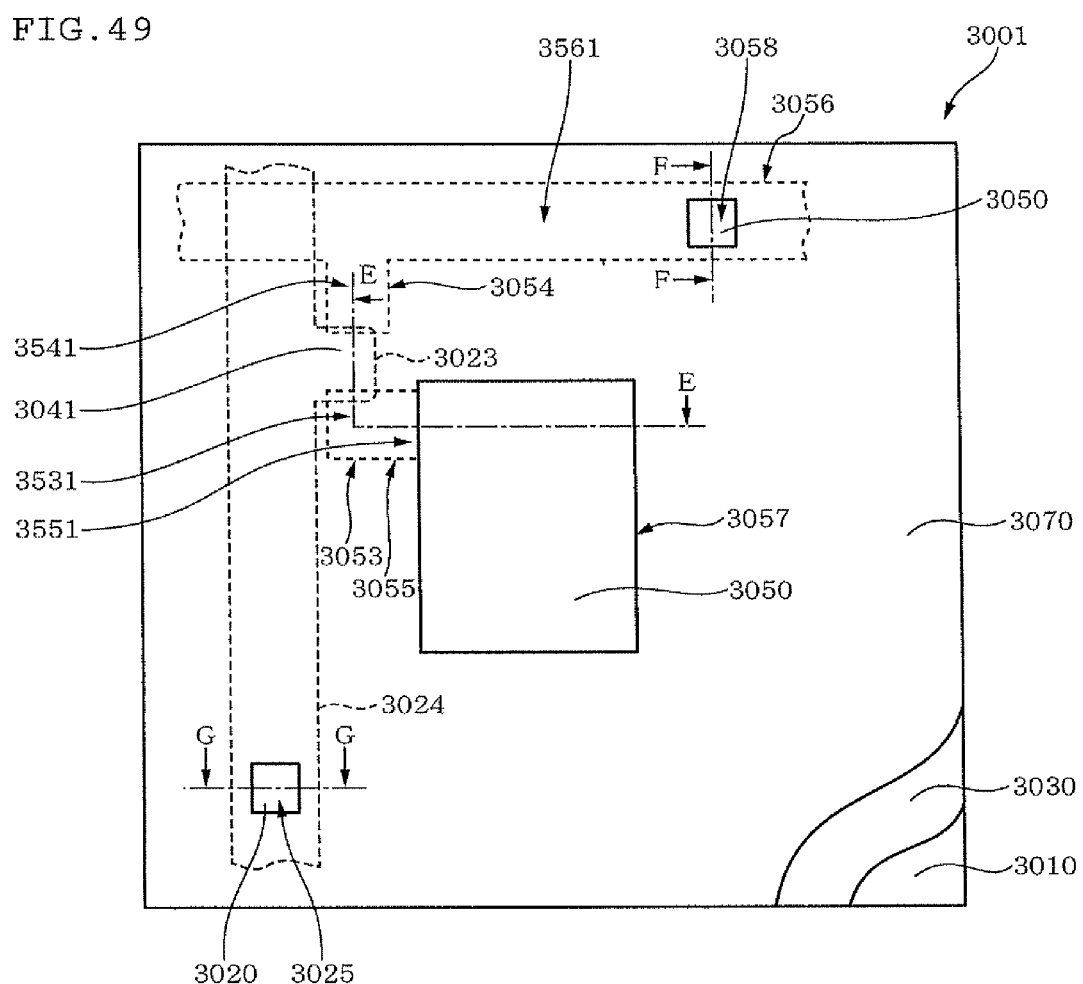
FIG. 49 is a schematic plan view of an essential part of a TFT substrate produced according to the seventh embodiment of the method for producing a TFT substrate in which a protective insulating film is exposed.

Then, by removing the reformed third resist 3071 through an ashing process, as shown in FIG. 49, on the substrate 3010, the protective insulating film 3070 is exposed except for an area above the pixel electrode 3057, the drain wire pad 3058 and the gate wire pad 3025. The drain electrode 3054, the channel part 3041, the gate electrode 3023, the source electrode 3053, the source wire 3055 and the pixel electrode 3057 shown in FIG. 48(b) are cross-sectional views taken along line E-E in FIG. 49. The drain wire pad 3058 shown in FIG. 48(b) is a cross-sectional view taken along line F-F in FIG. 49. The gate wire pad 3025 shown in FIG. 48(b) is a cross-sectional view taken along line G-G in FIG. 49.

As mentioned hereinabove, according to the method for producing a TFT substrate 3001 in this embodiment, production cost can be significantly reduced by decreasing the number of steps in the production process. In addition, since the upper part of the n-type oxide semiconductor layer 3040 in the channel part 3041 is protected by the protective insulating film 3070, the TFT substrate 3001 can be operated stably for a prolong period of time. In addition, since the n-type oxide semiconductor layer 3040 is normally formed only at a predetermined position (a position corresponding to each of the channel part 3041, the source wire 3055, the drain wire 3056, the source electrode 3053, the drain electrode 3054 and the pixel electrode 3057), concern for occurrence of interference between gate wires 3024 (cross talk) can be eliminated. Further, due to the presence of the protective insulating film 3070, an organic EL apparatus can be readily obtained by providing organic EL materials, electrodes and protective films on the TFT substrate 3001.

In addition, by forming an auxiliary electrode for the source electrode 3531, an auxiliary electrode for the drain electrode 3541, an auxiliary electrode for the source wire 3551 and an auxiliary electrode for the drain wire 3561, each being formed of the metal layer 3060, the electric resistance of each of the source electrode 3053, the drain electrode 3054, the source wire 3055 and the drain wire 3056 can be decreased. As a result, reliability can be improved and a decrease in energy efficiency can be suppressed.

In this embodiment, the thin film for gate electrode/wire 3020 and the first resist 3021 are stacked on the glass substrate 3010. Further, the gate insulating film 3030, the n-type oxide conductor layer 3040, the oxide conductor layer 3050, the metal layer 3060 and the second resist 3061 are stacked thereon. In addition, the protective insulating layer 3070 and the third resist 3071 are stacked. However, the stacking manner is not restricted thereto. For example, other layers (layers which do not impair the functions or effects of this embodiment or allow other functions or effects to be exhibited) may be interposed between these layers. The same applies to the embodiments given later.

This embodiment is advantageous as an invention of a TFT substrate, and the above-mentioned TFT substrate 3001 corresponds to claims 1, 22, 23, 24, 25, 26, 27, 28, 29, 33, and 34.

As shown in FIG. 48(b) and FIG. 49, the TFT substrate 3001 is provided with the glass substrate 3010, the gate electrode 3023 and the gate wire 3024 formed on the glass substrate 3010, the gate insulating film 3030 formed on the glass substrate 3010, the gate electrode 3023 and the gate wire 3024, the n-type oxide semiconductor layer 3040 formed on the gate insulating film 3030 at least above the gate electrode 3023, and the oxide conductor layer 3050 formed on the n-type oxide semiconductor layer 3040 with the channel part 3041 interposed therebetween. That is, the n-type oxide semiconductor layer 3040 is provided as the first oxide layer and the oxide conductor layer 3050 is provided as the second oxide layer. In the TFT substrate 3001, by using the n-type oxide semiconductor layer 3040 as an active layer for a TFT, electric current flows stably. This is advantageous for an organic EL apparatus which is operated under current control mode. Furthermore, the channel part 3041, the source electrode 3053 and the drain electrode 3054 can be readily formed.

In the TFT substrate 3001, the source wire 3055, the drain wire 3056, the source electrode 3053, the drain electrode 3054 and the pixel electrode 3057 are formed from the oxide conductor layer 3050. That is, by the above-mentioned production method according to the seventh embodiment, a TFT substrate can be produced by using three masks (first mask 3022, second half-tone mask 3062, third mask 3072), leading to reduced production steps. As a result, production efficiency can be improved and production cost can be decreased. Further, in the TFT substrate 3001, since the pixel electrode 3057 and the source wire 3055, as well as the drain wire 3056, the source electrode 3053 and the drain electrode 3054 are formed from the oxide conductor layer 3050, the source wire 3055, the drain wire 3056, the source electrode 3053, the drain electrode 3054 and the pixel electrode 3057 can be produced efficiently.

In addition, in the TFT substrate 3001, the upper part of the TFT substrate 3001 is covered by the protective insulating film 3070 and the protective insulating film 3070 has openings to expose the pixel electrode 3057, the drain wire pad 3058 and the gate wire pad 3025 at positions corresponding to each of the pixel electrode 3057, the drain wire pad 3058 and the gate wire pad 3025. That is, usually, the protective insulating film 3070 covers the part above the TFT substrate 3001 entirely except for the part above the exposed pixel electrode 3057, the exposed drain wire pad 3058 and the exposed gate wire pad 3025. Due to such a configuration, since the upper part of the n-type oxide semiconductor layer 3040 of the channel part 3041 is protected by the protective insulating film 3070, the TFT substrate 3001 can be operated stably for a prolonged period of time. Furthermore, due to the provision of the protective insulating film 3070 in the TFT substrate 3001, the TFT substrate 3001 capable of producing readily a display means or an emitting means utilizing a liquid crystal, an organic EL material and so on can be provided.

In the TFT substrate 3001, the pixel electrode 3057 is formed of a stacked film of the n-type oxide semiconductor layer 3040 and the oxide conductor layer 3050. Due to such a configuration, malfunction caused by light can be prevented since the stacked film can be rendered transparent.

Further, in the TFT substrate 3001, the n-type oxide semiconductor layer 3040 is formed under the oxide conductor layer 3050 and the oxide conductor layer 3050 and the n-type oxide semiconductor layer 3040 can be rendered transparent, whereby prevention of malfunction caused by light can be ensured.

In addition, the energy gap of the n-type oxide semiconductor layer 3040 and the oxide conductor layer 3050 is 3.0 eV or more. By rendering the energy gap 3.0 eV or more, malfunction caused by light can be prevented.

Further, on the source wire 3055, the drain wire 3056, the source electrode 3053 and the drain electrode 3054, the auxiliary electrode for the source wire 3551, the auxiliary electrode for the drain wire 3561, the auxiliary electrode for the source electrode 3531 and the auxiliary electrode for the drain electrode 3541, each being formed of the metal layer 3060, are formed. Due to such a configuration, the electric resistance of each of the wire 3055 and 3056 and the electrode 3053 and 3054 can be decreased. As a result, reliability can be improved and a decrease in energy efficiency can be suppressed.

In addition, in the TFT substrate 3001, the n-type oxide semiconductor layer 3040 is formed only at a predetermined position corresponding to each of the channel part 3041, the source wire 3055, the drain wire 3056, the source electrode 3053, the drain electrode 3054 and the pixel electrode 3057. That is, the n-type oxide semiconductor layer 3040 which is present in an area except for the above-mentioned predetermined position is entirely removed by an etching method. Due to such a configuration, since the n-type oxide semiconductor layer 3040 is normally formed only at the predetermined position, concern for occurrence of interference between gate wires 3024 (cross talk) can be eliminated.

In the TFT substrate 3001, the auxiliary conductive layer is formed on the source electrode 3053, the drain electrode 3054, the source wire 3055 and the drain wire 3056. The invention is, however, not limited to this configuration. For example, a configuration in which the auxiliary conductive layer is formed on at least one of the source electrode 3053, the drain electrode 3054, the source wire 3055, the drain wire 3056 and the pixel electrode 3057 may also be possible. That is, by forming an auxiliary conductive layer (not shown) (formed of the metal layer 3060), which is connected with the auxiliary wire for the source wire 3551, on part of the pixel electrode 3057, the auxiliary conductive layer serves to improve electric conductivity of the pixel electrode 3057 and operation reliability. The shape of the above-mentioned auxiliary conductive layer is not specifically restricted. For example, the auxiliary conductive layer may have a shape similar to a comb-shaped electrode.

As mentioned hereinabove, the TFT substrate 3001 of this embodiment can significantly reduce production cost by decreasing the number of steps in the production process, and can be operated stably for a prolonged period of time since the upper part of the n-type oxide semiconductor layer 3040 of the channel part 3041 is covered by the protective insulating film 3070. Further, due to the presence of the protective insulating film 3070, an organic EL apparatus can be readily obtained by providing organic EL materials, electrodes and protective films on the TFT substrate 3001. In addition, by forming an auxiliary electrode for the source electrode 3531, an auxiliary electrode for the drain electrode 3541, an auxiliary electrode for the source wire 3551 and an auxiliary electrode for the drain wire 3561, each being formed of the metal layer 3060, the electric resistance of each of the source electrode 3053, the drain electrode 3054, the source wire 3055 and the drain wire 3056 is decreased. As a result, reliability can be improved and a decrease in energy efficiency can be suppressed. Further, since the n-type oxide semiconductor layer 3040 is formed only at the predetermined position, concern for occurrence of interference between gate wires 3024 (cross talk) can be eliminated.

Method for Producing a TFT Substrate According to a Eighth Embodiment

The method for producing a TFT substrate in this embodiment is a method in which three masks are used, and corresponds to claim 35.

Figure 50:
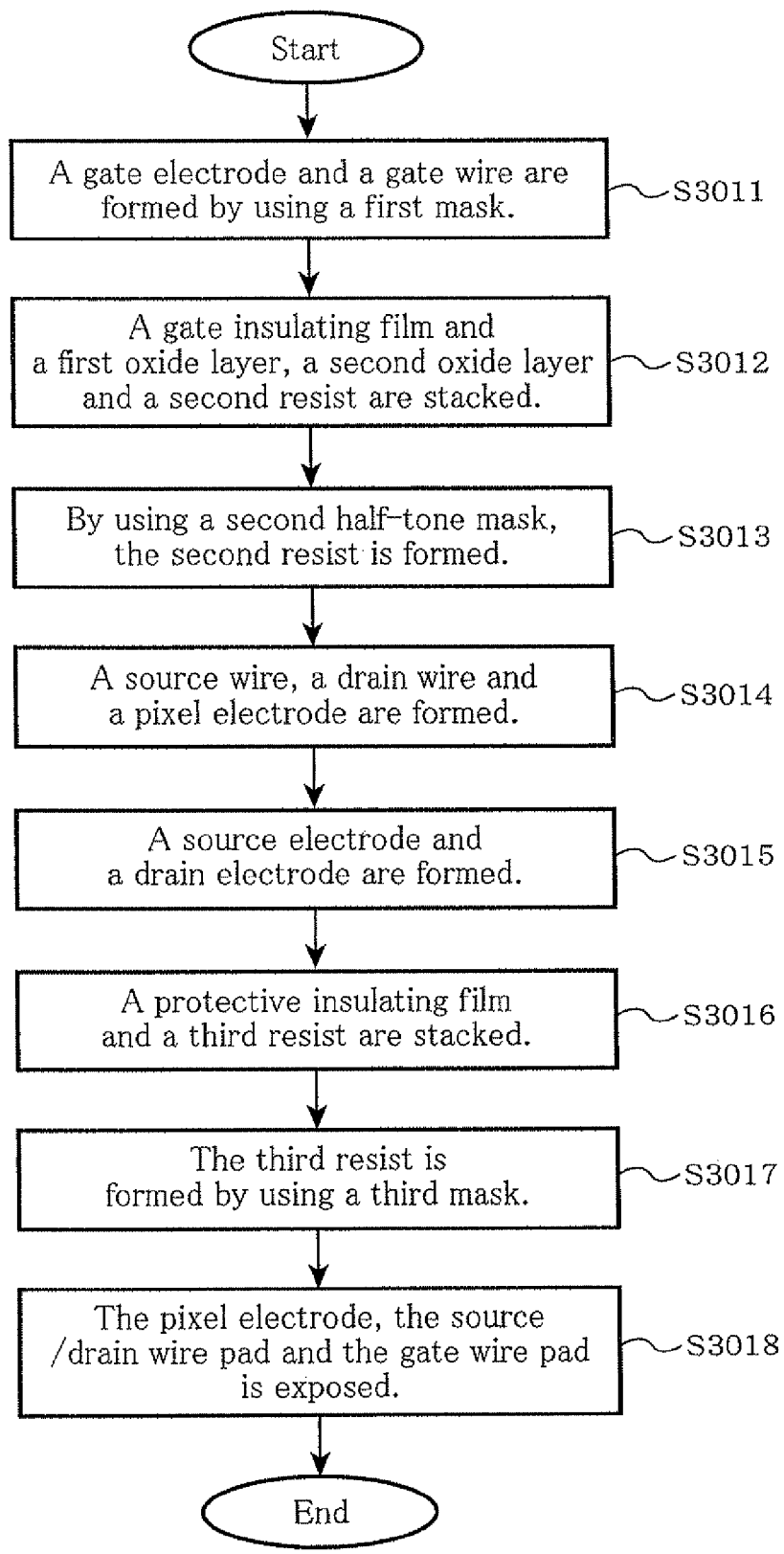
FIG. 50 is a schematic flow chart for explaining the method for producing a TFT substrate according to an eighth embodiment of the invention.

FIG. 50 is a schematic flow chart for explaining the method for producing a TFT substrate according to the eighth embodiment of the invention.

As shown in FIG. 50, a gate electrode 3023 and a gate wire 3024 are formed on a substrate 3010 by using a first mask 3022 (Step S3011).

Treatment using the first mask 3022 in step S3011 is similar to treatment using the first mask 3022 in step S3001 of the seventh embodiment.

Then, as shown in FIG. 50, on the glass substrate 3010, the gate electrode 3023 and the gate wire 3024, a gate insulating film 3030, an n-type oxide semiconductor layer 3040 as the first oxide layer, an oxide conductor layer 3050 as the second oxide layer and a second resist 3051 are stacked in this order (Step S3012), and the second resist 3051 is formed in a predetermined shape by half-tone exposure using a second half-tone mask 3052 (Step S3013).

Subsequently, treatment using the second half-tone mask 3052 will be explained below referring to the drawing.
(Treatment Using a Second Half-Tone Mask)

Figure 51:
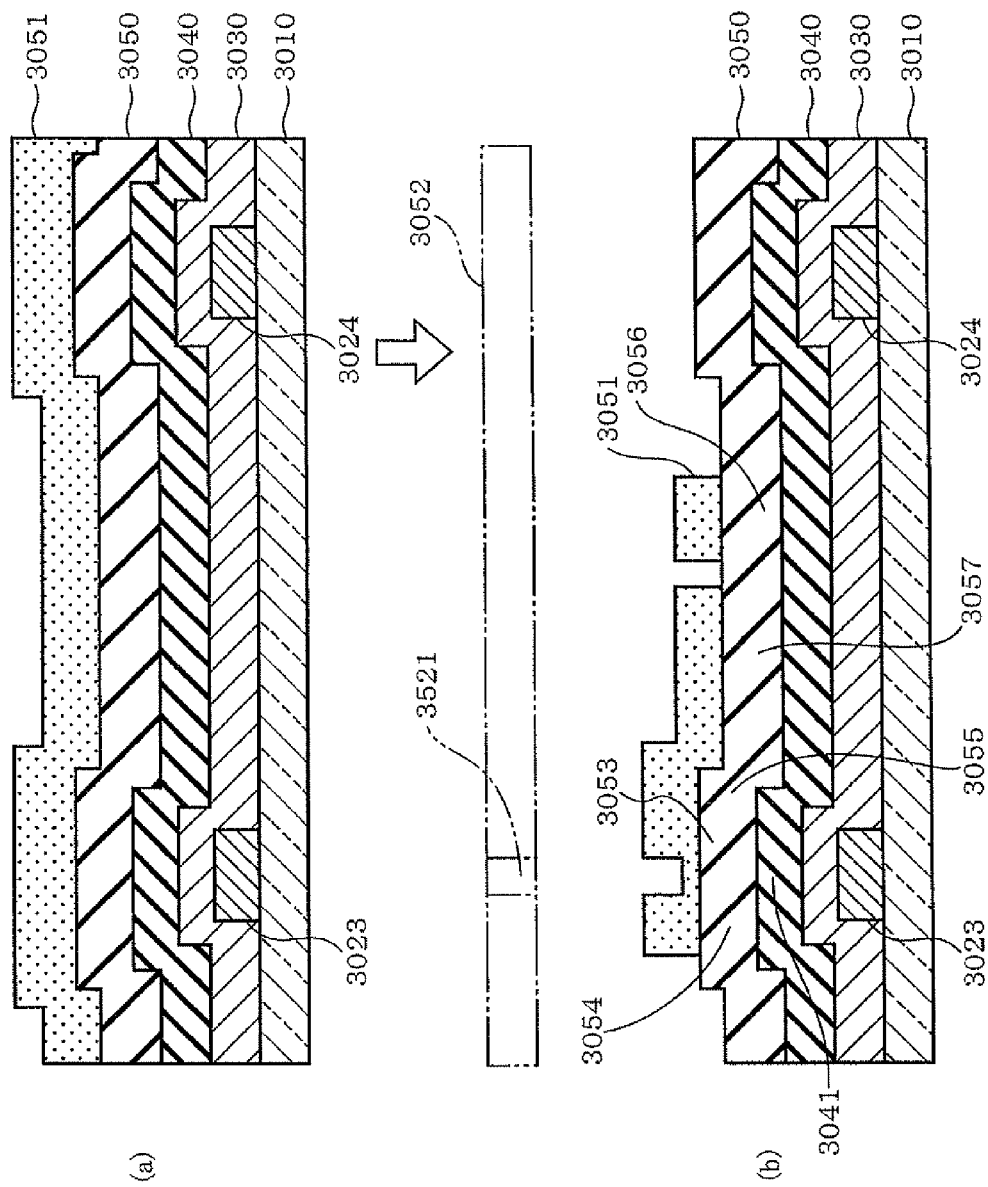
FIG. 51 is a schematic view for explaining treatment using a second half-tone mask in the method for producing a TFT substrate according to the eighth embodiment of the invention, in which (a) is a cross-sectional view after formation of a gate insulating film, an n-type oxide semiconductor layer, an oxide conductor layer, and application of a resist, and (b) is a cross-sectional view after half-tone exposure and development.

FIG. 51 is a schematic view for explaining treatment using a second half-tone mask in the method for producing a TFT substrate according to a eighth embodiment of the invention. (a) is a cross-sectional view after formation of a gate insulating film, an n-type oxide semiconductor layer, an oxide conductor layer, and application of a resist. (b) is a cross-sectional view after half-tone exposure and development.

In FIG. 51(a), a gate insulating film 3030, which is a silicon nitride (SiNx) film, is deposited in a thickness of about 300 nm by the glow discharge CVD (Chemical Vapor Deposition) method on the glass substrate 3010, the gate electrode 3023 and the gate wire 3024. In this embodiment, an $SiH_4$—$NH_3$—$N_2$-based mixed gas is used as a discharge gas.

Then, on the gate insulating film 3030, an n-type oxide semiconductor layer (an active layer) 3040 with a thickness of about 100 nm is formed by using an indium oxide-zinc oxide-gallium oxide ($In_2O_3$:$Ga_2O_3$:ZnO=about 70:27:3 wt %) target by the high-frequency sputtering method in an atmosphere of about 10% oxygen and about 90% argon with a substrate temperature of about 200° C. or less (i.e., under the conditions where the n-type oxide semiconductor layer 3040 is not crystallized).

Subsequently, an oxide conductor layer 3050 with a thickness of about 150 nm is formed on the n-type oxide semiconductor layer 3040 by using an indium oxide-zinc oxide-tin oxide ($In_2O_3$:ZnO:$SnO_2$=about 60:20:20 wt %) target by the high-frequency sputtering method in an atmosphere of about 1% oxygen and about 99% argon, and further, under the conditions where the oxide conductor layer 3050 is not crystallized.

Then, on the oxide conductor layer 3050, a second resist 3051 is stacked (Step S3012).

Then, as shown in FIG. 51(b), a second resist 3051 is formed in a predetermined shape by using the second half-tone mask 3052 by half-tone exposure (Step S3013 in FIG. 50). The second resist 3051 covers a gate electrode 3023, a source electrode 3053, a drain electrode 3054, a source wire 3055, a drain wire 3056 and a pixel electrode 3057, and part of the second resist 3051 covering a channel part 3041 is rendered thinner than other parts due to a half-tone mask part 3521.

Figure 52:
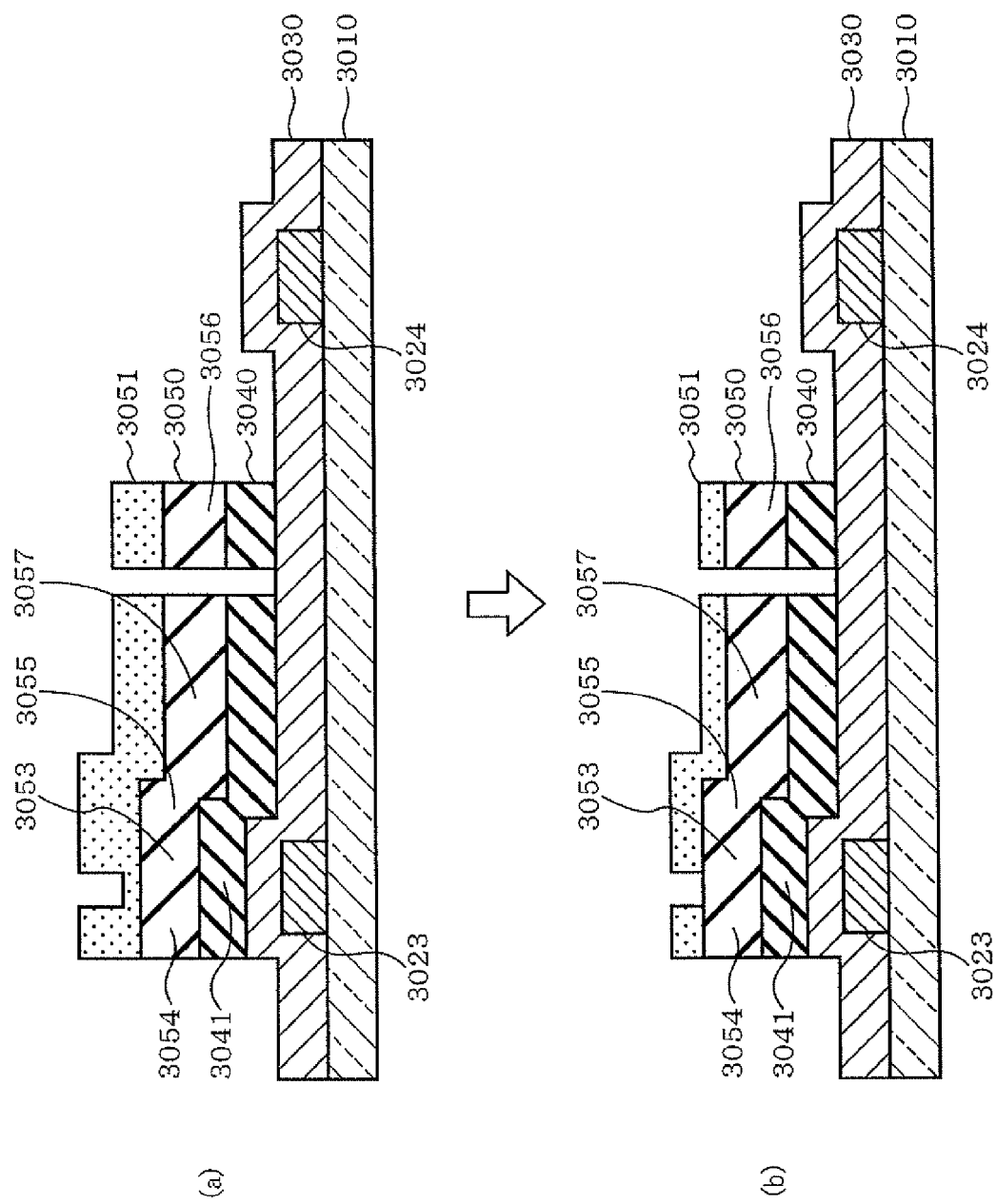
FIG. 52 is a schematic view for explaining treatment using a second half-tone mask in the method for producing a TFT substrate according to the eighth embodiment of the invention, in which (a) is a cross-sectional view after second etching, and (b) is a cross-sectional view after reformation of a second resist.

FIG. 52 is a schematic view for explaining treatment using a second half-tone mask in the method for producing a TFT substrate according to the eighth embodiment of the invention. (a) is a cross-sectional view after second etching. (b) is a cross-sectional view after reformation of a second resist.

In FIG. 52(a), by using the second resist 3051 and an aqueous oxalic acid solution, the second etching is conducted for the oxide conductor layer 3050 and the n-type oxide semiconductor layer 3040, whereby a source wire 3055, a drain wire 3056 and a pixel electrode 3057 are formed as desired (Step S3014 in FIG. 50).

Then, as shown in FIG. 52(b), the above-mentioned second resist 3051 is reformed. That is, first, as shown in FIG. 52(b), part of the second resist 3051 above the channel part 3041 which is rendered thinner by half-tone exposure is removed through an ashing process, whereby the second resist 3051 is reformed.

Then, by using the reformed second resist 3051, the oxide conductor layer 3050 above the gate electrode 3023 are selectively patterned by an etching method, whereby the source electrode 3053 and the drain electrode 3054 are formed (Step S3015 in FIG. 50).

Then, treatment for forming the source electrode 3053 and the drain electrode 3054 will be explained below referring to the drawing.

Figure 53:
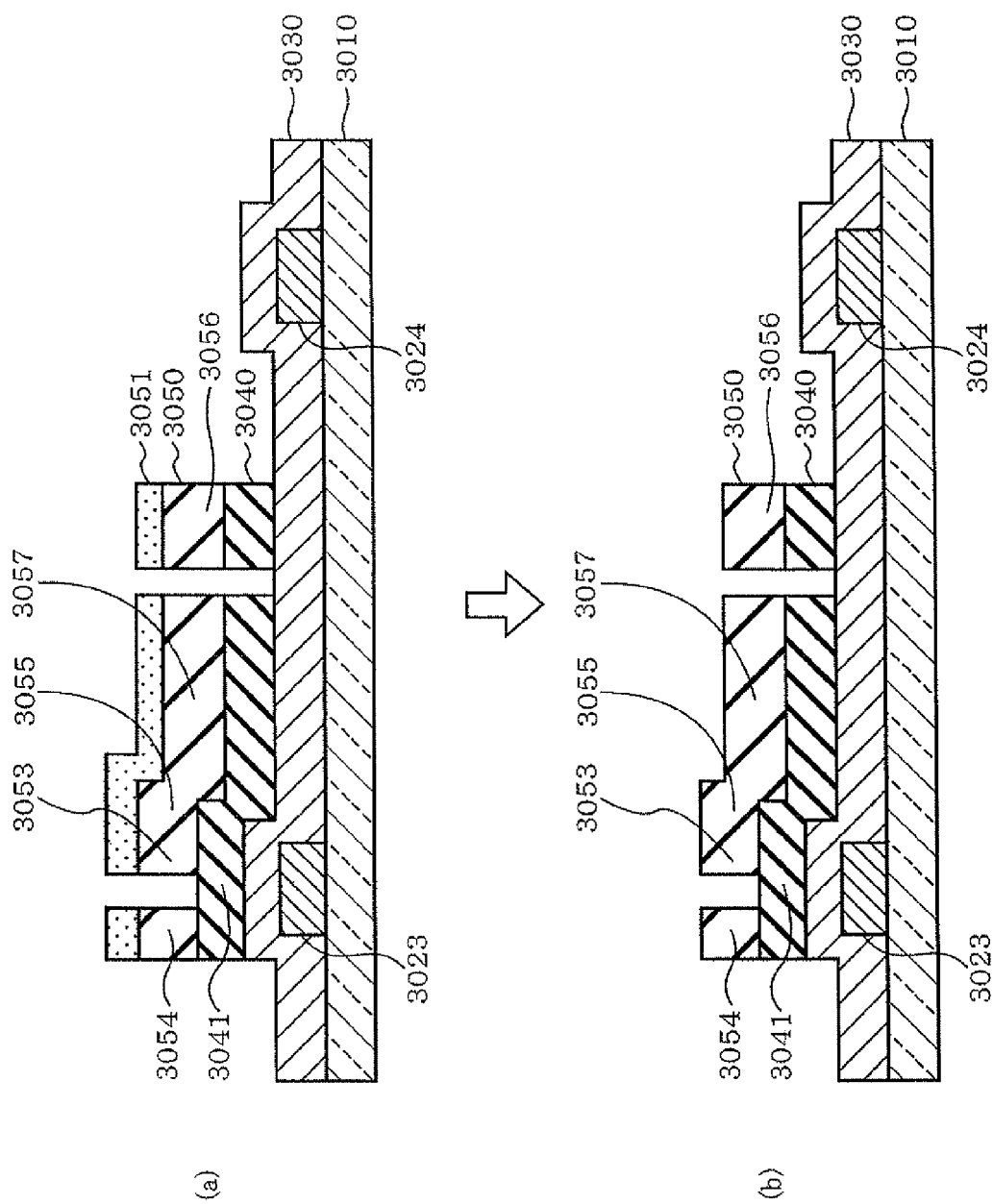
FIG. 53 is a schematic view for explaining treatment using a second half-tone mask in the method for producing a TFT substrate according to the eighth embodiment of the invention, in which (a) is a cross-sectional view after third etching, and (b) is a cross-sectional view after peeling off of a second resist.

FIG. 53 is a schematic view for explaining treatment using a second half-tone mask in the method for producing a TFT substrate according to the eighth embodiment of the invention. (a) is a cross-sectional view after third etching. (b) is a cross-sectional view after peeling off of a second resist.

In FIG. 53(a), by using the reformed second resist 3051 and an aqueous oxalic acid solution, the third etching is selectively conducted for the oxide conductor layer 3050 (i.e., patterning by an etching method is conducted without melting the n-type oxide semiconductor layer 3040 which constitutes the channel part 3041). As a result of the above-mentioned etching, a channel part 3041 is formed in the n-type oxide semiconductor layer 3040 above the gate electrode 3023.

Here, it is preferred that, before conducting the patterning by an etching method, the n-type oxide semiconductor layer 3040 be heated (for example, at a temperature of 200° C. to 350° C.) and crystallized. That is, since the crystallized n-type oxide semiconductor layer 3040 becomes resistant to chemicals used for patterning the oxide conductor layer 3050 present above by an etching method (an aqueous oxalic acid solution in this embodiment), a problem in which the n-type oxide semiconductor layer 3040 which constitutes the channel part 3041 is eroded can be prevented. In addition, it is important that the oxide conductor layer 3050 has selective etching properties; specifically, it can be patterned by an etching method together with the non-crystallized n-type oxide semiconductor layer 3040 with a predetermined etching solution (an aqueous oxalic acid solution) and can be patterned by an etching method with an etching solution (an aqueous oxalic acid solution) to which the crystallized n-type oxide semiconductor layer 3040 has resistance.

Figure 54:
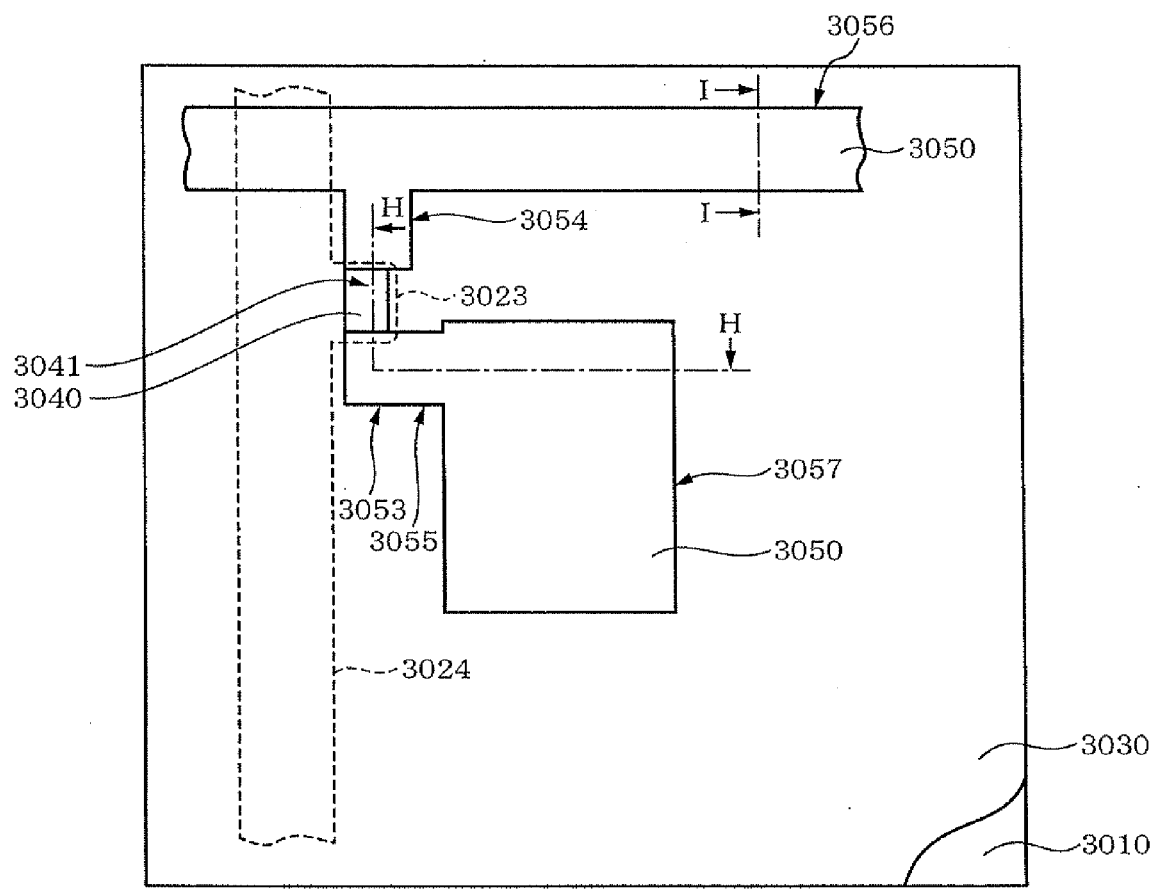
FIG. 54 is a schematic plan view of an essential part of the glass substrate on which a source electrode, a drain electrode, a source wire, a drain wire, and a pixel electrode are exposed in the method for producing a TFT substrate according to the eighth embodiment of the invention.

Then, as shown in FIG. 53(b), the reformed second resist 3051 is removed through an ashing process completely, whereby a source electrode 3053, a drain electrode 3054, a source wire 3055, a drain wire 3056 and the pixel electrode 3057 are exposed (see FIG. 54). The drain electrode 3054, the channel part 3041, the source electrode 3053, the source wire 3055 and the pixel electrode 3057 shown in FIG. 53(b) are cross-sectional views taken along line H-H in FIG. 54. The drain wire 3056 shown in FIG. 53(b) is a cross-sectional view taken along line I-I in FIG. 54.

As shown in FIG. 50, a protective insulating film 3070 and a third resist 3071 are stacked in this order on the exposed gate insulating film 3030 and the exposed n-type oxide semiconductor layer 3040, as well as on the source wire 3055, the drain wire 3056, the source electrode 3053, the drain electrode 3054 and the pixel electrode 3057 (Step S3016), and the third resist 3071 is formed in a predetermined shape by using a third mask 3072 (Step S3017).

Next, treatment using the third mask 3072 will be explained.

(Treatment Using a Third Mask)

Figure 55:
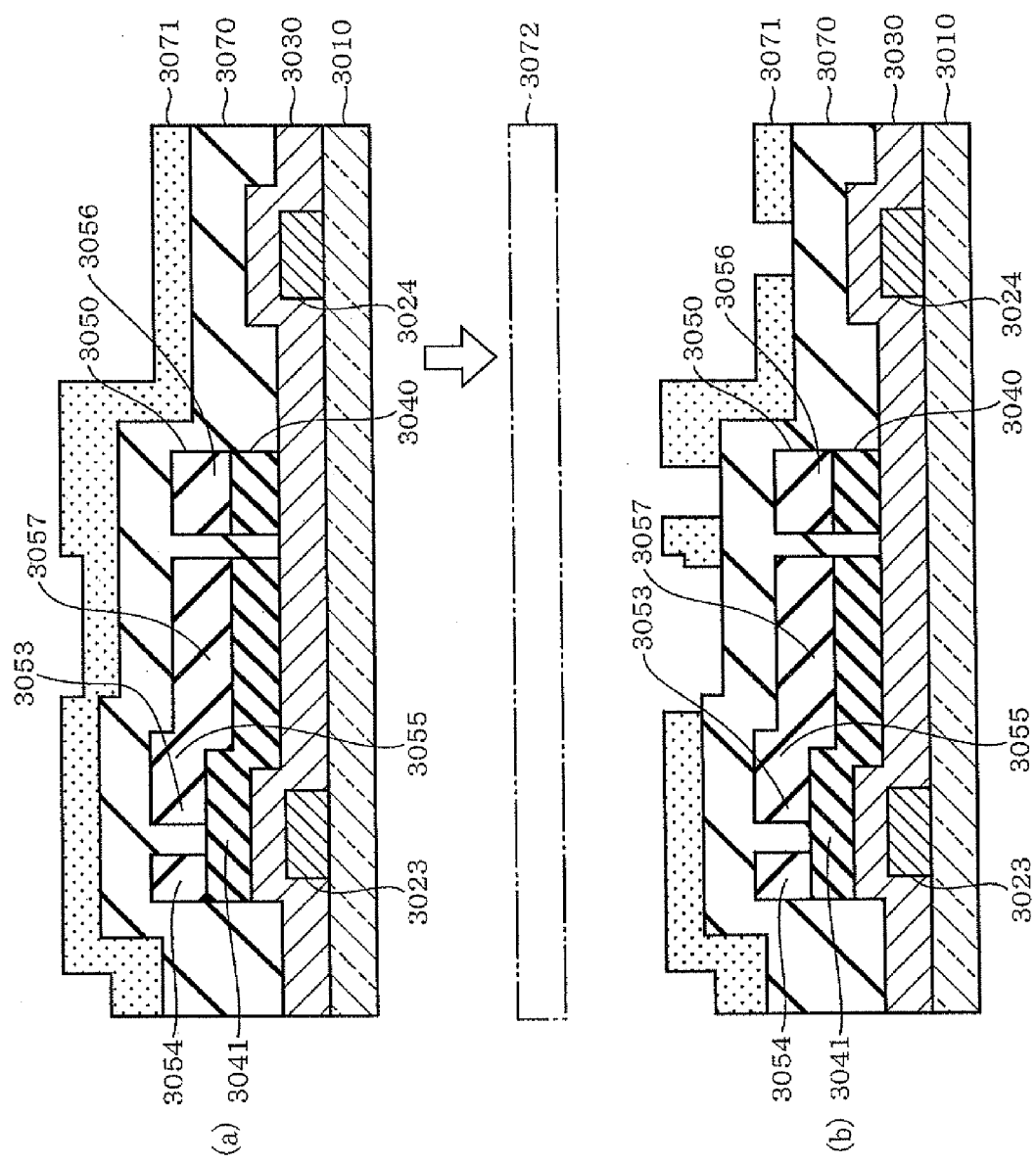
FIG. 55 is a schematic view for explaining treatment using a third mask in the method for producing a TFT substrate according to the eighth embodiment of the invention, in which (a) is a cross-sectional view after formation of a protective insulating film and application of a resist, and (b) is a cross-sectional view after exposure and development.

FIG. 55 is a schematic view for explaining treatment using a third mask in the method for producing a TFT substrate according to the eighth embodiment of the invention. (a) is a cross-sectional view after formation of a protective insulating film and application of a resist. (b) is a cross-sectional view after exposure and development.

In FIG. 55(a), first, a protective insulating film 3070 which is a silicon nitride (SiNx) film is deposited on the TFT substrate 3001a on which the channel part 3041 is formed in a thickness of about 200 nm by the glow discharge CVD method. An $SiH_4$—$NH_3$—$N_2$-based mixed gas is used as a discharge gas. Subsequently, the third resist 3071 is stacked on the protective insulating film 3070 (Step S3016).

Then, as shown in FIG. 55(b), the third resist 3071 is formed in a predetermined shape by using the third mask 3072 (Step S3017). The third resist 3071 is formed in such a shape that the third resist 3071 covers the protective insulating film 3070 entirely except for the part above the pixel electrode 3057, the drain wire pad 3058 and the gate wire pad 3025.

Figure 56:
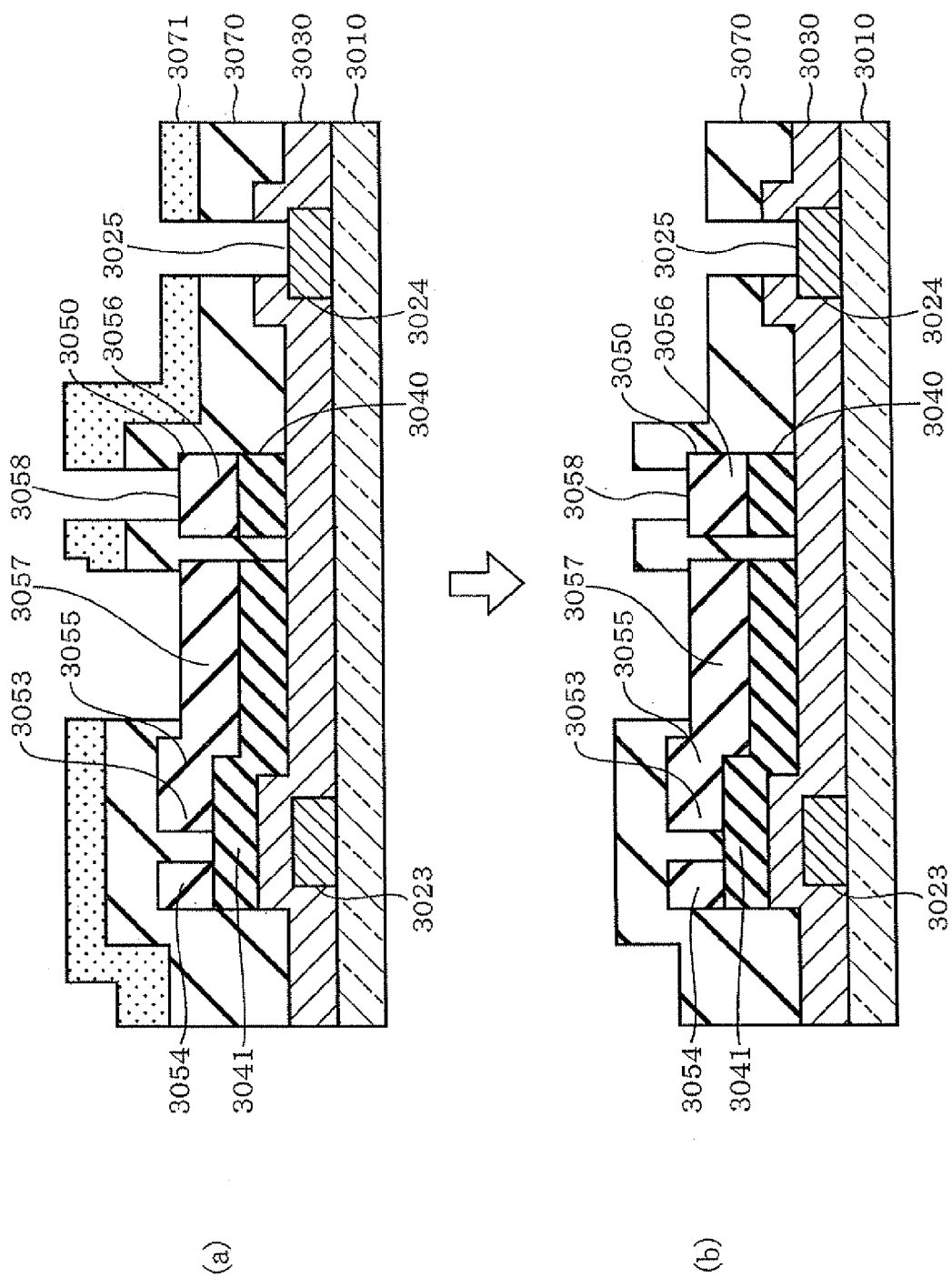
FIG. 56 is a schematic view for explaining treatment using a third mask in the method for producing a TFT substrate according to the eighth embodiment of the invention, in which (a) is a cross-sectional view after fourth etching, and (b) is a cross-sectional view after peeling off of a third resist.

FIG. 56 is a schematic view for explaining treatment using a third mask in the method for producing a TFT substrate according to a eighth embodiment of the invention. (a) is a cross-sectional view after fourth etching. (b) is a cross-sectional view after peeling off of a third resist.

In FIG. 56(a), as the fourth etching, the protective insulating film 3070 above the pixel electrode 3057 and the drain wire pad 3058, as well as the protective insulating film 3070 and the gate insulating film 3030 above the gate wire pad 3025 are patterned by a dry etching method using the third resist 3071 and CHF ($CF_4$, $CHF_3$, or the like) (Step S3018 in FIG. 50), whereby the pixel electrode 3057, the drain wire pad 3058 and the gate wire pad 3025 are exposed.

Figure 57:
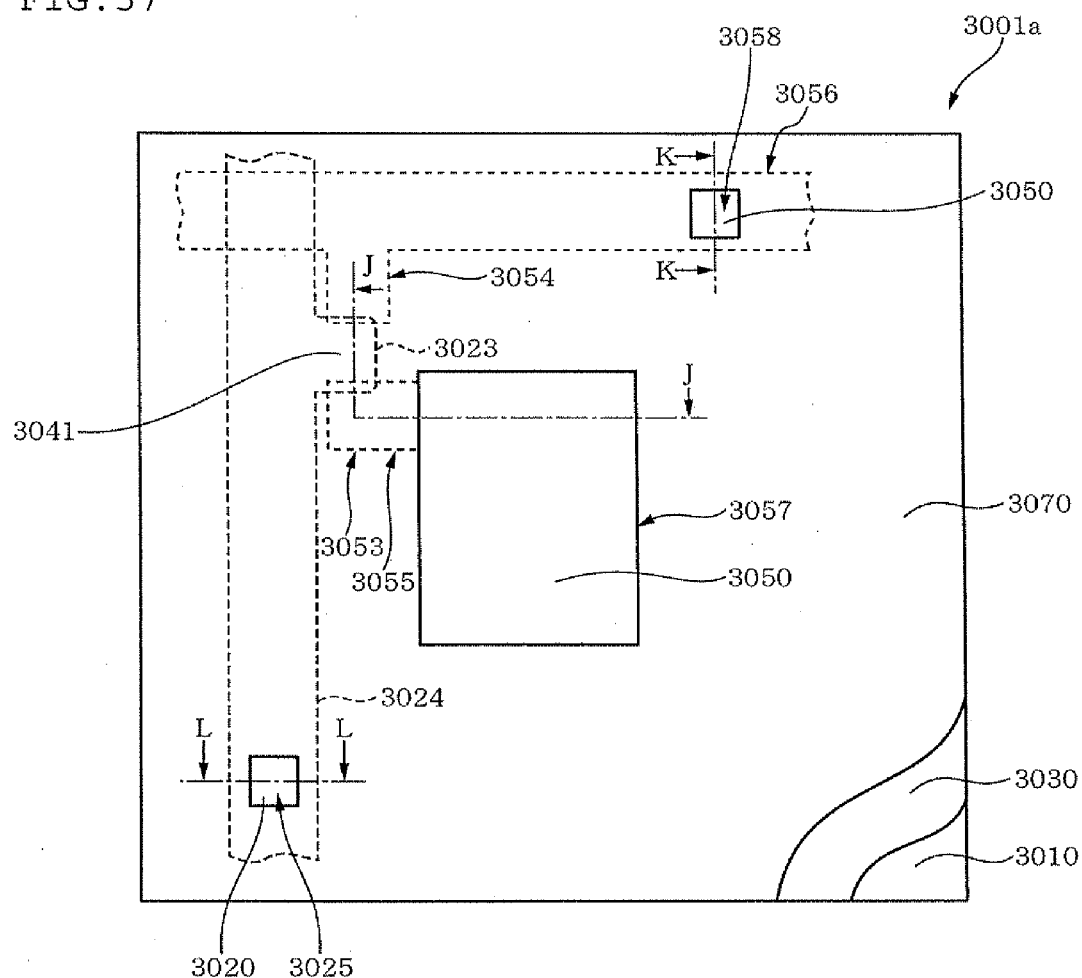
FIG. 57 is a schematic plan view of an essential part of a TFT substrate produced according to the eighth embodiment of the method for producing a TFT substrate in which a protective insulating film is exposed.

Then, as shown in FIG. 56(b), by removing the third resist 3071 through an ashing process, as shown in FIG. 57, on the substrate 3010, the protective insulating film 3070 is exposed except for an area above the pixel electrode 3057, the drain wire pad 3058 and the gate wire pad 3025. The drain electrode 3054, the channel part 3041, the gate electrode 3023, the source electrode 3053, the source wire 3055 and the pixel electrode 3057 shown in FIG. 56(b) are cross-sectional views taken along line J-J in FIG. 57. The drain wire pad 3058 shown in FIG. 56(b) is a cross-sectional view taken along line K-K in FIG. 57. The gate wire pad 3025 shown in FIG. 56(b) is a cross-sectional view taken along line L-L in FIG. 57.

As mentioned hereinabove, according to the method for producing a TFT substrate 3001a in this embodiment, production cost can be significantly reduced by decreasing the number of steps in the production process. In addition, since the upper part of the n-type oxide semiconductor layer 3040 in the channel part 3041 is protected by the protective insulating film 3070, the TFT substrate 3001a can be operated for a prolong period of time. Further, since the n-type oxide semiconductor layer 3040 is normally formed only at a predetermined position (a position corresponding to each of the channel part 3041, the source wire 3055, the drain wire 3056, the source electrode 3053, the drain electrode 3054 and the pixel electrode 3057), concern for occurrence of interference between gate wires 3024 (cross talk) can be eliminated.

This embodiment is advantageous as an invention of a TFT substrate, and the above-mentioned TFT substrate 3001a corresponds to claims 1, 22, 23, 24, 25, 26, 28, 29, 33, 34.

In comparison to the TFT substrate 3001, as shown in FIG. 56(b), the TFT substrate 3001a differs from the TFT substrate 3001 in that an auxiliary wire for the source wire 3551, an auxiliary wire for the drain wire 3561, an auxiliary electrode for the source electrode 3531, and an auxiliary electrode for the drain electrode 3541, each being formed of the metal layer 3060, are not formed on the source wire 3055, the drain wire 3056, the source electrode 3053 and the drain electrode 3054. That is, by the above-mentioned production method according to the seventh embodiment, the TFT substrate 3001a can be produced by using three masks (first mask 3022, second mask 3052, third mask 3072), whereby many production steps are reduced as compared with the TFT substrate 3001. As a result, production efficiency can be improved and production cost can be decreased.

As mentioned hereinabove, the TFT substrate 3001a of this embodiment has an effect almost equivalent to that of the TFT substrate 3001 (except for the effect of an auxiliary conductive layer) and production steps are reduced as compared with the TFT substrate 3001. As a result, production efficiency can be further improved and production cost can be decreased.

Method for Producing a TFT Substrate According to a Ninth Embodiment

The method for producing a TFT substrate in this embodiment is a method in which three masks are used, and corresponds to claims 37 and 38.

Figure 58:
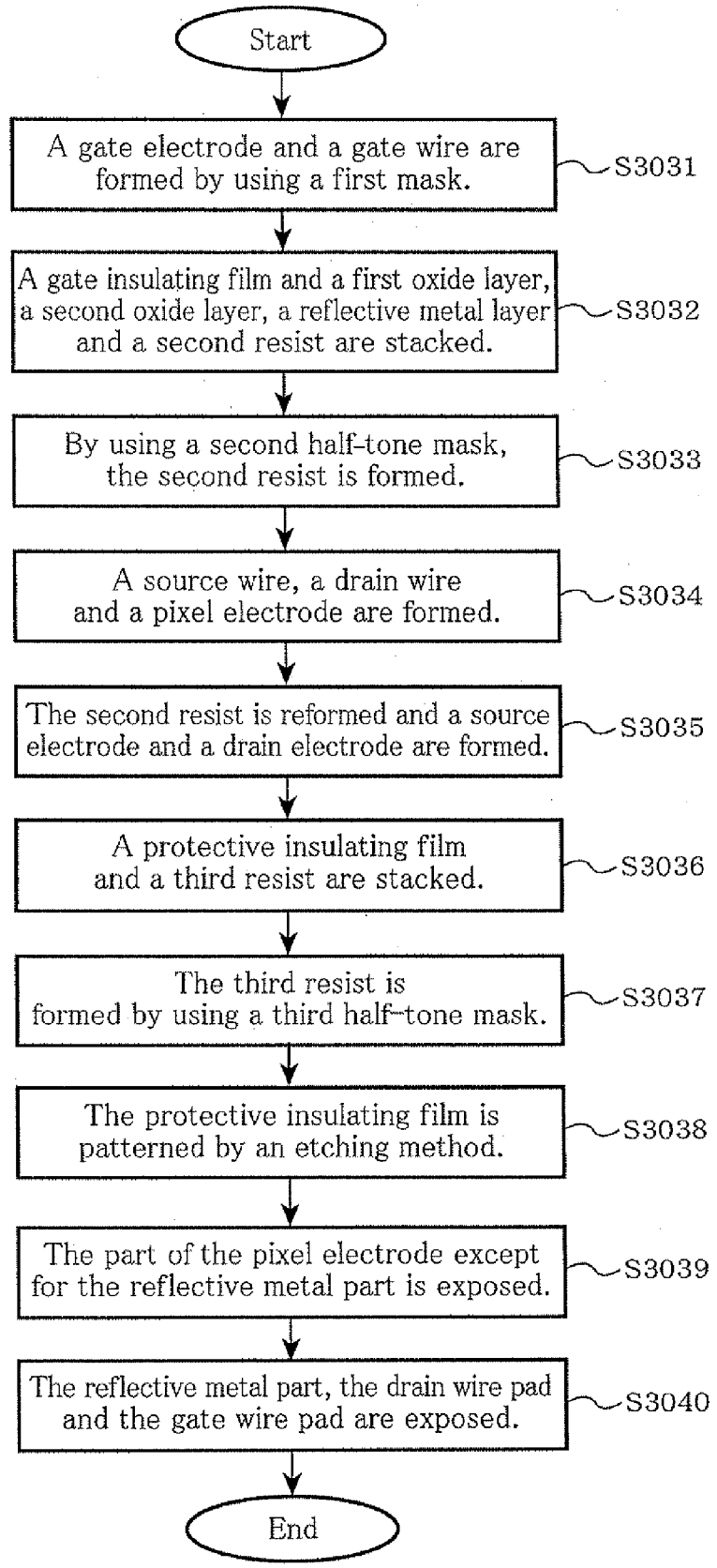
FIG. 58 is a schematic flow chart for explaining the method for producing a TFT substrate according to a ninth embodiment of the invention.

FIG. 58 is a schematic flow chart for explaining the method for producing a TFT substrate according to a ninth embodiment of the invention.

As shown in FIG. 58, a gate electrode 3023 and a gate wire 3024 are formed on a substrate 3010 by using a first mask 3022 (Step S3031).

Next, treatment using the first mask 3022 will be explained below referring to the drawing.
(Treatment Using a First Mask)

Figure 59:
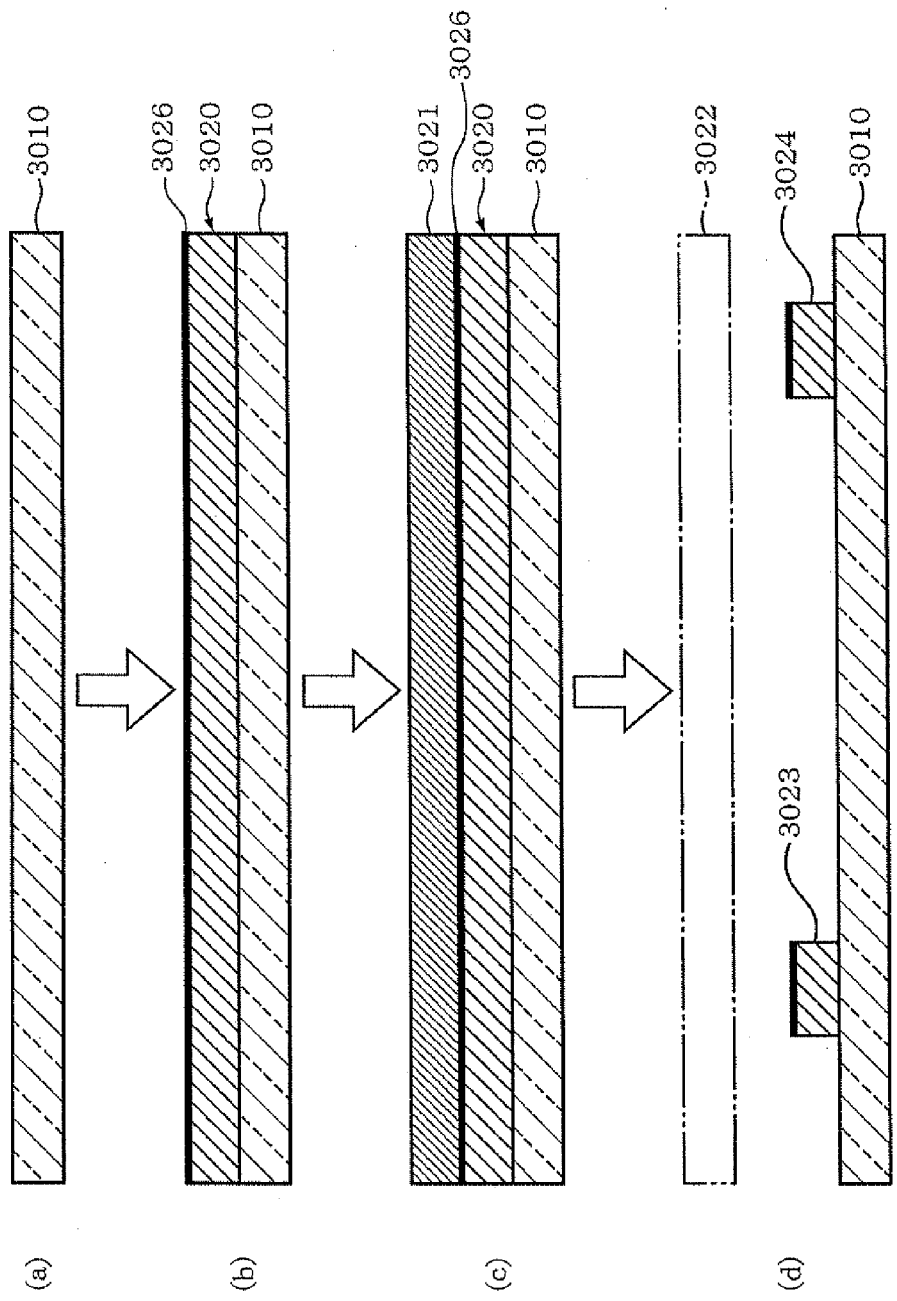
FIG. 59 is a schematic view for explaining treatment using a first mask in the method for producing a TFT substrate according to the ninth embodiment of the invention, in which (a) is a cross-sectional view of a glass substrate before the treatment, (b) is a cross-sectional view after formation of a metal film and an oxide conductor layer for protecting the metal layer, (c) is a cross-sectional view after application of a resist, and (d) is a cross-sectional view after formation of a gate electrode and a gate wire as a result of exposure, development, first etching and peeling off of the resist.

FIG. 59 is a schematic view for explaining treatment using a first mask in the method for producing a TFT substrate according to the ninth embodiment of the invention. (a) is a cross-sectional view of the glass substrate before the treatment. (b) is a cross-sectional view after formation of a metal film and an oxide conductor layer for protecting the metal layer. (c) is a cross-sectional view after application of a resist. (d) is a cross-sectional view after formation of a gate electrode and a gate wire as a result of exposure, development, first etching and peeling off of the resist.

In FIG. 59(a), a light-transmissive glass substrate 3010 is provided at first.

Then, as shown in FIG. 59(b), a metal film is formed on the glass substrate 3010, and a thin film for gate electrode/wire (a thin film for a gate electrode and a gate wire) 3020 is formed.

In this embodiment, on the glass substrate 3010, Al and Mo are stacked in this order by the high frequency sputtering method. As a result, a thin metal film with a thickness of about 250 nm and a thin metal film with a thickness of about 50 nm are formed respectively. Subsequently, an oxide conductor layer for protecting the metal layer (hereinafter occasionally abbreviated as an oxide protective film) 3026 with a thickness of about 100 nm is formed by using an indium oxide-zinc oxide (IZO:$In_2O_3$:ZnO=about 90:10 wt %) sputtering target, whereby the thin film for a gate electrode/wire 3020 formed of Al/Mo/IZO is formed.

Here, a transparent conductive film such as IZO and ITSmO is positioned on the surface of the gate wire 3024 as the oxide conductor layer for protecting the metal layer 3026. Due to such a configuration, an opening 3251 is formed in the gate insulating film 3030, and the surface of the metal used in the gate wire 3024 is not exposed when the gate wire pad 3025 is formed. As a result, highly reliable connection can be attained.

When the opening 3251 is formed in the gate insulating film 3030, an insulating substance such as SiNx, SiONx and $SiO_2$ is used in the insulating film 3030. When the opening 3251 is formed by reactive ion etching using CHF (e.g. $CF_4$, $CHF_3$), an oxide conductive film such as IZO serves as a protective film of the thin metal film (Al/Mo layer).

Then, as shown in FIG. 59(c), a first resist 3021 is applied on the thin film for a gate electrode/wire 3020.

Figure 60:
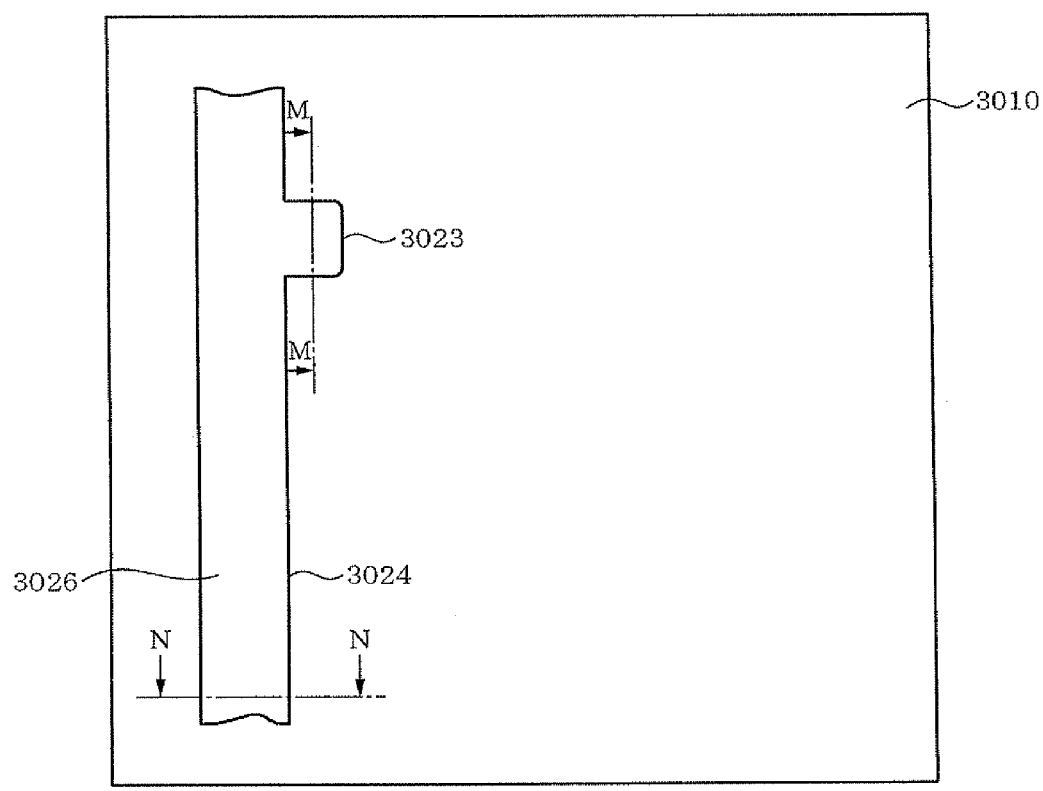
FIG. 60 is a schematic plan view of an essential part of the glass substrate on which a gate electrode and a gate wire are formed in the method for producing a TFT substrate according to the ninth embodiment of the invention.

Next, as shown in FIG. 59(d), the resist (not shown) is formed in a predetermined shape by photolithography using the first mask 3022. Then, the oxide conductor layer for protecting the metal layer 3026 is patterned by an etching method with an aqueous oxalic acid solution. The thin metal film is patterned by an etching method with an acid mixture (generally called "PAN"), whereby a gate electrode 3023 and a gate wire 3024 are formed in predetermined shapes (see FIG. 60). The gate electrode 3023 and the gate wire 3024 shown in FIG. 59(d) are cross-sectional views taken along lines M-M and N-N in FIG. 60. Here, IZO can be patterned by an etching method with an acid mixture. Therefore, IZO and the thin metal film may be patterned simultaneously by an etching method using the above-mentioned acid mixture.

Then, as shown in FIG. 58, on the glass substrate 3010, the gate electrode 3023 and the gate wire 3024, a gate insulating film 3030, an n-type oxide semiconductor layer 3040 as the first oxide layer, an oxide transparent conductor layer 3050b as the second oxide layer, a reflective metal layer 3090 and a second resist 3091 are stacked in this order (Step S3032), and the second resist 3091 is formed in a predetermined shape by half-tone exposure using a second half-tone mask 3092 (Step S3033).

Subsequently, treatment using the second half-tone mask 3092 will be explained below referring to the drawing.
(Treatment Using a Second Half-Tone Mask)

Figure 61:
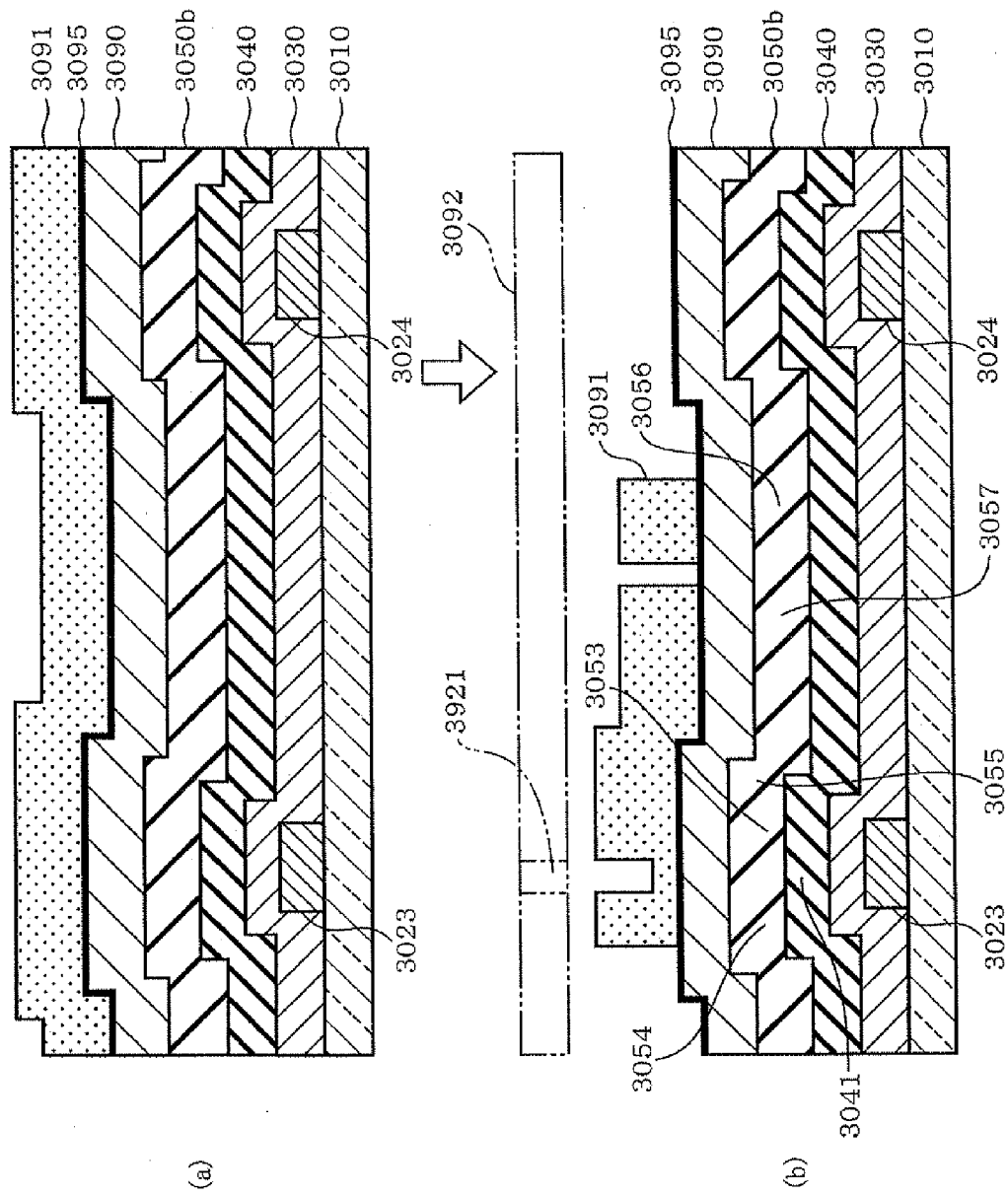
FIG. 61 is a schematic view for explaining treatment using a second half-tone mask in the method for producing a TFT substrate according to the ninth embodiment of the invention, in which (a) is a cross-sectional view after formation of a gate insulating film, an n-type oxide semiconductor layer, an oxide transparent conductor layer, a reflective metal layer, an oxide conductor layer for protecting the metal layer, and application of a resist, and (b) is a cross-sectional view after half-tone exposure and development.

FIG. 61 is a schematic view for explaining treatment using a second half-tone mask in the method for producing a TFT substrate according to the ninth embodiment of the invention. (a) is a cross-sectional view after formation of a gate insulating film, an n-type oxide semiconductor layer, an oxide transparent conductor layer, a reflective metal layer, an oxide conductor layer for protecting the metal layer, and application of a resist. (b) is a cross-sectional view after half-tone exposure and development.

In FIG. 61(a), a gate insulating film 3030, which is a silicon nitride (SiNx) film, is deposited in a thickness of about 300 nm by the glow discharge CVD (Chemical Vapor Deposition) method on the glass substrate 3010, the gate electrode 3023 and the gate wire 3024. In this embodiment, an $SiH_4$—$NH_3$—$N_2$-based mixed gas is used as a discharge gas.

Then, on the gate insulating film 3030, an n-type oxide semiconductor layer (an active layer) 3040 with a thickness of about 100 nm is formed by using an indium oxide-zinc oxide-gallium oxide ($In_2O_3$:ZnO:$Ga_2O_3$=about 70:3:27 wt %) target by the high-frequency sputtering method in an atmosphere of about 10% oxygen and about 90% argon with a substrate temperature of about 200° C. or less (i.e., under the conditions where the n-type oxide semiconductor layer 3040 is not crystallized). The n-type oxide semiconductor layer 3040 had an energy gap of about 3.6 eV.

In the above-mentioned n-type oxide semiconductor layer 3040, zinc oxide may be added preferably in an amount of about 1 to 6 wt %, more preferably about 2 to 5 wt %. The reason therefor is as follows. If the amount of zinc oxide is less than about 1 wt %, carrier density may not be lowered, and if the amount of zinc oxide exceeds about 6 wt %, carrier density may not be lowered or resistance to an aqueous oxalic acid solution or to an acid mixture may be deteriorated without crystallizing.

Subsequently, an oxide transparent conductor layer 3050b with a thickness of about 150 nm is formed on the n-type oxide semiconductor layer 3040 by using an indium oxide-zinc oxide-tin oxide ($In_2O_3$:ZnO:$SnO_2$=about 60:20:20 wt %) target by the high-frequency sputtering method in an atmosphere of about 1% oxygen and about 99% argon, and further, under the conditions where the oxide transparent conductor layer 3050b is not crystallized. The oxide transparent conductor layer 3050b had an energy gap of about 3.2 eV.

Subsequently, on the oxide transparent conductor layer 3050b, Mo and Al and Mo are stacked in this order by the high frequency sputtering method. As a result, a thin metal film with a thickness of about 50 nm, a thin metal film with a thickness of about 200 nm and a thin metal film with a thickness of about 50 nm are formed respectively, whereby the reflective metal layer 3090 formed of Mo/Al/Mo is formed. As the reflective metal layer 3090, a thin film of a metal such as Ag and Au or a thin film of an alloy containing at least one of Al, Ag and Au may be used. If the contact resistance between Al and the oxide transparent conductor layer 3050b is negligibly low, use of Mo or the like in an intermediate layer is not necessary.

Subsequently, an oxide conductor layer for protecting the metal layer 3095 (IZO thin film in this embodiment) with a thickness of about 150 nm is formed by using an indium oxide-zinc oxide (generally called "IZO"; $In_2O_3$:ZnO=about 90:10 wt %) sputtering target by the high-frequency sputtering method in an atmosphere of about 1% oxygen and about 99% argon. By the oxide conductor layer for protecting the metal layer 3095, discoloration of the reflective metal layer 3090 or other problems can be prevented, and disadvantages such as a decrease in reflectance of the reflective metal layer 3090 can be prevented.

Then, on the oxide conductor layer for protecting the metal layer 3095, a second resist 3091 is stacked (Step S3032).

Then, as shown in FIG. 61(b), a second resist 3091 is formed in a predetermined shape by using the second half-tone mask 3092 by half-tone exposure (Step S3033 in FIG. 58). The second resist 3091 covers a gate electrode 3023, a source electrode 3053, a drain electrode 3054, a source wire 3055, a drain wire 3056 and a pixel electrode 3057, and part of the second resist 3091 covering a channel part 3041 is rendered thinner than other parts due to a half-tone mask part 3921.

Figure 62:
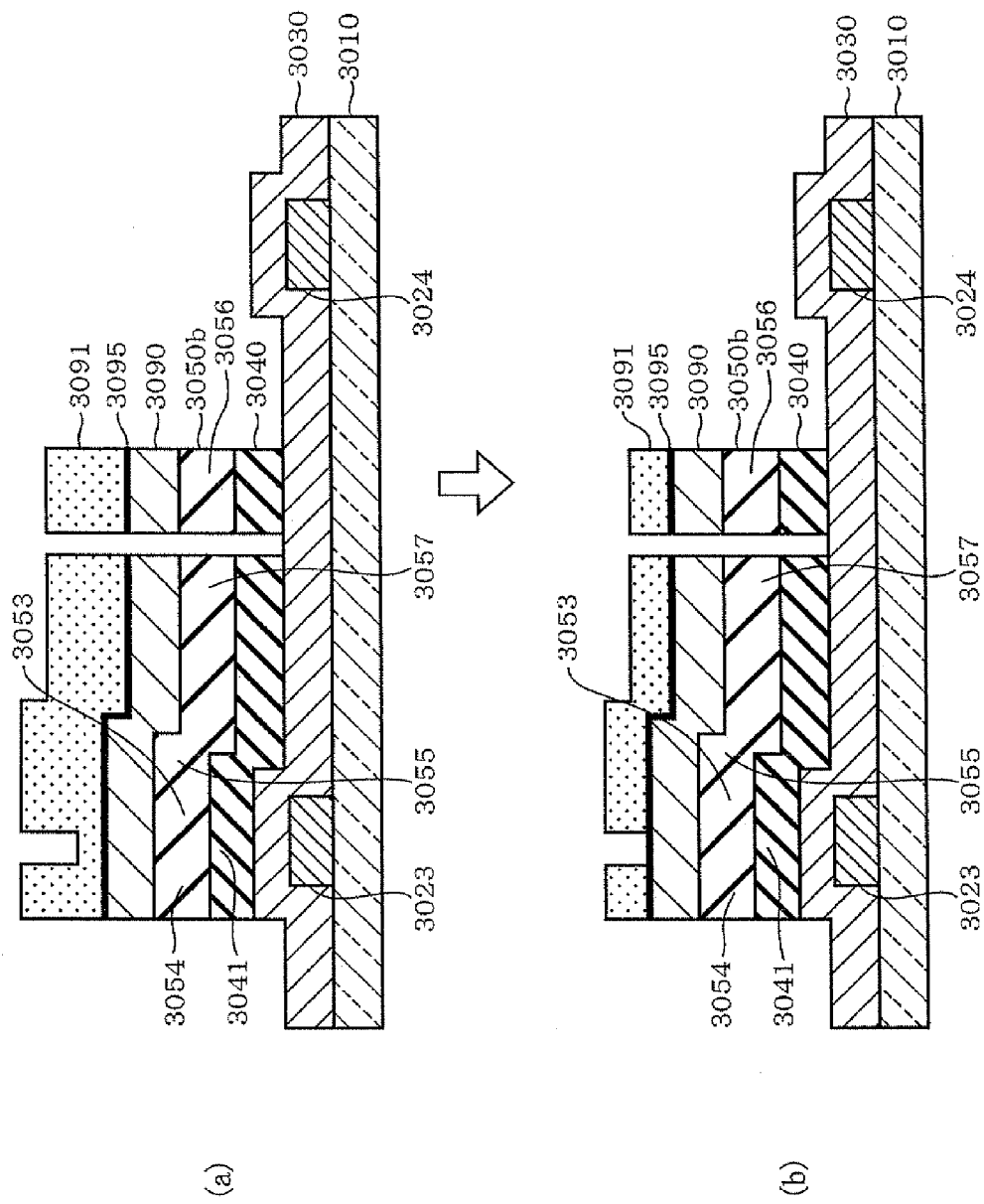
FIG. 62 is a schematic view for explaining treatment using a second half-tone mask in the method for producing a TFT substrate according to the ninth embodiment of the invention, in which (a) is a cross-sectional view after second etching and third etching, and (b) is a cross-sectional view after reformation of a second resist.

FIG. 62 is a schematic view for explaining treatment using a second half-tone mask in the method for producing a TFT substrate according to a ninth embodiment of the invention. (a) is a cross-sectional view after second etching and third etching. (b) is a cross-sectional view after reformation of a second resist.

In FIG. 62(a), by using the second resist 3091 and an acid mixture, the second etching is conducted for the oxide conductor layer for protecting the metal layer 3095 and the reflective metal layer 3090, and by using the second resist 3091 and an aqueous oxalic acid solution, the third etching is conducted for the oxide transparent conductor layer 3050b and the n-type oxide semiconductor layer 3040, whereby a source wire 3055, a drain wire 3056 and a pixel electrode 3057 are formed as desired (Step S3034 in FIG. 58).

Then, as shown in FIG. 62(b), the above-mentioned second resist 3091 is reformed (Step S3035 in FIG. 58). That is, first, as shown in FIG. 62(b), part of the second resist 3091 above the channel part 3041 which is rendered thinner by half-tone exposure is removed through an ashing process, whereby the second resist 3091 is reformed.

Next, by using the reformed second resist 3091, the oxide conductor layer for protecting the metal layer 3095, the reflective metal layer 3090 and the oxide transparent conductor layer 3050b above the gate electrode 3023 are selectively patterned by an etching method, whereby the source electrode 3053 and the drain electrode 3054 are formed (Step S3035 in FIG. 58).

Then, treatment for forming the source electrode 3053 and the drain electrode 3054 will be explained below referring to the drawing.

Figure 63:
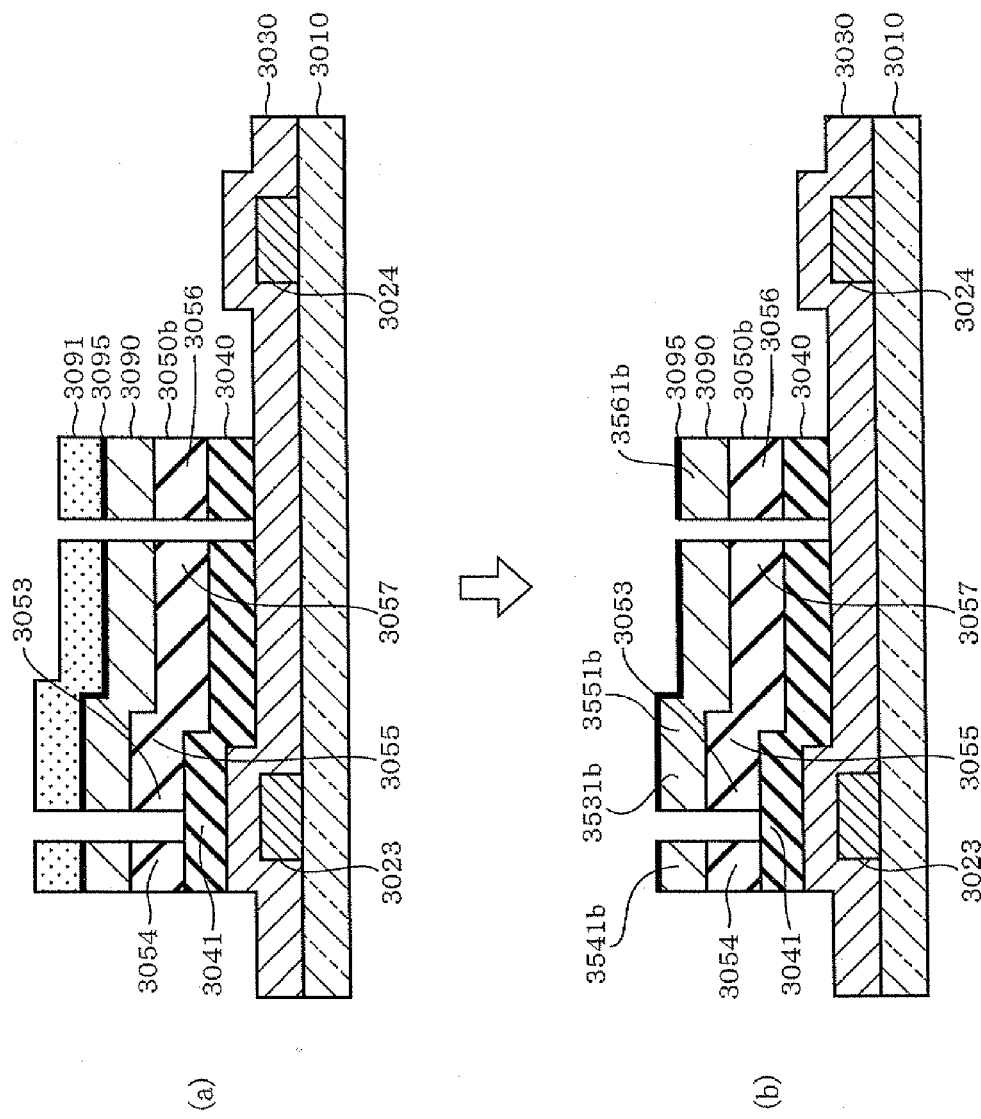
FIG. 63 is a schematic view for explaining treatment using a second half-tone mask in the method for producing a TFT substrate according to the ninth embodiment of the invention, in which (a) is a cross-sectional view after fourth etching and fifth etching, and (b) is a cross-sectional view after peeling off of a second resist.

FIG. 63 is a schematic view for explaining treatment using a second half-tone mask in the method for producing a TFT substrate according to the ninth embodiment of the invention. (a) is a cross-sectional view after fourth etching and fifth etching. (b) is a cross-sectional view after peeling off of a second resist.

In FIG. 63(a), by using the reformed second resist 3091 and an acid mixture, the fourth etching is conducted for the oxide conductor layer for protecting the metal layer 3095 and the reflective metal layer 3090 above the gate electrode 3023. Subsequently, by using the reformed second resist 3091 and an aqueous oxalic acid solution, the fifth etching is selectively conducted for the oxide transparent conductor layer 3050b (i.e., patterning by an etching method is conducted without melting the n-type oxide semiconductor layer 3040 which constitutes the channel part 3041). As a result of the above-mentioned etching, a channel part 3041 is formed in the n-type oxide semiconductor layer 3040 above the gate electrode 3023.

Figure 64:
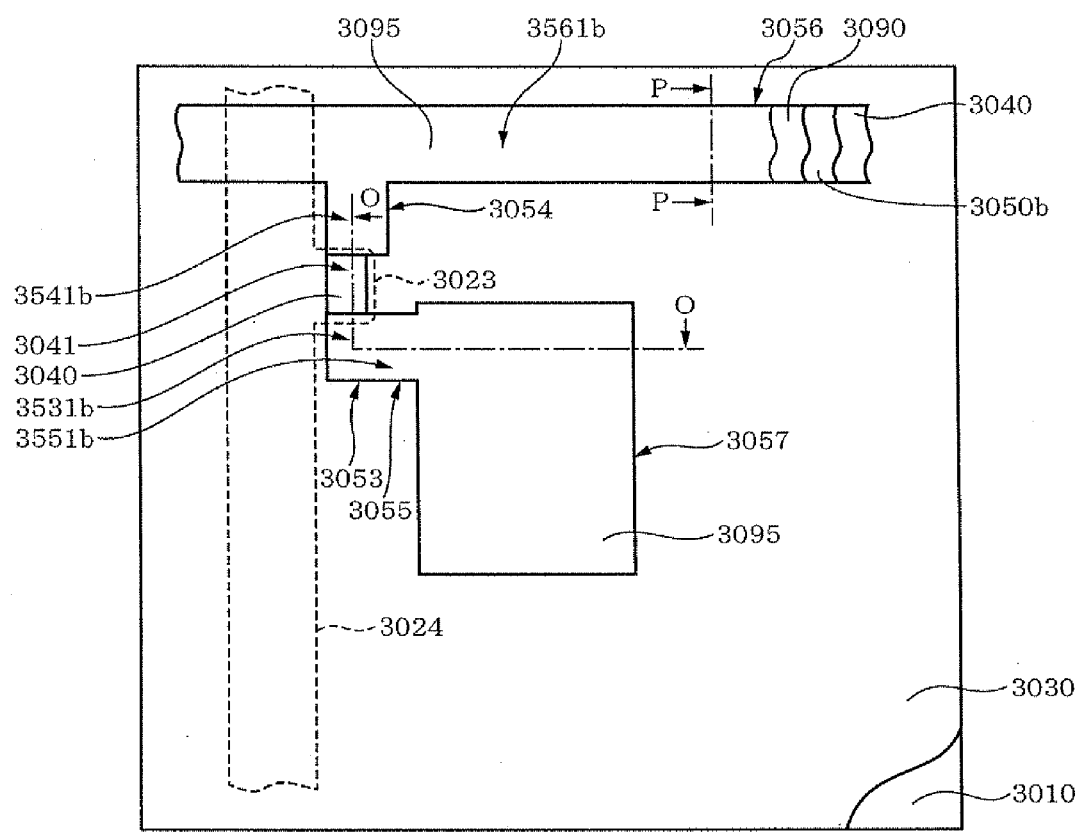
FIG. 64 is a schematic plan view of an essential part of the glass substrate on which an oxide conductor layer for protecting the metal layer on a reflective metal layer is exposed in the method for producing a TFT substrate according to the ninth embodiment of the invention.

Then, as shown in FIG. 63(b), the reformed second resist 3091 is removed through an ashing process completely, whereby the oxide conductor layer for protecting the metal layer 3095 for the reflective metal layer 3090, which is formed on the source electrode 3053, the drain electrode 3054, the source wire 3055, the drain wire 3056 and the pixel electrode 3057, is exposed. Here, the reflective metal layer 3090 formed on the source electrode 3053, the reflective metal layer 3090 formed on the drain electrode 3054, the reflective metal layer 3090 formed on the source wire 3055 and the reflective metal layer 3090 formed on the drain wire 3056 have the functions as an auxiliary electrode layer. Each of the reflective metal layer 3090 serves as an auxiliary electrode for the source electrode 3531b, an auxiliary electrode for the drain electrode 3541b, an auxiliary wire for the source wire 3551b and an auxiliary wire for the drain wire 3561b, respectively (see FIG. 64). The drain electrode 3054, the channel part 3041, the source electrode 3053, the source wire 3055 and the pixel electrode 3057 shown in FIG. 63(b) are cross-sectional views taken along line 0-0 in FIG. 64. The drain wire 3056 shown in FIG. 63(b) are cross-sectional views taken along line P-P in FIG. 64.

As shown in FIG. 58, a protective insulating film 3070 and a third resist 3071b are stacked in this order on the exposed gate insulating film 3030 and the exposed n-type oxide semiconductor layer 3040, as well as on the exposed oxide conductor layer for protecting the metal layer 3095 formed above the source wire 3055, the drain wire 3056, the source electrode 3053, the drain electrode 3054 and the pixel electrode 3057 (Step S3036), and the third resist 3071b is formed in a predetermined shape by using a third half-tone mask 3072b (Step S3037).

Next, treatment using the third half-tone mask 3072b will be explained.

(Treatment Using a Third Half-Tone Mask)

Figure 65:
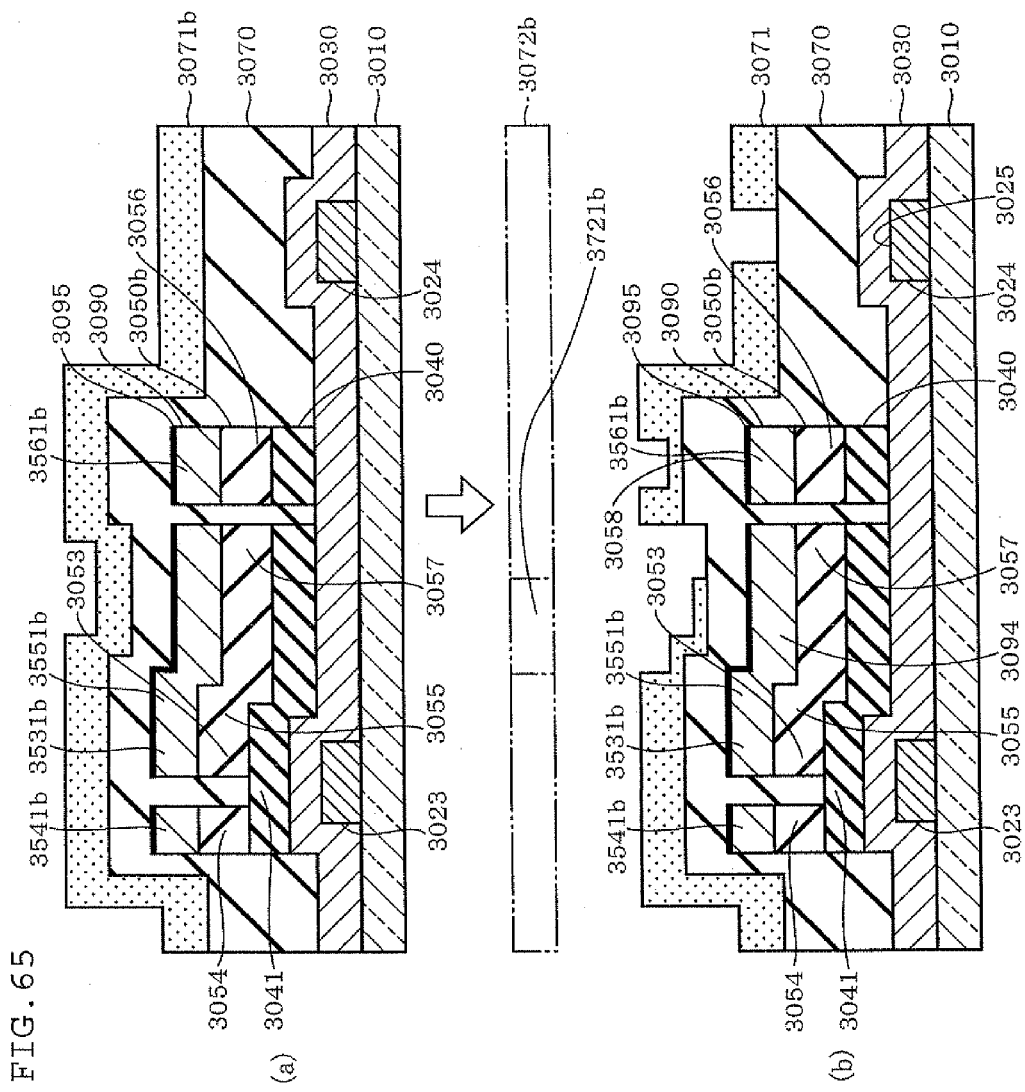
FIG. 65 is a schematic view for explaining treatment using a third half-tone mask in the method for producing a TFT substrate according to the eighth embodiment of the invention, in which (a) is a cross-sectional view after formation of a protective insulating film and application of a third resist, and (b) is a cross-sectional view after half-tone exposure and development.

FIG. 65 is a schematic view for explaining treatment using a third half-tone mask in the method for producing a TFT substrate according to the ninth embodiment of the invention. (a) is a cross-sectional view after formation of a protective insulating film and application of a third resist. (b) is a cross-sectional view after half-tone exposure and development.

In FIG. 65(a), first, a protective insulating film 3070b which is a silicon nitride (SiNx) film is deposited on the TFT substrate on which the channel part 3041 is formed in a thickness of about 200 nm by the glow discharge CVD method. An $SiH_4$—$NH_3$—$N_2$-based mixed gas is used as a discharge gas. Subsequently, the third resist 3071b is stacked on the protective insulating film 3070b (Step S3036).

Then, as shown in FIG. 65(b), the third resist 3071b is formed in a predetermined shape by using the third half-tone mask 3072b (Step S3037). The third resist 3071b covers the protective insulating film 3070 entirely, except for part of the pixel electrode 3057 excluding the reflective metal part 3094 and above the gate wire pad 3025, and the part of the third resist above the drain wire pad 3068 and the reflective metal part 3094 is rendered thinner than other parts by a half-tone mask part 3721b.

Figure 66:
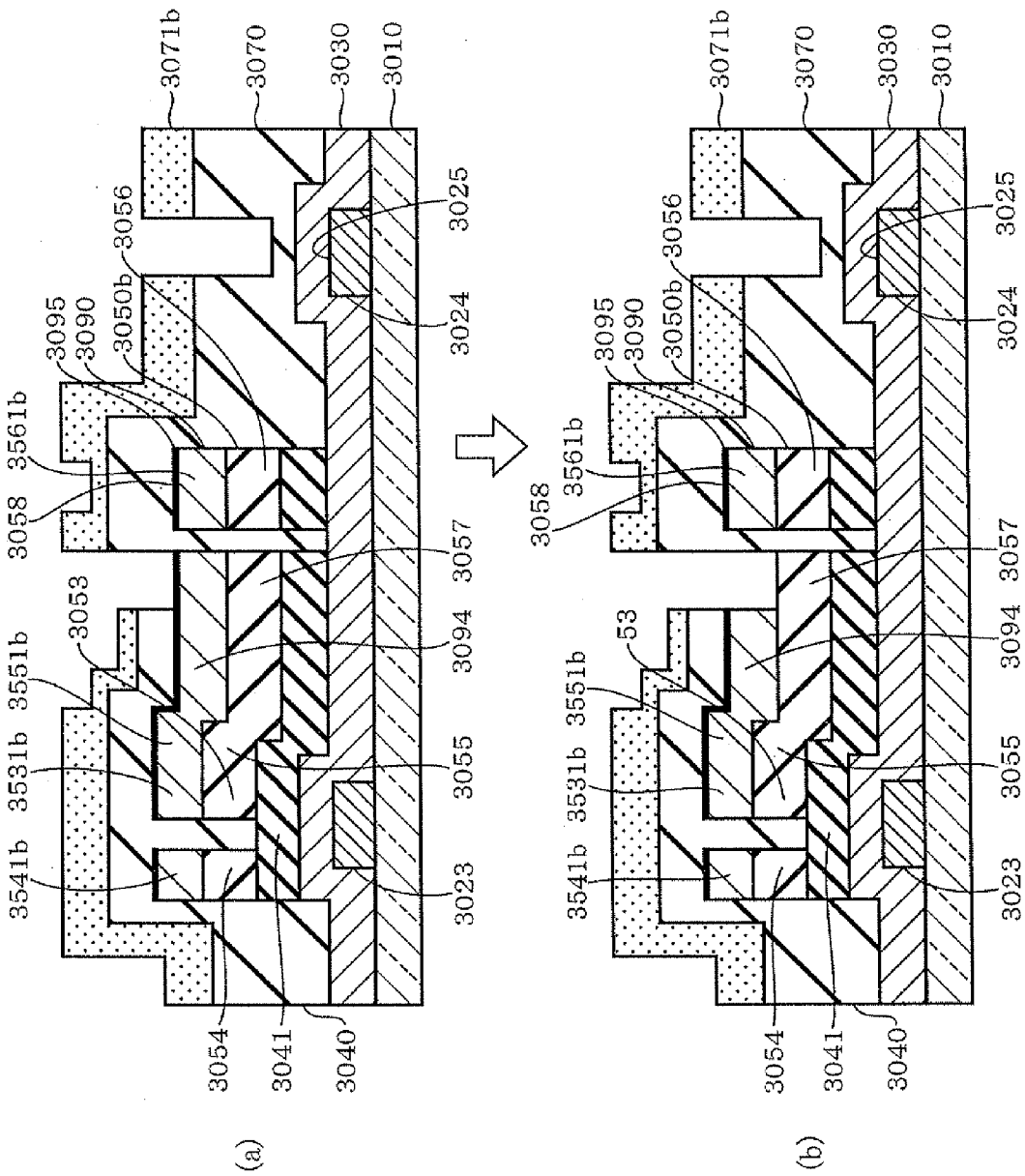
FIG. 66 is a schematic view for explaining treatment using a third half-tone mask in the method for producing a TFT substrate according to the ninth embodiment of the invention, in which (a) is a cross-sectional view after sixth etching, and (b) is a cross-sectional view after seventh etching.

FIG. 66 is a schematic view for explaining treatment using a third half-tone mask in the method for producing a TFT substrate according to the ninth embodiment of the invention. (a) is a cross-sectional view after sixth etching. (b) is a cross-sectional view after seventh etching.

In FIG. 66(a), as the sixth etching, the protective insulating film 3070 above the part of the pixel electrode 3057 except for the reflective metal part 3094, as well as the protective insulating film 3070 above the gate wire pad 3025 are patterned by a dry etching method using the third resist 3071b and CHF ($CF_4$, $CHF_3$, or the like) (Step S3038 in FIG. 58). Here, the protective insulating film 3070 above the part of the pixel electrode 3057 except for the reflective metal part 3094 is etched completely and the part of the protective insulating film 3070 above the gate wire pad 3025 usually remains without being etched.

Next, as shown in FIG. 66(b), as the seventh etching, the oxide conductor layer for protecting the metal layer 3095 and the reflective metal layer 3090 above the part of the pixel electrode 3057 except for the reflective metal part 3094 are patterned by an etching method using the third resist 3071b and an acid mixture, whereby the part of the pixel electrode 3057 except for the reflective metal part 3094 is exposed (Step S3039 in FIG. 58).

Figure 67:
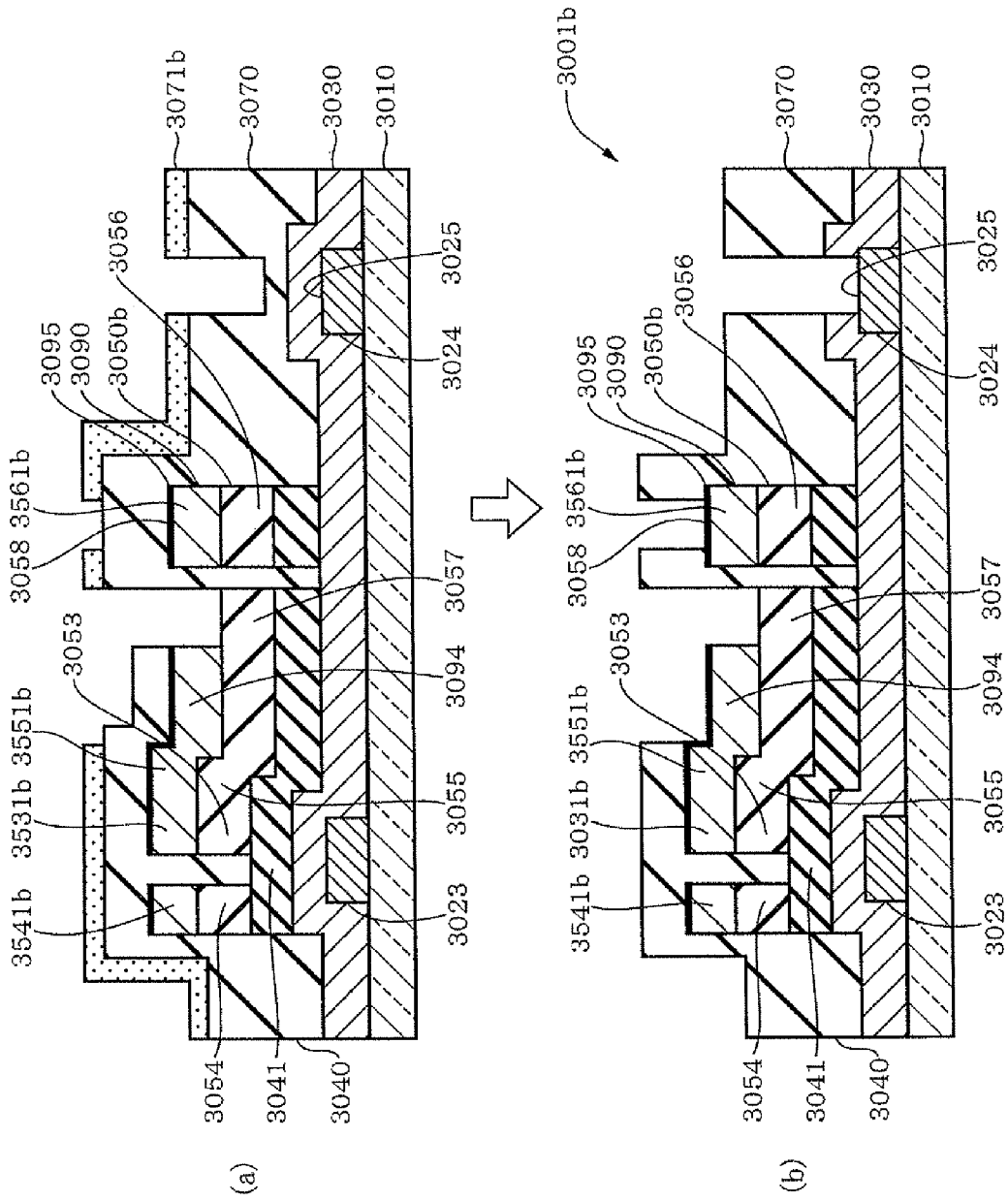
FIG. 67 is a schematic view for explaining treatment using a third half-tone mask in the method for producing a TFT substrate according to the ninth embodiment of the invention, in which (a) is a cross-sectional view after reformation of a third resist, and (b) is a cross-sectional view after eighth etching and peeling off of a third resist.

FIG. 67 is a schematic view for explaining treatment using a third half-tone mask in the method for producing a TFT substrate according to the ninth embodiment of the invention. (a) is a cross-sectional view after reformation of a third resist. (b) is a cross-sectional view after eighth etching and peeling off of a third resist.

Then, as shown in FIG. 67(a), the above-mentioned third resist 3071b is reformed. That is, part of the third resist 3071b above the reflective metal part 3094 and the drain wire pad 3058 which is rendered thinner by half-tone exposure is removed through an ashing process, whereby the third resist 3071b is reformed.

Next, as the eighth etching, the protective insulating film 3070 above the reflective metal part 3094 and the drain wire pad 3058, as well as the protective insulating film 3070 and the gate insulating film 3030 above the gate wire pad 3025 are patterned by a dry etching method using the reformed third resist 3071b and CHF ($CF_4$, $CHF_3$, or the like), whereby the reflective metal part 3094, the drain wire pad 3058 and the gate wire pad 3025 are exposed (Step S3040 in FIG. 58).

Figure 68:
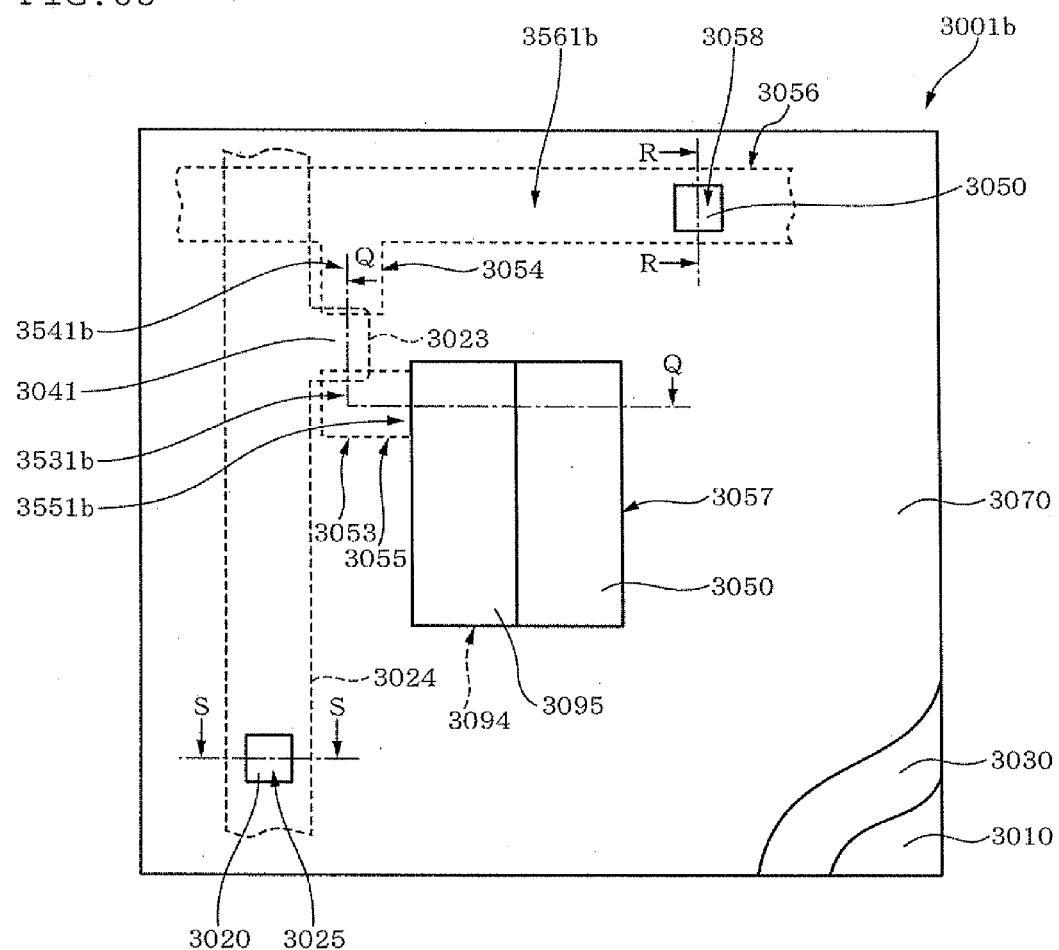
FIG. 68 is a schematic plan view of an essential part of a TFT substrate produced according to the ninth embodiment of the method for producing a TFT substrate in which a protective insulating film is exposed.
Figure 69:
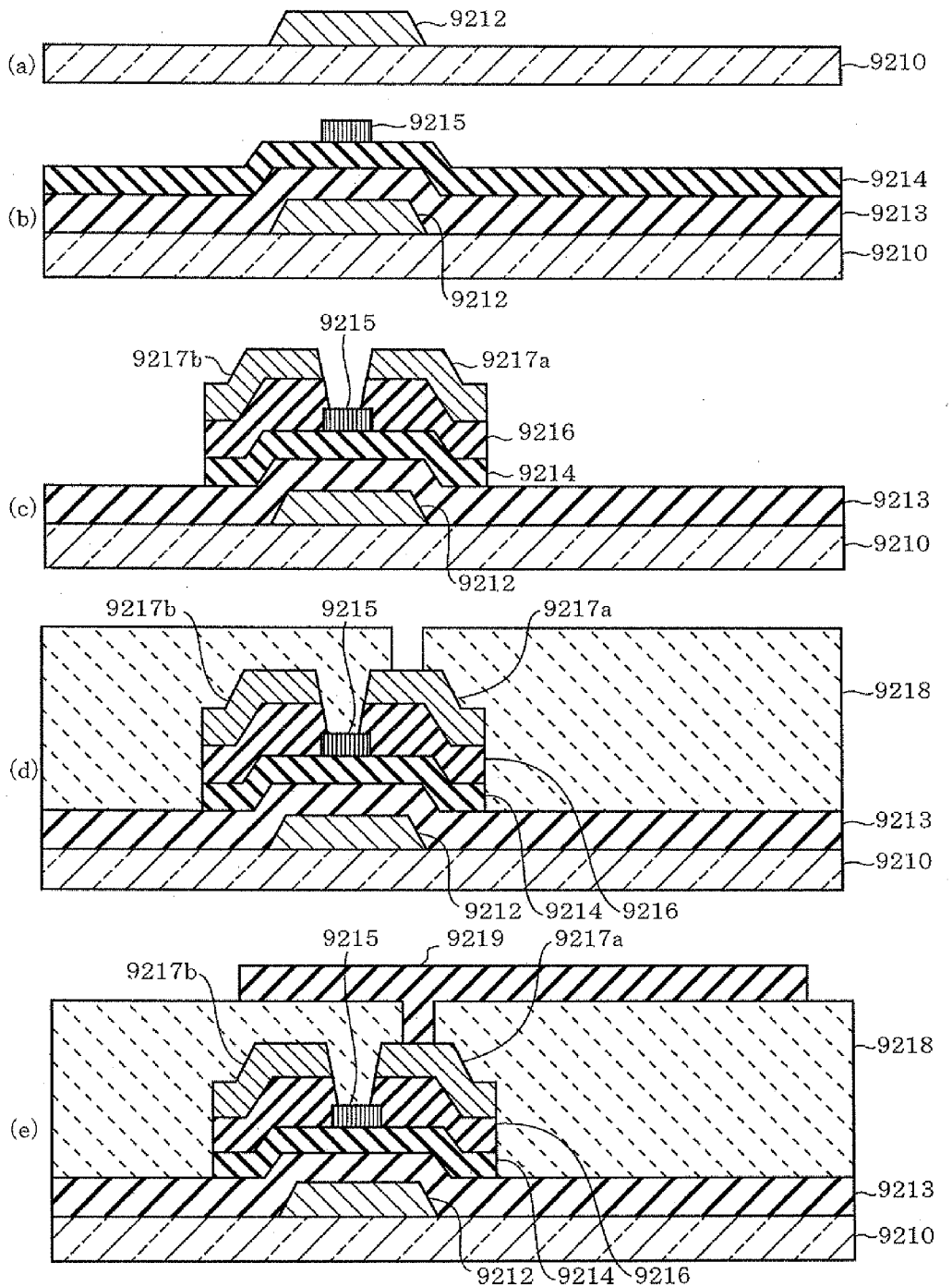
FIG. 69 is schematic cross-sectional views for explaining the conventional method for producing a TFT substrate, in which (a) is a cross-sectional view after formation of a gate electrode, (b) is a cross-sectional view after formation of an etch stopper, (c) is a cross-sectional view after formation of a source electrode and a drain electrode, (d) is a cross-sectional view after formation of an interlayer insulating film, and (e) is a cross-sectional view after formation of a pixel electrode.

Then, by removing the third resist 3071b through an ashing process, as shown in FIG. 68, on the substrate 3010, the protective insulating film 3070 is exposed except for an area above the pixel electrode 3057, the reflective metal part 3094, the drain wire pad 3058 and the gate wire pad 3025. The drain electrode 3054, the channel part 3041, the gate electrode 3023, the source electrode 3053, the source wire 3055, the reflective metal part 3094 and the pixel electrode 3057 shown in FIG. 67(b) are cross-sectional views taken along line Q-Q in FIG. 68. The drain wire pad 3058 shown in FIG. 67(b) is a cross-sectional view taken along line R-R in FIG. 68. The gate wire pad 3025 shown in FIG. 67(b) is a cross-sectional view taken along line S-S in FIG. 68.

As mentioned hereinabove, according to the method for producing a TFT substrate 3001b in this embodiment, an effect almost equivalent to that of the seventh embodiment can be obtained, and the channel etch type and semi-reflective TFT substrate 3001b can be produced. Further, the reflective metal layer 3090 is formed above the source electrode 3053, the drain electrode 3054, the source wire 3055, the reflective metal part 3094 and the drain wire 3056, whereby the electric resistance of each of the source electrode 3053, the drain electrode 3054, the source wire 3055 and the drain wire 3056 is decreased. As a result, reliability can be improved and a decrease in energy efficiency can be suppressed.

In this embodiment, part of the pixel electrode 3057 except for the reflective metal part 3094 is formed of an oxide transparent conductor layer 3050b. When light is transmitted through this part, the TFT substrate 3001b can be used as a semi-transmissive TFT substrate.

This embodiment is advantageous as an invention of a TFT substrate, and the above-mentioned TFT substrate 3001b corresponds to claims 1 and 22 to 34.

As shown in FIGS. 67(b) and 68, the TFT substrate 3001b differs from the TFT substrate 3001 in that part of the pixel electrode 3057 is covered by the reflective metal part 3094 formed of the reflective metal layer 3090.

Other structures are almost similar to those of the TFT substrate 3001 according to the seventh embodiment.

The TFT substrate 3001b has a configuration in which the source wire 3055, the drain wire 3056, the source electrode 3053 and the drain electrode 3054 are formed from the reflective metal layer 3090. Due to such a configuration, a larger amount of light can be reflected, whereby luminance by reflected light can be improved.

Further, since the reflective metal layer 3090 is a thin film formed of Al, a larger amount of light can be reflected, whereby luminance by reflected light can be improved.

The TFT substrate 3001b has a configuration in which an oxide conductor layer for protecting the metal layer 3095 which serves to protect the reflective metal layer 3090 is provided. Due to such a configuration, corrosion of the reflective metal layer 3090 can be prevented and durability can be improved. For example, disadvantages such as discoloration of the reflective metal layer 3090 and a decrease in reflectance of the reflective metal layer 3090 can be eliminated.

Further, the TFT substrate 3001b has a configuration in which an oxide transparent conductor layer 3050b is used as the second oxide layer, and each of the source wire 3055, the drain wire 3056, the source electrode 3053, the drain electrode 3054 and the pixel electrode 3057 is formed of the oxide transparent conductor layer 3050b. Due to such a configuration, since the amount of transmitted light increases, a display apparatus improved in luminance can be provided.

As mentioned hereinabove, the TFT substrate 3001b of this embodiment has almost similar effects as those of the TFT substrate 3001. Further, when used in a display apparatus, the TFT substrate 3001b of this embodiment can be a semi-transmissive TFT substrate or a semi-reflective TFT substrate which is improved in luminance.

As mentioned hereinabove, according to claims 22 to 38 of the invention, a TFT substrate having an auxiliary conductive layer and a protective insulating film can be produced by using three masks. As a result, the number of mask can be decreased and production steps can be reduced. As a result, production efficiency can be improved and production cost can be decreased. In addition, since the upper part of the first oxide layer of the channel part is protected by the protective insulating film, the TFT substrate can be operated stably for a prolonged period of time. Further, concern for occurrence of interference between gate wires (crosstalk) can be eliminated. Due to the presence of the auxiliary conductive layer, electric resistance of each wire and each electrode can be decreased, whereby reliability can be improved and a decrease in energy efficiency can be suppressed. Further, a semi-transmissive or semi-reflective TFT substrate which can be operated stably for a prolonged period of time without suffering crosstalk can be provided.

The TFT substrate and the method for producing the TFT substrate of the invention were explained above referring to preferred embodiments. The TFT substrate and the method for producing the TFT substrate are not limited to the above-mentioned embodiments, and various modifications can be made within the scope of the invention.

For example, in the TFT substrates 2001 and 2001a, a range, though not shown, in which only the gate insulating film 2030/n-type oxide semiconductor layer 2040/protective insulating film 2070 are stacked on the glass substrate 2010 (i.e. a range outside the gate electrode 2023, the gate wire 2024, the source electrode 2053, the drain electrode 2054, the source wire 2055, the drain wire 2056 and the pixel electrode 2057) may be patterned by an etching method when etching the gate insulating film 2030/n-type oxide semiconductor layer 2040/protective insulating film 2070 on the gate wire pad 2025. Due to such a configuration, the amount of light transmitted through the back side of the glass substrate 2010 can be increased.

Materials for the n-type oxide semiconductor layer, the oxide conductor layer and the oxide transparent conductor layer used in the above embodiments are not limited to those mentioned above.

Specific examples of the material for the n-type oxide semiconductor layer include oxide indium, zinc oxide, tin oxide, indium oxide-zinc oxide, zinc oxide-tin oxide, indium oxide-zinc oxide-tin oxide and indium oxide-zinc oxide-gallium oxide. A substance obtained by adding an insulating transparent oxide to these oxides can also be used. Specific examples of the insulating transparent oxide include yttrium oxide, titanium oxide, zirconium oxide, hafnium oxide, niobium oxide, tantalum oxide, boron oxide, aluminum oxide, silicon oxide, germanium oxide and an oxide based on a lanthanoide-based element.

If the above-mentioned oxides are used in the n-type oxide semiconductor layer, it is important to make the carrier density thereof $10^{+17}/cm^3$ or less. In this case, carriers can be decreased by oxygen deficiency by performing film formation in the presence of a large amount of oxygen or by performing heat treatment in the presence of oxygen. In addition, in order to decrease carrier density, valence electron control can be performed as in the case of adding zinc oxide to indium oxide or adding indium oxide to tin oxide. Combination of these methods is also effective.

Specific examples of the oxide conductor layer and the oxide transparent conductor layer include indium oxide, zinc oxide, tin oxide, indium oxide-zinc oxide, zinc oxide-tin oxide and indium oxide-zinc oxide-tin oxide. If the above-mentioned oxides are used for the oxide conductor layer and the oxide transparent conductor layer, it is important to render the carrier density $10^{+20}/cm^3$ or more.

INDUSTRIAL APPLICABILITY

The TFT substrate and the method for producing a TFT substrate of the invention are not limited to a TFT substrate and a method for producing a TFT substrate used in LCD (liquid display) apparatuses or organic EL display apparatuses. The invention can also be applied to display apparatuses other than LCD (liquid crystal display) apparatuses or organic EL display apparatuses, or to a TFT substrate and a method for producing a TFT substrate for other applications.

The invention claimed is:

1. A TFT substrate comprising:
   a substrate;
   a gate electrode and a gate wire formed above the substrate;
   a gate insulating film formed at least above the gate electrode and the gate wire;
   a first oxide layer formed above the gate insulating film which is formed at least above the gate electrode; and
   a second oxide layer formed above the first oxide layer;
   wherein at least a pixel electrode is formed from the second oxide layer, and wherein at least one of the following conditions of a) or b) or c) or d) must be satisfied:
   a) the pixel electrode, a source electrode and a drain electrode, and a source wire and a drain wire are formed from the second oxide layer; or
   b) the pixel electrode is formed of the first oxide layer and the second oxide layer; or
   c) the TFT substrate is provided with a protective insulating film above the gate electrode and the gate wire, as well as above the source wire, the drain wire, the source electrode and the drain electrode, in a state in which the pixel electrode, the source/drain wire pad and the gate wire pad are exposed, and the source wire, the drain wire, the source electrode, the drain electrode and the pixel electrode are formed from the second oxide layer.

2. A method for producing a TFT substrate according to claim 1, comprising the steps of:
   forming a gate electrode and a gate wire above a substrate using a first mask;
   stacking a gate insulating film, a first oxide layer, a second oxide layer and a resist in this order above the substrate, the gate electrode and the gate wire;
   forming the resist in a predetermined shape by half-tone exposure using a second mask;
   selectively etching the first oxide layer and the second oxide layer to form a source wire, a drain wire and a pixel electrode;
   reforming the resist in a predetermined shape;
   selectively etching the second oxide layer to form a source electrode, a drain electrode and a channel part; and
   selectively etching the gate insulating film to form a gate insulating pad.

3. A method for producing a TFT substrate according to claim 1, comprising the steps of:
   forming a gate electrode and a gate wire above a substrate using a first mask;
   stacking a gate insulating film, a first oxide layer, a second oxide layer and a resist in this order above the substrate, the gate electrode and the gate wire;
   forming the resist in a predetermined shape by half-tone exposure using a second mask;
   etching the first oxide layer and the second oxide layer and the gate insulating film to form a source wire, a drain wire, a pixel electrode and a gate wire pad;
   reforming the resist in a predetermined shape; and
   selectively etching the second oxide layer to form a source electrode, a drain electrode and a channel part.

4. A method for producing a TFT substrate according to claim 1, comprising the steps of:
   forming a gate electrode and a gate wire on a substrate using a first mask;
   stacking a gate insulating film, a first oxide layer, a second oxide layer and a second resist in this order on the substrate, the gate electrode and the gate wire, and forming the second resist in a predetermined shape using a second mask;
   patterning the second oxide layer by an etching method using the second resist to form a source wire, a drain wire, a source electrode, a drain electrode and a pixel electrode;
   stacking a protective insulating film and a third resist in this order on the first oxide layer, the source wire, the drain wire, the source electrode, the drain electrode and the pixel electrode, and forming the third resist in a predetermined shape by half-tone exposure;
   patterning the protective insulating film and the first oxide layer on the gate wire pad by an etching method using the third resist; and
   after reforming the third resist, selectively patterning the protective insulating film on the pixel electrode and the source/drain wire pad, as well as the gate insulating film on the gate wire pad by an etching method using the third resist to expose the pixel electrode, the source/drain wire pad, and the gate wire pad.

5. A method for producing a TFT substrate according to claim 1, comprising the steps of:
   forming a gate electrode and a gate wire on a substrate using a first mask;
   stacking a gate insulating film, a first oxide layer, a second oxide layer, an auxiliary conductive layer and a second resist in this order on the substrate, the gate electrode and the gate wire, and forming the second resist in a predetermined shape by half-tone exposure;
   patterning the auxiliary conductive layer and the second oxide layer by an etching method using the second resist to form a source wire, a drain wire, a source electrode, a drain electrode and a pixel electrode, as well as an auxiliary wire and an auxiliary electrode formed of the auxiliary conductive layer;
   after reforming the second resist, selectively patterning the auxiliary conductive layer on the pixel electrode by an etching method using the second resist to expose the pixel electrode;
   stacking a protective insulating film and a third resist in this order on the first oxide layer and the pixel electrode, as well as on the auxiliary conductive layer formed on the source wire, the drain wire, the source electrode and the drain electrode, and forming the third resist in a predetermined shape by half-tone exposure;
   patterning the protective insulating film and the first oxide layer on the gate wire pad by an etching method using the third resist; and
   after reforming the third resist, selectively patterning the protective insulating film on the pixel electrode and the source/drain wire pad, as well as the gate insulating film on the gate wire pad by an etching method using the third resist to expose the pixel electrode, the source/drain wire pad and the gate wire pad.

6. A method for producing a TFT substrate according to claim 1, comprising the steps of:
  forming a gate electrode and a gate wire above a substrate using a first mask;
  stacking a gate insulating film, a first oxide layer, a second oxide layer and a second resist above the substrate, the gate electrode and the gate wire, and forming the second resist in a predetermined shape by half-tone exposure;
  patterning the second oxide layer and the first oxide layer by an etching method using the second resist to form a source wire, a drain wire, and a pixel electrode;
  after reforming the second resist, selectively patterning the second oxide layer above the gate electrode by an etching method using the second resist to form a source electrode and a drain electrode;
  stacking a protective insulating film and a third resist above the exposed gate insulating film and the exposed first oxide layer, as well as above the source wire, the drain wire, the source electrode, the drain electrode and the pixel electrode, and forming the third resist in a predetermined shape using the third mask; and
  patterning the protective insulating film above the pixel electrode and the source/drain wire pad, as well as the protective insulating film and the gate insulating film above the gate wire pad by an etching method using the third resist to expose the pixel electrode, the source/drain wire pad and the gate wire pad.

7. A method for producing a TFT substrate according to claim 1, comprising the steps of:
  forming a gate electrode and a gate wire on a substrate using a first mask;
  stacking a gate insulating film, a first oxide layer, a second oxide layer, an auxiliary conductive layer and a second resist above the substrate, the gate electrode and the gate wire, and forming the second resist in a predetermined shape by half-tone exposure;
  patterning the auxiliary conductive layer, the second oxide layer and the first oxide layer by an etching method using the second resist to form a source wire, a drain wire, a source electrode and a pixel electrode, as well as an auxiliary wire formed of the auxiliary conductive layer;
  after reforming the second resist, selectively patterning the auxiliary conductive layer and the second oxide layer above the gate electrode by an etching method using the second resist to form a source electrode and a drain electrode, as well as an auxiliary electrode formed of the auxiliary conductive layer;
  stacking a protective insulating film and a third resist above the exposed gate insulating film and the exposed first oxide layer, as well as above the auxiliary conductive layer formed above the source wire, the drain wire, the source electrode, the drain electrode and the pixel electrode, and forming the third resist in a predetermined shape using a third mask; and
  patterning the protective insulating film above the pixel electrode and the source/drain wire pad, as well as the protective insulating film above the gate wire pad by an etching method using the third resist to expose the auxiliary conductive layer above the pixel electrode and the source/drain wire pad;
  patterning the exposed auxiliary conductive layer above the pixel electrode and the source/drain wire pad by an etching method using the third resist to expose the pixel electrode and the source/drain wire pad; and
  patterning the gate insulating film above the gate wire pad by an etching method using the third resist to expose the gate wire pad.

8. A method for producing a TFT substrate according to claim 1, comprising the steps of:
  forming a gate electrode and a gate wire above a substrate using a first mask;
  stacking a gate insulating film, a first oxide layer, a second oxide layer, a reflective metal layer and a second resist above the substrate, the gate electrode and the gate wire, and forming the second resist in a predetermined shape by half-tone exposure;
  patterning the reflective metal layer, the second oxide layer and the first oxide layer by an etching method using the second resist to form a source wire, a drain wire and a pixel electrode;
  after reforming the second resist, selectively patterning the reflective metal layer and the second oxide layer above the gate electrode by an etching method using the second resist to form a source electrode and a drain electrode;
  stacking a protective insulating film and a third resist above the exposed gate insulating film and the exposed first oxide layer, as well as above the reflective metal layer formed above the source wire, the drain wire, the source electrode, the drain electrode and the pixel electrode, and forming the third resist in a predetermined shape by half-tone exposure;
  exposing part of the pixel electrode using the third resist and forming a reflective metal part formed of the reflective metal layer;
  reforming the third resist in a predetermined shape; and
  patterning the protective insulating film above the reflective metal part and the source/drain wire pad, as well as the protective insulating film and the gate insulating film above the gate wire pad by an etching method to expose the reflective metal part and the source/drain wire pad and the gate wire pad.

9. The method for producing a TFT substrate according to claim 2, wherein the selective etching of the first oxide layer and the second oxide layer is performed by an etching method A in which the etching rates of the first oxide layer and the second oxide layer are faster than the etching rate of the gate insulating film;
  the selective etching of the second oxide layer is performed by an etching method B in which the etching rate of the second oxide layer is faster than the etching rates of the first oxide layer and the gate insulating film, and
  the selective etching of the gate insulting film is performed by an etching method C in which the etching rate of the gate insulating film is faster than the etching rates of the first oxide layer and the second oxide layer.

10. The method for producing a TFT substrate according to claim 2, further comprising the step of forming an auxiliary wire or an auxiliary electrode above the source wire, the drain wire, the source electrode and the drain electrode using a third mask.

11. The method for producing a TFT substrate according to claim 2, wherein the first oxide layer is an n-type oxide semiconductor layer and the second oxide layer is an oxide conductor layer.

12. The method for producing a TFT substrate according to claim 8, further comprising the step of forming, above the reflective metal layer, an oxide conductor layer for protecting the metal layer for protecting the reflective metal layer.

13. The method for producing a TFT substrate according to claim 10, wherein the step of forming the auxiliary wire or the auxiliary electrode is a step where an auxiliary wire layer or an auxiliary electrode layer is patterned by an etching method using a third mask after etching properties of the first oxide layer and the second oxide layer are changed by heat treatment.

14. A TFT substrate comprising:
a substrate;
a gate electrode and a gate wire formed above the substrate;
a gate insulating film formed at least above the gate electrode and the gate wire;
a first oxide layer formed above the gate insulating film which is formed at least above the gate electrode; and
a second oxide layer formed above the first oxide layer;
wherein pixel electrode, a source electrode and a drain electrode, and a source wire and a drain wire are formed from the second oxide layer.

15. The TFT substrate according to claim 14, wherein the first oxide layer is patterned by an etching method A in which the etching rates of the first oxide layer and the second oxide layer are faster than the etching rate of the gate insulating film and is formed of a material which has resistance to an etching method B in which the etching rate of the second oxide layer is faster than the etching rates of the first oxide layer and the gate insulating film;
the second oxide layer is formed of a material which can be etched by the etching method A and the etching method B; and
the gate insulating film is patterned by an etching method C in which the etching rate of the gate insulating film is faster than the etching rates of the first oxide layer and the second oxide layer and is formed of a material which has resistance to the etching method A and the etching method B.

16. The TFT substrate according to claim 14, wherein an auxiliary wire or an auxiliary electrode is formed on the source electrode, the drain electrode, the source wire and the drain wire.

17. The TFT substrate according to claim 14, wherein the first oxide layer is an n-type oxide semiconductor layer and the second oxide layer is an oxide conductor layer.

18. The TFT substrate according to claim 15, wherein an auxiliary wire or an auxiliary electrode is formed on the source electrode, the drain electrode, the source wire and the drain wire, the first oxide layer and the second oxide layer have resistance to the etching method B of claim 3, and the auxiliary wire and the auxiliary electrode are patterned by the etching method B.

19. A TFT substrate comprising:
a substrate;
a gate electrode and a gate wire formed above the substrate;
a gate insulating film formed at least above the gate electrode and the gate wire;
a first oxide layer formed above the gate insulating film which is formed at least above the gate electrode; and
a second oxide layer formed above the first oxide layer;
wherein at least a pixel electrode is formed from the second oxide layer;
and the pixel electrode is formed of the first oxide layer and the second oxide layer.

20. A TFT substrate comprising:
a substrate;
a gate electrode and a gate wire formed above the substrate;
a gate insulating film formed at least above the gate electrode and the gate wire;
a first oxide layer formed above the gate insulating film which is formed at least above the gate electrode; and
a second oxide layer formed above the first oxide layer;
wherein at least a pixel electrode is formed from the second oxide layer;
and the TFT substrate is provided with a protective insulating film above the gate electrode and the gate wire, as well as above the source wire, the drain wire, the source electrode and the drain electrode, in a state in which the pixel electrode, the source/drain wire pad and the gate wire pad are exposed, and the source wire, the drain wire, the source electrode, the drain electrode and the pixel electrode are formed from the second oxide layer.

21. The TFT substrate according to claim 20, wherein the first oxide layer is an n-type oxide semiconductor layer and the second oxide layer is an oxide conductor layer.

22. The TFT substrate according to claim 20, wherein the pixel electrode is formed of a stacked film of the first oxide layer and the second oxide layer.

23. The TFT substrate according to claim 20, wherein the first oxide layer is formed at least on the side facing the substrate of the second oxide layer.

24. The TFT substrate according claim 20, wherein an auxiliary conductive layer is formed on at least one of the source wire, the drain wire, the source electrode, the drain electrode and the pixel electrode.

25. The TFT substrate according to claim 14, wherein the energy gaps of the first oxide layer and the second oxide layer are 3.0 eV or more.

26. A TFT substrate comprising:
a substrate;
a gate electrode and a gate wire formed above the substrate;
a gate insulating film formed at least above the gate electrode and the gate wire;
a first oxide layer formed above the gate insulating film which is formed at least above the gate electrode; and
a second oxide layer formed above the first oxide layer;
wherein at least a pixel electrode is formed from the second oxide layer;
and at least the pixel electrode and a source/drain electrode which is connected with the pixel electrode are formed from the second oxide layer wherein the TFT substrate is provided with a protective insulating film above the gate electrode and the gate wire, as well as above the source wire, the drain wire, the source electrode and the drain electrode, in a state in which the pixel electrode, the source/drain wire pad and the gate wire pad are exposed, and the source wire, the drain wire, the source electrode, the drain electrode and the pixel electrode are formed from the second oxide layer.

27. The TFT substrate according to claim 26, wherein the upper part of the TFT substrate is covered by the protective insulating film and the protective insulating film has openings at positions corresponding to each of the pixel electrode, the source/drain wire pad and the gate wire pad.

28. The TFT substrate according to claim 26, wherein the first oxide layer is an n-type oxide semiconductor layer and the second oxide layer is an oxide conductor layer.

29. The TFT substrate according to claim 26, wherein the pixel electrode is formed of a stacked film of the first oxide layer and the second oxide layer.

30. The TFT substrate according to claim 26, wherein the first oxide layer is formed at least on the side facing the substrate of the second oxide layer.

31. The TFT substrate according to claim 26, wherein an auxiliary conductive layer is formed above at least one of the source wire, the drain wire, the source electrode, the drain electrode and the pixel electrode.

32. The TFT substrate according to claim 26, wherein the first oxide layer is formed at a predetermined position corresponding to the channel part, the source wire, the drain wire, the source electrode, the drain electrode, and the pixel electrode.

33. The TFT substrate according to claim 26, wherein the energy gap of the first oxide layer and/or the second oxide layer is 3.0 eV or more.

34. The TFT substrate according to claim 26, wherein part of the pixel electrode is covered by a reflective metal layer.

35. The TFT substrate according to claim 26, wherein the TFT substrate is provided with a metal layer and has an oxide conductor layer for protecting the metal layer.

36. the TFT substrate according to claim 26, wherein the TFT substrate is provided with at least one of the gate electrode, the gate wire, the source wire, the drain wire, the source electrode, the drain electrode and the pixel electrode, and at least one of the gate electrode, the gate wire, the source wire, the drain wire, the source electrode, and the drain electrode and the pixel electrode is formed of an oxide transparent conductive layer.

37. The TFT substrate according to claim 34, wherein at least one of the source wire, the drain wire, the source electrode and the drain electrode is formed from the reflective metal layer.

38. The TFT substrate according to claim 34, wherein the reflective metal layer is formed of a thin film of aluminum, silver or gold, or of an alloy layer containing aluminum, silver or gold.

* * * * *